(12) United States Patent
Sudo et al.

(10) Patent No.: US 11,276,834 B2
(45) Date of Patent: Mar. 15, 2022

(54) LIGHT EMITTING ELEMENT AND DISPLAY DEVICE

(71) Applicant: SONY CORPORATION, Tokyo (JP)

(72) Inventors: Shoji Sudo, Kanagawa (JP); Masahiro Kawamura, Chiba (JP); Masakazu Funahashi, Chiba (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/781,538

(22) PCT Filed: Dec. 12, 2016

(86) PCT No.: PCT/JP2016/086888
§ 371 (c)(1),
(2) Date: Jun. 5, 2018

(87) PCT Pub. No.: WO2017/110549
PCT Pub. Date: Jun. 29, 2017

(65) Prior Publication Data
US 2018/0269417 A1 Sep. 20, 2018

(30) Foreign Application Priority Data
Dec. 25, 2015 (JP) .............................. JP2015-252785

(51) Int. Cl.
*H01L 51/50* (2006.01)
*H01L 51/52* (2006.01)
(Continued)

(52) U.S. Cl.
CPC ...... *H01L 51/5024* (2013.01); *H01L 51/5004* (2013.01); *H01L 51/504* (2013.01);
(Continued)

(58) Field of Classification Search
None
See application file for complete search history.

(56) References Cited

U.S. PATENT DOCUMENTS 6,528,188 B1    3/2003 Suzuki et al.
2006/0231843 A1 10/2006 Qin et al.
(Continued)

FOREIGN PATENT DOCUMENTS

CN    1663060 A     8/2005
CN    101404323 A   4/2009
(Continued)

OTHER PUBLICATIONS

International Search Report and Written Opinion of PCT Application No. PCT/JP2016/086888, dated Feb. 28, 2017, 12 pages of ISRWO.

(Continued)

*Primary Examiner* — Jack S Chen
(74) *Attorney, Agent, or Firm* — Chip Law Group

(57) ABSTRACT

A light emitting element includes a structure in which an anode 51, an organic layer 70 containing an organic material and including a light emitting layer, and a cathode 52 are stacked. The light emitting layer includes, from a side of the anode to a side of the cathode, two or more light emitting regions configured to emit different colors of light. Each light emitting region contains a host material and a dopant material. An absolute value of an ionization potential of the host material contained in a light emitting region near to the cathode is larger than an absolute value of an ionization potential of the host material contained in a light emitting region near to the anode.

3 Claims, 4 Drawing Sheets

(51) Int. Cl.
*H01L 51/56* (2006.01)
*H01L 27/32* (2006.01)
*H01L 51/00* (2006.01)

(52) U.S. Cl.
CPC ...... *H01L 51/5036* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/56* (2013.01); *H01L 27/322* (2013.01); *H01L 27/3206* (2013.01); *H01L 51/006* (2013.01); *H01L 51/0072* (2013.01); *H01L 51/0073* (2013.01); *H01L 51/0074* (2013.01); *H01L 51/5016* (2013.01); *H01L 2251/552* (2013.01)

(56) References Cited

U.S. PATENT DOCUMENTS

| 2009/0053559 | A1* | 2/2009 | Spindler ............ C09K 11/06 428/704 |
| 2009/0091250 | A1 | 4/2009 | Yasukawa et al. |
| 2011/0215301 | A1 | 9/2011 | Forrest |
| 2013/0092913 | A1 | 4/2013 | Nishimura et al. |
| 2019/0237514 | A1* | 8/2019 | Tsukamoto ............ H05B 33/12 |

FOREIGN PATENT DOCUMENTS

| CN | 101803060 A | 8/2010 |
| CN | 101952990 A | 1/2011 |
| DE | 10224021 A1 | 12/2003 |
| EP | 2582206 A1 | 4/2013 |
| JP | 2000-068057 A | 3/2000 |
| JP | 2001-155860 A | 6/2001 |
| JP | 2005-527090 A | 9/2005 |
| JP | 2005-285410 A | 10/2005 |
| JP | 2009-093810 A | 4/2009 |
| JP | 2010-034484 A | 2/2010 |
| JP | 2010-537426 A | 12/2010 |
| JP | 2011-518405 A | 6/2011 |
| JP | 2013-200939 A | 10/2013 |
| JP | 2013-258022 A | 12/2013 |
| JP | 2005-285410 A | 10/2017 |
| KR | 10-2005-0016427 A | 2/2005 |
| KR | 10-2010-0074146 A | 7/2010 |
| KR | 10-2010-0105549 A | 9/2010 |
| WO | 03/100880 A2 | 12/2003 |
| WO | 2009/025724 A1 | 2/2009 |
| WO | 2009/070382 A1 | 6/2009 |
| WO | 2011/155508 A1 | 12/2011 |

OTHER PUBLICATIONS

Office Action for CN Patent Application No. 201680073511.3, dated Sep. 6, 2019, 07 pages of Office Action and 07 pages of English Translation.

Office Action for JP Patent Application No. 2017-557882, dated Apr. 28, 2020, 26 pages of Office Action and 18 pages of English Translation.

* cited by examiner

LIGHT EMITTING ELEMENT AND DISPLAY DEVICE

CROSS REFERENCE TO RELATED APPLICATIONS

This application is a U.S. National Phase of International Patent Application No. PCT/JP2016/086888 filed on Dec. 12, 2016, which claims priority benefit of Japanese Patent Application No. JP 2015-252785 filed in the Japan Patent Office on Dec. 25, 2015. Each of the above-referenced applications is hereby incorporated herein by reference in its entirety.

TECHNICAL FIELD

The present disclosure relates to a light emitting element and a display device.

BACKGROUND ART

These days, an organic electroluminescence display device (hereinafter, occasionally abbreviated as simply an "organic EL display device") using an organic electroluminescence element (hereinafter, occasionally abbreviated as simply an "organic EL element") is drawing attention as a display device that will take the place of a liquid crystal display device. The organic EL display device has the properties of being of a self-luminous type and having low power consumption, and further is considered to have sufficient responsiveness for a high-definition, high-speed video signal; and development for practical use and commercialization of organic EL display devices are extensively advanced.

In the organic EL display device, for example, one pixel includes three sub-pixels (light emitting elements), i.e., a sub-pixel including a light emitting element that includes a red light emitting layer and emits red light, a sub-pixel including a light emitting element that includes a green light emitting layer and emits green light, and a sub-pixel including a light emitting element that includes a blue light emitting layer and emits blue light; thereby, the organic EL display device can achieve high contrast and furthermore high color reproducibility. On the other hand, it is required that the pixel pitch be reduced in order to achieve a higher resolution; but as the pixel pitch becomes finer, it becomes more difficult for one pixel to include such three sub-pixels.

Thus, the development of a method in which a white light emitting layer is formed throughout all the pixels and white light is colored using color filter layers, that is, a technology in which one pixel includes three sub-pixels (light emitting elements), i.e., a red sub-pixel (referred to as a "red light emitting element") based on a combination of a light emitting element including a white light emitting layer (referred to as a "white light emitting element") and a red color filter layer, a green sub-pixel (referred to as a "green light emitting element") based on a combination of a white light emitting element and a green color filter layer, and a blue sub-pixel (referred to as a "blue light emitting element") based on a combination of a white light emitting element and a blue color filter layer is in progress. The white light emitting layer is formed as a continuous layer throughout all the white light emitting elements. There is no need to form a red light emitting layer, a green light emitting layer, or a blue light emitting layer on a sub-pixel basis, and therefore it becomes possible to make the pixel pitch finer. In each white light emitting element, a white light emitting layer is formed between an anode and a cathode, and includes, from the anode side to the cathode side, two or more light emitting regions that emit different colors of light (for example, see JP 2013-258022A).

CITATION LIST

Patent Literature

Patent Literature 1: JP 2013-258022A

DISCLOSURE OF INVENTION

Technical Problem

Meanwhile, it has been revealed that, depending on the amount of current (current density) passed between the anode and the cathode, a large change occurs in the values of the chromaticity coordinates (u', v') of white light emitted by the white light emitting element. It is presumed that such a phenomenon is due to differences in carrier mobility between the two or more light emitting regions that are formed from the anode side to the cathode side and emit different colors of light and differences of recombination regions in the light emitting regions. Then, if such a phenomenon occurs, there arises a problem that, for example when displaying one image, a color change occurs between the image in an area where the current density is high and the image in an area where the current density is low, and a reduction in image quality is caused.

Thus, an object of the present disclosure is to provide a light emitting element having a configuration in which a color change depending on the current density is less likely to occur, and a display device using the light emitting element.

Solution to Problem

A light emitting element according to any of a first aspect to a third aspect of the present disclosure to achieve the above-mentioned object includes: a structure in which an anode, an organic layer containing an organic material and including a light emitting layer, and a cathode are stacked. The light emitting layer includes, from a side of the anode to a side of the cathode, two or more light emitting regions configured to emit different colors of light. Each light emitting region contains a host material and a dopant material (guest material).

In the light emitting element according to the first aspect of the present disclosure, an absolute value of an ionization potential of the host material contained in a light emitting region near to the cathode is larger than an absolute value of an ionization potential of the host material contained in a light emitting region near to the anode.

In addition, in the light emitting element according to the second aspect of the present disclosure, a value of a difference $\Delta u'v'$ between values of chromaticity coordinates of white light emitted by the light emitting layer when a current of 0.1 milliamperes/cm$^2$ is passed between the anode and the cathode and values of chromaticity coordinates of white light emitted by the light emitting layer when a current of 50 milliamperes/cm$^2$ is passed between the anode and the cathode is less than or equal to 0.02.

Furthermore, in the light emitting element according to the third aspect of the present disclosure, the host material contained in a light emitting region adjacent to the cathode suppresses movement of holes from a light emitting region adjacent to the light emitting region adjacent to the cathode.

In a display device of the present disclosure to achieve the above-mentioned object, a plurality of light emitting elements according to any of the first aspect to the third aspect of the present disclosure are arranged in a two-dimensional matrix configuration.

Advantageous Effects of Invention

In a light emitting element according to the first aspect of the present disclosure, a relationship between the values of the ionization potentials of light emitting regions is prescribed; in a light emitting element according to the second aspect of the present disclosure, the amount of change $\Delta u'v'$ of the values of the chromaticity coordinates of white light based on the current density is prescribed; in a light emitting element according to the third aspect of the present disclosure, characteristics of the host material contained in a light emitting region adjacent to the cathode are prescribed, and therefore it is less likely that the values of the chromaticity coordinates of white light emitted by a white light emitting element will undergo a great change depending on the amount of current (current density) passed between the anode and the cathode. Note that the effects described in the present specification are only examples and are not limitative ones, and further there may be additional effects.

MODE(S) FOR CARRYING OUT THE INVENTION

Figure 1:
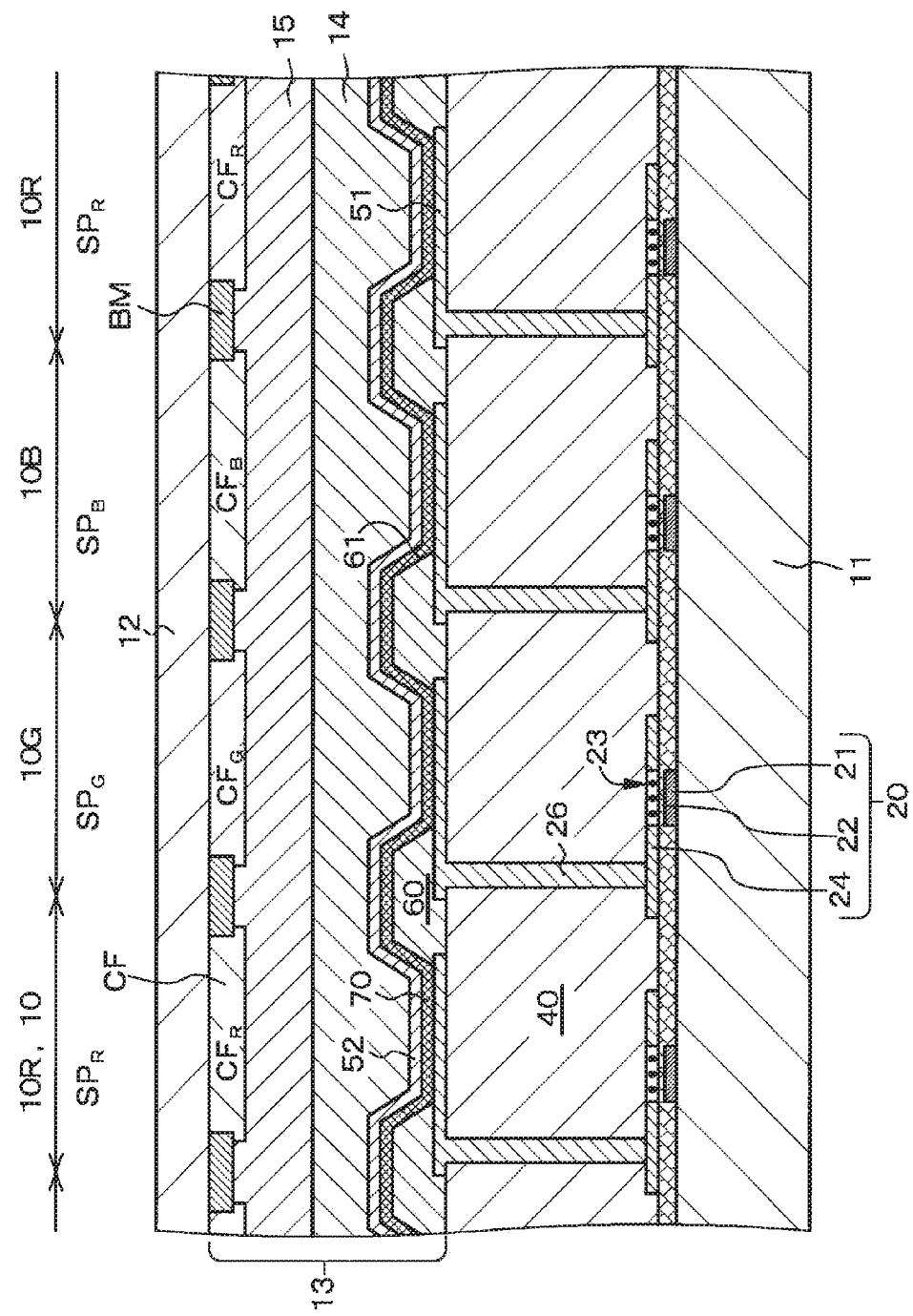
FIG. 1 is a schematic partial cross-sectional view of a light emitting element of Example 1.

Hereinbelow, the present disclosure is described on the basis of Examples with reference to the drawings; but the present disclosure is not limited to Examples, and various numerical values and materials in Examples are only examples. Note that the description is given in the following order.
1. Overall description of light emitting elements according to first aspect to third aspect of present disclosure and display device of present disclosure
2. Example 1 (light emitting elements according to first aspect to third aspect of present disclosure and display device of present disclosure)
3. Example 2 (modification of Example 1)
4. Other items
<Overall Description of Light Emitting Elements According to First Aspect to Third Aspect of Present Disclosure and Display Device of Present Disclosure>

In a light emitting element according to the first aspect of the present disclosure or a light emitting element according to the first aspect of the present disclosure included in a display device of the present disclosure (hereinafter, these light emitting elements are collectively referred to as "a light emitting element etc. according to the first aspect of the present disclosure"), a form in which the absolute value of the ionization potential of the host material contained in a light emitting region adjacent to the cathode is more than or equal to 6.1 eV is possible; thereby, the likelihood that the values of the chromaticity coordinates of white light emitted by a white light emitting element will undergo a great change depending on the amount of current (current density) passed between the anode and the cathode is reduced even more reliably. Then, in this case, when the absolute value of the ionization potential of the host material contained in a light emitting region adjacent to the cathode is denoted by $|Ip_1|$ and the absolute value of the ionization potential of the host material contained in a light emitting region adjacent to the light emitting region adjacent to the cathode is denoted by $|Ip_2|$, it is preferable that $|Ip_1|-|Ip_2|>0.1$ be satisfied. Furthermore, in these cases, it is preferable that the value of the band gap of the host material contained in the light emitting region adjacent to the cathode be more than or equal to 3.1 eV.

In the light emitting element etc. according to the first aspect of the present disclosure including the preferred forms described above, light emitting elements according to the second aspect to the third aspect of the present disclosure, or light emitting elements according to the second aspect to the third aspect of the present disclosure included in a display device of the present disclosure (hereinafter, these light emitting elements are collectively referred to as "a light emitting element etc. of the present disclosure"), a form in which the host material in a light emitting region adjacent to the cathode contains an azine-based compound is possible. The azine-based compound will be described later.

Furthermore, in the light emitting element etc. of the present disclosure including the preferred forms described above, a form in which the light emitting layer emits white light is possible.

The light emitting region is a region where holes injected from the anode side and electrons injected from the cathode side recombine during application of voltage to the anode and the cathode. The arrangement order in the light emitting layer of light emitting regions that emit different colors of light may be determined on the basis of the carrier transport properties, the adjustment of the optical path length in accordance with the light emitting wavelength of light extraction, etc. of each light emitting region, as appropriate. Then, in the light emitting element etc. of the present disclosure including the preferred forms described above, a form in which the light emitting layer includes a first light emitting region, a second light emitting region, and a third light emitting region from the anode side to the cathode side is possible. In this case, for example, a form in which the first light emitting region emits red light (wavelength: 620 nm to 750 nm), the second light emitting region emits green light (wavelength: 495 nm to 570 nm), and the third light emitting region emits blue light (wavelength: 450 nm to 495 nm), and white light is emitted as a whole is possible. Alternatively, a form in which the first light emitting region emits red light, the second light emitting region emits blue light, and the third light emitting region emits green light, and white light is emitted as a whole is possible. Alternatively, a form in which the light emitting layer includes a first light emitting region and a second light emitting region from the anode side to the cathode side is possible. Then, in this case, a form in which the first light emitting region emits blue light and the second light emitting region emits yellow light, and white light is emitted as a whole is possible. Alternatively, a form in which the first light emitting region emits yellow light and the second light emitting region emits blue light, and white light is emitted as a whole is possible. Alternatively, a form in which the first light emitting region emits blue light and the second light emitting region emits orange light, and white light is emitted as a whole is possible. Alternatively, a form in which the first light emitting region emits orange light and the second light emitting region emits blue light, and white light is emitted as a whole is possible. Further, the combinations of luminous colors described above are only examples, and the combination may be determined in accordance with the color gamut set as the light emitting element or the display device, as appropriate. Note that actually there is a case where light emitting regions that emit different colors of light are mixed and clear separation into each light emitting region is not made. In a case where the light emitting layer includes a first light emitting region, a second light emitting region, and a third light emitting region from the anode side to the cathode side, an intermediate region (buffer region) may be provided between the first light emitting region and the second light emitting region, depending on circumstances. The intermediate region (buffer region) will be described later.

Then, such a light emitting element that emits white light (a white light emitting element) is provided with a red color filter layer, and thereby a red light emitting element is obtained; a white light emitting element is provided with a green color filter layer, and thereby a green light emitting element is obtained; and a white light emitting element is provided with a blue color filter layer, and thereby a blue light emitting element is obtained. One pixel includes a red light emitting element, a green light emitting element, and a blue light emitting element. Depending on circumstances, one pixel may include a red light emitting element, a green light emitting element, a blue light emitting element, and a light emitting element that emits white color (or a light emitting element that emits a complementary color of light).

In the display device of the present disclosure, in a form in which one pixel (or one sub-pixel) includes one light emitting element (one display element), the arrangement of pixels (or sub-pixels) may be, but is not limited to, a stripe arrangement, a diagonal arrangement, a delta arrangement, or a rectangle arrangement. Further, in a form in which one pixel (or one sub-pixel) includes a plurality of light emitting elements (display elements) assembled, the arrangement of pixels (or sub-pixels) may be, but is not limited to, a stripe arrangement.

The color filter layer contains a resin in which a coloring agent containing a desired pigment or dye is added, and is adjusted by selecting the pigment or dye so that the light transmittance in a wavelength range of interest such as red color, green color, or blue color is high and the light transmittance in other wavelength ranges is low. A transparent filter may be placed in a light emitting element that emits white light. A black matrix layer (light blocking layer) may be formed between color filter layers. The black matrix layer includes, for example, a black resin film with an optical density of more than or equal to 1 in which a black coloring agent is mixed (specifically, for example, containing a black polyimide resin), or a thin film filter utilizing the interference of thin films. The thin film filter includes, for example, two or more stacked thin films each containing a metal, a metal nitride, or a metal oxide, and attenuates light by utilizing the interference of the thin films. As the thin film filter, specifically, one in which Cr and chromium(III) oxide ($Cr_2O_3$) are alternately stacked may be given.

Furthermore, in the light emitting element etc. of the present disclosure including the preferred forms described above, a form in which the light emitting element includes an organic electroluminescence element (organic EL element) is possible. Further, the display device of the present disclosure including the various preferred forms described above may have a configuration including an organic electroluminescence display device (organic EL display device).

In another expression, the display device of the present disclosure includes a first substrate, a second substrate, and an image display section sandwiched by the first substrate and the second substrate, and a plurality of light emitting elements each of which is the light emitting element according to any of the first aspect to the third aspect of the present disclosure including the preferred forms described above are arranged in a two-dimensional matrix configuration in the image display section. Here, the light emitting element is formed on the first substrate side. A first electrode is formed on the first substrate side, and a second electrode is formed on the second substrate side. There is a case where the anode corresponds to the first electrode and the cathode corresponds to the second electrode, and conversely there is a case where the anode corresponds to the second electrode and the cathode corresponds to the first electrode.

In the light emitting element etc. of the present disclosure including the preferred forms described above, examples of the thickness of the entire organic layer include $1.2 \times 10^{-7}$ μm to $2 \times 10^{-7}$ m. Further, examples of the thickness of the light emitting region include a thickness of the order of $10^{-8}$ m, for example a thickness of $1 \times 10^{-8}$ m. More specifically, examples of the film thickness of the red light emitting region include 5 nm to 15 nm, examples of the film thickness of the green light emitting region include 5 nm to 15 nm, and examples of the film thickness of the blue light emitting region include 5 nm to 15 nm; but the film thicknesses are not limited to these.

Furthermore, in the display device of the present disclosure including the light emitting element according to any of the first aspect to the third aspect of the present disclosure including the preferred forms described above, a form in which the organic layer and the second electrode are shared between a plurality of light emitting elements is possible.

One or more hole supply layers (also called hole injection layers or hole transport layers) or the like may be formed in a region (a hole transport region) between the anode and a light emitting region adjacent to the anode. Further, one or more electron transport layers (also called electron injection layers or electron supply layers) or the like may be formed in a region (an electron transport region) between the cathode and a light emitting region adjacent to the cathode. The organic layer may contain an inorganic compound partially. The hole transport region and the electron transport layer will be described later. Note that "the light emitting region adjacent to the anode" refers to a light emitting region located nearest to the anode, and does not mean that the light emitting region is in direct contact with the anode. Similarly, "the light emitting region adjacent to the cathode" refers to a light emitting region located nearest to the cathode, and does not mean that the light emitting region is in direct contact with the cathode. Furthermore, when a light emitting region adjacent to the cathode is referred to as "light emitting region-A" and a light emitting region adjacent to the light emitting region adjacent to the cathode is referred to as "light emitting region-B," light emitting region-A and light emitting region-B are provided in this order from the cathode side toward the anode side.

The organic layer containing an organic material includes a light emitting layer, and may specifically include, for example, a stacked structure of a hole transport layer, a light emitting layer, and an electron transport layer, a stacked structure of a hole injection layer, a hole transport layer, a light emitting layer, an electron transport layer, and an electron injection layer, or the like. Examples of the method for forming an organic layer including a light emitting layer include physical vapor deposition methods (PVD methods) such as the vacuum vapor deposition method; printing methods such as the screen printing method and the inkjet printing method; a laser transfer method in which a stacked structure of a laser absorbing layer and an organic layer formed on a substrate for transfer is irradiated with laser light to separate the organic layer on the laser absorbing layer and the organic layer is transferred; and various application methods. In a case where the organic layer is formed on the basis of the vacuum vapor deposition method, the organic layer can be obtained by, for example, using what is called a metal mask and depositing a material that has passed through an opening provided in the metal mask; but it is preferable that the organic layer be formed on the entire surface without patterning. Depending on circumstances, at least a portion of a part (specifically, for example, the hole transport layer) of the organic layer may be in a discontinuous state; in this case, examples of the method for forming charge injection and transport layers include PVD methods such as the vacuum vapor deposition method.

The thicknesses of the hole transport layer (the hole supply layer) and the thickness of the electron transport layer (the electron supply layer) are preferably approximately equal. Alternatively, the electron transport layer (the electron supply layer) may be thicker than the hole transport layer (the hole supply layer); thereby, electrons that are necessary to achieve high efficiency and furthermore are sufficient to the light emitting layer can be supplied with a low driving voltage. That is, the supply of holes can be increased by placing the hole transport layer between the anode and the light emitting layer and forming the hole transport layer with a film thickness smaller than the film thickness of the electron transport layer. Then, thereby, a carrier balance in which the amounts of holes and electrons are neither excessive nor insufficient and furthermore the amounts of carriers supplied are sufficiently large can be obtained; thus, high light emission efficiency can be obtained. Further, since the amounts of holes and electrons are neither excessive nor insufficient, the carrier balance is less likely to be lost and driving degradation is suppressed, and the light emission lifetime can be prolonged.

Furthermore, the light emitting element etc. of the present disclosure including the preferred forms described above may employ, but are not limited to, a form in which a base includes a silicon semiconductor substrate on which a transistor (specifically, for example, a MOSFET) is formed and an interlayer insulating layer formed on the silicon semiconductor substrate, or a base includes a substrate on which a transistor (specifically, for example, a thin film transistor, a TFT) is formed and an interlayer insulating layer formed on the substrate, a first electrode and a first insulating layer are formed on the interlayer insulating layer, and the first electrode and the transistor formed on the silicon semiconductor substrate (or the substrate) are connected together via a contact hole formed in the interlayer insulating layer.

In the light emitting element etc. of the present disclosure, light from the light emitting layer is emitted from the first electrode side to the outside, alternatively emitted from the second electrode side to the outside, or alternatively emitted from the first electrode side and the second electrode side to the outsides. The substrate and the electrode located on the side from which light is emitted are required to be transparent to light emitted by the light emitting element. That is, the display device of the present disclosure may be a display device (an upper-surface light emitting display device) of a top emission system (an upper-surface light emission system) in which light is emitted from the second substrate, or may be a display device (a lower-surface light emitting display device) of a bottom emission system (a lower-surface light emission system) in which light is emitted from the first substrate. In the upper-surface light emitting display device, the color filter layer and the black matrix layer may be formed on the side of the surface facing the first substrate of the second substrate. On the other hand, in the lower-surface light emitting display device, the color filter layer and the black matrix layer may be formed on the side of the surface facing the second substrate of the first substrate. In a case where, as described above, a base includes a silicon semiconductor substrate (or a substrate) on which a transistor is formed and an interlayer insulating layer formed on the silicon semiconductor substrate, the silicon semiconductor substrate (or the substrate) corresponds to the first substrate. In the following, a description is given solely on the basis of an example in which the display device includes an upper-surface light emitting display device; but in a case where the display device includes a lower-surface light emitting display device, the wording of the following description may be changed appropriately.

The first substrate or the second substrate may include a high strain point glass substrate, a soda-lime glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, any of various glass substrates on a surface of which an insulating film is formed, a quartz substrate, a quartz substrate on a surface of which an insulating film is formed, a silicon semiconductor substrate, a silicon semiconductor substrate on a surface of which an insulating film is formed, an organic polymer (having a form of a macromolecular material, such as a plastic film, a plastic sheet, or a plastic substrate with flexibility containing a macromolecular material), examples of which include polymethyl methacrylate (PMMA), polyvinyl alcohol (PVA), polyvinylphenol (PVP), a polyether sulfone (PES), a polyimide, a polycarbonate (PC), polyethylene terephthalate (PET), polyethylene naphthalate (PEN), and polybutylene naphthalate (PBN), or a metal foil. The materials contained in the first substrate and the second substrate may be the same or may be different. However, in the upper-surface light emitting display device, the second substrate is required to be transparent to light from the light emitting element; and in the lower-surface light emitting display device, the first substrate is required to be transparent to light from the light emitting element. In a case where the substrate contains an organic polymer, it is preferable to form a stacked structure or perform surface treatment in order to suppress water permeability and gas permeability.

In a case where the first electrode is made to function as the anode (anode electrode), an electrode material having a large work function from the vacuum level is preferably used as a material contained in the first electrode in order to inject holes with good efficiency. Specific examples include metals and alloys with high work functions, such as platinum (Pt), gold (Au), silver (Ag), a silver (Ag) alloy, chromium (Cr), tungsten (W), nickel (Ni), copper (Cu), iron (Fe), cobalt (Co), tantalum (Ta), molybdenum (Mo), and titanium (Ti) (for example, a Ag—Pd—Cu alloy containing silver as a main component and containing 0.3 mass % to 1 mass % of palladium (Pd) and 0.3 mass % to 1 mass % of copper (Cu), an Al—Nd alloy, and an Al—Ni alloy). Examples of the thickness of the first electrode include 0.1 μm to 1 μm. Alternatively, a transparent electrically conductive material excellent in hole injection characteristics, such as an oxide of indium and tin (ITO), an oxide of indium and zinc (IZO), an oxide of tin and antimony, and an oxide of zinc and aluminum, may be given, and a structure in which a transparent electrically conductive material excellent in hole injection characteristics, such as an oxide of indium and tin (ITO) or an oxide of indium and zinc (IZO), is stacked on a reflective film with high light reflectivity such as a dielectric multiple-layer film or aluminum (Al) may be given.

Alternatively, a stacked structure of a first layer excellent in light reflectivity and a second layer having light transmissivity and a large work function is possible. The second layer is located on the organic layer side. The first layer preferably uses an aluminum alloy containing mainly aluminum (Al) as a main component. As a secondary component, an element having a smaller work function than aluminum, which is a main component, is preferably used. As such a secondary component, an element of the lanthanoid series may be given. Although the work functions of the elements of the lanthanoid series are not large, the containing of these elements improves the stability of the first electrode, and furthermore improves also the hole injection properties of the first electrode. Further, as a secondary component, elements such as silicon (Si), copper (Cu), nickel (Ni), and titanium (Ti) may be used as well as elements of the lanthanoid series.

The content amount of secondary components in an aluminum alloy contained in the first layer of the first electrode is, for example, preferably approximately less than or equal to 10 mass % in total in a case where the secondary component is neodymium (Nd), nickel (Ni), titanium (Ti), and/or the like, which stabilizes aluminum. Thereby, the first layer can be kept stable in the manufacturing process of the light emitting element while the reflectance of the first layer containing an aluminum alloy is maintained. Further, high processing accuracy and chemical stability are obtained. Furthermore, also the electrical conductivity of the first electrode is improved. Note that a metal such as neodymium (Nd) has a small work function; hence, if a commonly used amine-based material is used for the hole supply layer, the hole injection barrier is increased. In such a case, the hole injection barrier is reduced and the increase in driving voltage can be suppressed by mixing an acceptor material such as 7,7,8,8-tetracyano-2,3,5,6-tetrafluoroquinodimethane (F4-TCNQ) with an amine-based material, or forming a p-doped layer of polyethylenedioxythiophene-polystyrene sulfonate (PEDOT-PSS) or the like at the interface of the first electrode. As well as the above, by using an azatriphenylene derivative, the light emitting element can be stabilized while the increase in driving voltage is suppressed.

The second layer of the first electrode may contain, as well as the above, an oxide of an Al alloy, an oxide of molybdenum (Mo), an oxide of zirconium (Zr), an oxide of chromium (Cr), and an oxide of tantalum (Ta). For example, in a case where the second layer includes an oxide layer (including a natural oxide film) of an aluminum alloy containing an element of the lanthanoid series as a secondary component, the light transmittance of the second layer containing an oxide of the lanthanoid series element is good because this oxide has a high light transmittance. Then, thereby, the reflectance at the surface of the first layer is kept high. Further, the electron injection characteristics of the first electrode can be improved by the second layer including a transparent electrically conductive layer of ITO, IZO, or the like. Alternatively, since ITO and IZO have large work functions, the efficiency of carrier injection can be enhanced by using these materials for the first layer.

On the other hand, in a case where the first electrode is made to function as the cathode (cathode electrode), the first electrode preferably contains an electrically conductive material with a small work function value and furthermore a high light reflectance; but also an electrically conductive material with a high light reflectance used as the second electrode can be used as the cathode by being provided with an appropriate electron injection layer or the like to improve the electron injection properties.

In a case where the second electrode is made to function as the cathode (cathode electrode), the material contained in the second electrode (a light semitransmissive material or a light transmissive material) preferably contains an electrically conductive material with a small work function value so that luminescent light can be transmitted and yet electrons can be efficiently injected into the organic layer; examples include metals and alloys with small work functions, such as aluminum (Al), silver (Ag), magnesium (Mg), calcium (Ca), sodium (Na), strontium (Sr), an alloy of an alkali metal or an alkaline earth metal and silver (Ag) (for example, an alloy of magnesium (Mg) and silver (Ag) (a Mg—Ag alloy)), an alloy of magnesium and calcium (a Mg—Ca alloy), and an alloy of aluminum (Al) and lithium (Li) (an Al—Li alloy); among these, a Mg—Ag alloy is preferable, and examples of the volume ratio between magnesium and silver include Mg:Ag=5:1 to 30:1. Alternatively, examples of the volume ratio between magnesium and calcium include Mg:Ca=2:1 to 10:1. Examples of the thickness of the second electrode include 4 nm to 50 nm, preferably 4 nm to 20 nm, and more preferably 6 nm to 12 n. Alternatively, the second electrode may have a stacked structure of a layer of any of the materials described above and, for example, what is called a transparent electrode containing ITO or IZO (the thickness being, for example, $3\times10^{-8}$ m to $1\times10^{-6}$ m) in this order from the organic layer side. Alternatively, the second electrode may include a mixture layer containing an organic light emitting material such as an aluminum quinoline complex, a styrylamine derivative, or a phthalocyanine derivative. In this case, a layer having light transmissivity like that of Mg—Ag may be further provided. In a case where light is emitted via the second electrode, the average light transmittance of the second electrode is 50% to 90%, preferably 60% to 90%.

The second electrode may have a two-layer structure; in this case, in a case where a second layer is located on the organic layer side, a first layer preferably contains a material having a small work function and furthermore good light transmissivity. Specific examples of the material contained in the first layer include an alkali metal oxide, an alkali metal fluoride, an alkaline earth metal oxide, and an alkaline earth metal fluoride, such as $Li_2O$, $Cs_2Co_3$, $Cs_2SO_4$, MgF, LiF, and $CaF_2$. Further, as the material contained in the second layer, materials having light transmissivity and furthermore having good electrical conductivity such as Mg—Ag (the volume ratio being, for example, Mg:Ag=5:1 to 30:1), Mg—Ca (the volume ratio being, for example, Mg:Ca=2:1 to 10:1), and Ca may be given.

On the other hand, in a case where the second electrode is made to function as the anode (anode electrode), the second electrode preferably contains an electrically conductive material that transmits luminescent light and yet has a large work function value.

The second electrode may be provided with a bus electrode (auxiliary electrode) containing a low resistance material, such as aluminum, an aluminum alloy, silver, a silver alloy, copper, a copper alloy, gold, or a gold alloy, to reduce the resistance of the second electrode as a whole.

Examples of the method for forming the anode and the cathode (the first electrode and the second electrode) include vapor deposition methods including the electron beam vapor deposition method, the hot filament vapor deposition method, and the vacuum vapor deposition method, the sputtering method, the chemical vapor deposition method (CVD method), the MOCVD method, and a combination of the ion plating method and the etching method; various printing methods such as the screen printing method, the inkjet printing method, and the metal mask printing method; plating methods (the electroplating method and the electroless plating method); the lift-off method; the laser ablation method; the sol-gel method, etc. By using various printing methods and plating methods, an anode and a cathode (a first electrode and a second electrode) having a desired shape (pattern) can be formed directly. Note that, in a case where the second electrode is formed after the organic layer is formed, formation based on a film formation method in which film-forming particles have small energy, particularly such as the vacuum vapor deposition method, or a film formation method such as the MOCVD method is preferable from the viewpoint of preventing the occurrence of damage to the organic layer. If damage occurs to the organic layer, there is a concern that non-light emitting pixels (or non-light emitting sub-pixels) called "dark spots" due to the generation of leakage current will occur. Further, the process from the formation of the organic layer to the formation of these electrodes is preferably executed without exposure to the air from the viewpoint of preventing the degradation of the organic layer due to moisture in the air. As described above, the second electrode may not be patterned, and may be what is called a common electrode.

The first electrode is provided on an interlayer insulating layer as described above. Then, the interlayer insulating layer covers a light emitting element driving section formed in the first substrate (or on the first substrate). The light emitting element driving section includes one or a plurality of transistors (for example, MOSFETs or TFTs), and the transistor and the first electrode are electrically connected together via a contact hole (contact plug) provided in the interlayer insulating layer. The light emitting element driving section may have a commonly known circuit configuration. As the material contained in the interlayer insulating layer, $SiO_2$-based materials such as $SiO_2$, BPSG, PSG, BSG, AsSG, PbSG, SOG (spin-on glass), low melting point glass, and a glass paste; SiN-based materials including a SiON-based material; insulating resins such as an acrylic resin and a polyimide resin; etc. may be used singly or in combination, as appropriate. Known processes such as the CVD method, the application method, the sputtering method, and various printing methods may be used for the formation of the interlayer insulating layer.

It is preferable that, for the purpose of preventing the arrival of moisture at the organic layer, an insulating or electrically conductive protection film be provided above the second electrode. The protection film is preferably formed on the basis of a film formation method in which film-forming particles have small energy, particularly such as the vacuum vapor deposition method, or a film formation method such as the CVD method or the MOCVD method, because the influence on the underlayer can be reduced. Alternatively, it is preferable that, in order to prevent a reduction in luminance due to the degradation of the organic layer, the film formation temperature be set to normal temperature; furthermore, it is preferable that, in order to prevent the peeling of the protection film, the protection film be formed under conditions where the stress of the protection film is minimized. Further, the protection film is preferably formed without exposing an already formed electrode to the air; thereby, the degradation of the organic layer due to moisture and oxygen in the air can be prevented. Furthermore, the protection film preferably contains a material that transmits, for example, more than or equal to 80% of the light generated by the light emitting layer; specific examples include inorganic amorphous insulating materials such as the materials shown below. Such an inorganic amorphous insulating material does not produce grains, and therefore has low water permeability and forms a good protection film. Specifically, a material that is transparent to light emitted by the light emitting layer, is dense, and does not allow moisture to permeate therethrough is preferably used as a material contained in the protection film; more specifically, examples include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxynitride ($\alpha$-SiON), and $Al_2O_3$. In a case where the protection film contains an electrically conductive material, the protection film may contain a transparent electrically conductive material such as ITO or IZO.

The protection film and the second substrate are joined together via, for example, a resin layer (sealing resin layer). As the material contained in the resin layer (sealing resin layer), thermosetting adhesives and ultraviolet curable adhesives such as an acrylic-based adhesive, an epoxy-based adhesive, a urethane-based adhesive, a silicon-based adhesive, and a cyanoacrylate-based adhesive may be given.

On the outermost surface of the display device (the outer surface of the second substrate), an ultraviolet absorbing layer, an anti-contamination layer, a hard coat layer, and an antistatic layer may be formed, or a protection member may be provided.

The display device may further include a resonator structure in order to improve light extraction efficiency even more. Specifically, light emitted by the light emitting layer is caused to resonate between a first interface including the interface between the first electrode and the organic layer (or the interface between a light reflecting layer provided below the first electrode via an interlayer insulating layer and the interlayer insulating layer) and a second interface including the interface between the second electrode and the organic layer, and a part of the light is caused to be emitted from the second electrode. Then, when the distance from the position of the maximum light emission of the light emitting layer to the first interface is denoted by $L_1$, the optical distance thereof is denoted by $OL_1$, the distance from the position of the maximum light emission of the light emitting layer to the second interface is denoted by $L_2$, the optical distance thereof is denoted by $OL_2$, and $m_1$ and $m_2$ each represent an integer, Formula (A-1), Formula (A-2), Formula (A-3), and Formula (A-4) below are satisfied.

$$0.7\{-\Phi_1/(2\pi)+m_1\} \leq 2\times OL_1/\lambda \leq 1.2\{--\Phi_1/(2\pi)+m_1\} \quad (A\text{-}1)$$

$$0.7\{-\Phi_2/(2\pi)+m_2\} \leq 2\times OL_2/\lambda \leq 1.2\{-\Phi_2/(2\pi)+m_2\} \quad (A\text{-}2)$$

$L_1 < L_2$ (A-3)

$m_1 < m_2$ (A-4)

where

λ: the maximum peak wavelength of a spectrum of light generated by the light emitting layer (or a desired wavelength in the light generated by the light emitting layer)

$\Phi_1$: the amount of phase shift of light reflected at the first interface (unit: radian), provided that $-2\pi < \Phi_1 \leq 0$ $\Phi_2$: the amount of phase shift of light reflected at the second interface (unit: radian), provided that $-2\pi < \Phi_2 \leq 0$.

Here, a form in which $m_1=0$ and $m_2=1$, at which the light extraction efficiency can be maximized, is possible.

Note that the distance $L_1$ from the position of the maximum light emission of the light emitting layer to the first interface refers to the actual distance (physical distance) from the position of the maximum light emission of the light emitting layer to the first interface, and the distance $L_2$ from the position of the maximum light emission of the light emitting layer to the second interface refers to the actual distance (physical distance) from the position of the maximum light emission of the light emitting layer to the second interface. Further, the optical distance is also called an optical path length, and usually refers to n×L when a beam of light has passed through a medium with a refractive index of n by a distance of L. This similarly applies to the following. Therefore, when the average refractive index of the organic layer (or the organic layer and the interlayer insulating layer) is denoted by $n_{ave}$, there are relations of $OL_1 = L_1 \times n_{ave}$, and $OL_2 = L_2 \times n_{ave}$. Here, the average refractive index $n_{ave}$ is a value obtained by summing up the products of the refractive index and the thickness of the layers included in the organic layer (or the organic layer and the interlayer insulating layer) and dividing the resulting value by the thickness of the organic layer (or the organic layer and the interlayer insulating layer).

The first electrode, the second electrode, and the light reflecting layer absorb a part of the incident light and reflect the rest. Therefore, a phase shift occurs in the reflected light. The amounts of phase shift $\Phi_1$ and $\Phi_2$ can be found by measuring the values of the real part and the imaginary part of the complex refractive index of the materials contained in the first electrode, the second electrode, and the light reflecting layer using, for example, an ellipsometer and making a calculation based on these values (for example, see Max Born and Emil Wolf, "Principles of Optic," 1974 (PERGAMON PRESS)). Note that also the refractive indices of the organic layer, various interlayer insulating layers, etc. can be found by performing measurement using an ellipsometer.

Thus, in an organic EL display device having a resonator structure, actually, a red light emitting element including a white light emitting element provided with a red color filter layer causes red light emitted by the light emitting layer to resonate, and emits reddish light (light having a peak of a light spectrum in the region of red color) from the second electrode. Further, a green light emitting element including a white light emitting element provided with a green color filter layer causes green light emitted by the light emitting layer to resonate, and emits greenish light (light having a peak of a light spectrum in the region of green color) from the second electrode. Furthermore, a blue light emitting element including a white light emitting element provided with a blue color filter layer causes blue light emitted by the light emitting layer to resonate, and emits bluish light (light having a peak of a light spectrum in the region of blue color) from the second electrode. That is, each light emitting element may be designed by determining a desired wavelength λ in the light generated by the light emitting layer (specifically, the wavelength of red color, the wavelength of green color, and the wavelength of blue color) and finding various parameters such as $OL_1$ and $OL_2$ in each of the red light emitting element, the green light emitting element, and the blue light emitting element on the basis of Formula (A-1), Formula (A-2), Formula (A-3), and Formula (A-4).

As the material contained in the light reflecting layer, aluminum, an aluminum alloy (for example, Al—Nd), a Ti/Al stacked structure, chromium (Cr), silver (Ag), and silver alloys (for example, Ag—Pd—Cu and Ag—Sm—Cu) may be given; the light reflecting layer can be formed by, for example, vapor deposition methods including the electron beam vapor deposition method, the hot filament vapor deposition method, and the vacuum vapor deposition method, the sputtering method, the CVD method, and the ion plating method; plating methods (the electroplating method and the electroless plating method); the lift-off method; the laser ablation method; the sol-gel method; etc.

The intermediate region (intermediate layer) contains, for example, a compound represented by Formula (1) below.

[Chem. 1]

In Formula (1), $Ar_1$ to $Ar_3$ each represent a substituted or unsubstituted aromatic hydrocarbon group having 6 to 50 ring-forming carbon atoms or a substituted or unsubstituted heterocyclic group having 5 to 30 ring-forming atoms. However, there is a case where any one set of $Ar_1$ and $Ar_2$, $Ar_1$ and $Ar_3$, and $Ar_2$ and $Ar_3$ are bonded together to form a substituted or unsubstituted nitrogen-containing heterocycle containing the nitrogen atom in Formula (1). Examples of the nitrogen-containing heterocycle include a carbazole ring and the like. Note that the "ring-forming carbon atoms" refers to the carbon atoms contained in a saturated ring, an unsaturated ring, or an aromatic ring, and the "ring-forming atoms" refers to the carbon atom(s) and the heteroatom(s) contained in a heterocycle (including a saturated ring, an unsaturated ring, and an aromatic ring).

At least one of $Ar_1$, $Ar_2$, and $Ar_3$ of Formula (1) is a heterocyclic group represented by Formula (2) below. That is, the compound of Formula (1) contains one or more dibenzofuran rings or dibenzothiophene rings.

[Chem. 2]

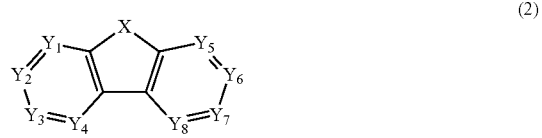

In Formula (2), X represents an oxygen atom or a sulfur atom. $Y_1$ to $Y_8$ each represent a carbon atom, and one of $Y_1$ to $Y_8$ is a carbon atom bonded to $L_1$. $L_1$ represents a linking group bonded to the nitrogen atom in Formula (1), and is a single bond or a substituted or unsubstituted aromatic hydrocarbon group having 6 to 50 ring-forming carbon atoms. The seven of $Y_1$ to $Y_8$ other than the carbon atom bonded to $L_1$ are each a carbon atom bonded to R below, or each form a substituted or unsubstituted ring containing an adjacent carbon atom. R represents a hydrogen atom, a substituted or unsubstituted alkyl group having 1 to 10 carbon atoms, a substituted or unsubstituted cycloalkyl group having 3 to 10 ring-forming carbon atoms, a substituted or unsubstituted trialkylsilyl group having 3 to 10 carbon atoms, a substituted or unsubstituted triarylsilyl group having 18 to 30 ring-forming carbon atoms, a substituted or unsubstituted alkylarylsilyl group having 8 to 15 carbon atoms (provided that the number of ring-forming carbon atoms of the aryl portion is 6 to 14), a substituted or unsubstituted aryl group having 6 to 16 ring-forming carbon atoms, a substituted amino group, a group containing a substituted amino group, a halogen atom, or a cyano group. As the ring containing an adjacent carbon atom, a benzene ring and the like may be given.

For the intermediate region (intermediate layer), it is desired that electrons be blocked at the interface between a light emitting region located on the cathode side with respect to the intermediate region (for the sake of convenience, referred to as a "cathode-side light emitting region") and the intermediate region to improve the light emission efficiency in the cathode-side light emitting region, and that the movement of electrons to a light emitting region located on the anode side with respect to the intermediate region (for the sake of convenience, referred to as an "anode-side light emitting region") be performed sufficiently to improve the light emission efficiency in the anode-side light emitting region; and yet that the degradation of the cathode-side light emitting region at the interface between the cathode-side light emitting region and the intermediate region be prevented. As characteristics required of the material contained in such an intermediate region, characteristics such as having hole transport properties, furthermore having a sufficient energy gap, having a sufficient LUMO level to block electrons to the cathode-side light emitting region, furthermore having a sufficient energy gap to confine the luminous energy of the light emitting region, and in addition having hole transport properties and yet having an appropriate electron transport capacity may be given.

The compound of Formula (1) is an amine compound having a dibenzofuran structure or a dibenzothiophene structure. Since the compound contains dibenzofuran or dibenzothiophene, the compound has a large energy gap, and is suitable for the confinement of exciton energy. That is, if an amine compound containing dibenzofuran or dibenzothiophene like Formula (1) is used as the intermediate region, exciton energy is confined; thereby, high light emission efficiency is obtained, the transport of holes and the transport of electrons can be performed with good balance, and light emission of two or more light emitting regions can be obtained with good balance. Further, the electron density is high; therefore, there is an effect of promoting the transport of electrons. On the other hand, since the compound of Formula (1) is an amine compound, the compound has hole transport properties. That is, the intermediate region containing a compound represented by Formula (1) has both functions of blocking and moving electrons with good balance; therefore, the movement of electrons to the anode-side light emitting region is performed sufficiently while electrons are blocked at the interface between the cathode-side light emitting region and the intermediate region. Hence, electrons do not accumulate at the interface between the intermediate region and the cathode-side light emitting region, and the light emitting region is less likely to be degraded; thus, a long-life light emitting element can be obtained. Further, also the distribution of electrons to the anode-side light emitting region is performed sufficiently, and hence the film thickness of the intermediate region can be set large; furthermore, the change in light emission balance between the colors with respect to the film thickness variation of the intermediate region is small, and hence the film thickness margin of the intermediate region can be set large; thus, a light emitting element with high mass productivity can be obtained. Further, a light emitting element in which all the light emitting regions emit light with good balance can be obtained by combinations with optimum carrier transport properties of the light emitting regions.

Hereinbelow, examples of each group of the compound of Formula (1) described above are described.

The aromatic hydrocarbon group having 6 to 50 ring-forming carbon atoms has preferably 6 to 20 ring-forming carbon atoms, more preferably 6 to 16 ring-forming carbon atoms, and particularly preferably 6 to 12 ring-forming carbon atoms. As the monovalent aromatic hydrocarbon group (aryl group), a phenyl group, a naphthyl group, a phenanthryl group, a pyrenyl group, a chrysenyl group, a benzanthryl group, a benzo[c]phenanthryl group, a benzo[g]chrysenyl group, a triphenylenyl group, a fluorenyl group, a benzofluorenyl group, a dibenzofluorenyl group, a biphenyl group, a terphenyl group, a fluoranthenyl group, and the like may be given; and a phenyl group, a biphenyl group, and a naphthyl group are preferable. As the aromatic hydrocarbon group having a substituent, a tolyl group, a xylyl group, a 9,9-dimethylfluorenyl group, and the like may be given.

As the aromatic hydrocarbon group represented by $L_1$, a divalent group in which one hydrogen atom of the monovalent aromatic hydrocarbon group mentioned above is changed to a single bond may be given. The aromatic hydrocarbon group represented by R is an aromatic hydrocarbon group having 6 to 16 ring-forming carbon atoms among the aromatic hydrocarbon groups mentioned above.

The heterocyclic group having 5 to 30 ring-forming atoms has preferably 5 to 20 ring-forming atoms and more preferably 5 to 14 ring-forming atoms. Specific examples of the monovalent aromatic heterocyclic group (heteroaryl group) include a pyrrolyl group, a pyrazolyl group, a pyrazinyl group, a pyrimidinyl group, a pyridazinyl group, a pyridyl group, a triazinyl group, an indolyl group, an isoindolyl group, an imidazolyl group, a benzimidazolyl group, an indazolyl group, an imidazo[1,2-a]pyridinyl group, a furyl group, a benzofuranyl group, an isobenzofuranyl group, a dibenzofuranyl group, an azadibenzofuranyl group, a thiophenyl group, a benzothiophenyl group, a dibenzothiophenyl group, an azadibenzothiophenyl group, a quinolyl group, an isoquinolyl group, a quinoxalinyl group, a quinazolinyl group, a naphthyridinyl group, a carbazolyl group, an azacarbazolyl group, a phenanthridinyl group, an acridinyl group, a phenanthrolinyl group, a phenazinyl group, a phenothiazinyl group, a phenoxazinyl group, an oxazolyl group, an oxadiazolyl group, a furazanyl group, a benzoxazolyl group, a thienyl group, a thiazolyl group, a thiadiazolyl group, a benzthiazolyl group, a triazolyl group, a tetrazolyl group, and the like; and a dibenzofuranyl group, a dibenzothiophenyl group, and a carbazolyl group are preferable.

As the alkyl group having 1 to 10 carbon atoms, a straight-chain alkyl group and a branched-chain alkyl group may be given. As the straight-chain and branched-chain alkyl groups, a methyl group, an ethyl group, a propyl group, an isopropyl group, a n-butyl group, an isobutyl group, a sec-butyl group, a tert-butyl group, a n-pentyl group, a n-hexyl group, a n-heptyl group, a n-octyl group, and the like may be given; preferably a methyl group, an ethyl group, a propyl group, an isopropyl group, a n-butyl group, an isobutyl group, a sec-butyl group, and a tert-butyl group may be given; and further preferably a methyl group, an ethyl group, a propyl group, an isopropyl group, a n-butyl group, a s-butyl group, and a t-butyl group may be given.

As the cycloalkyl group having 3 to 10 ring-forming carbon atoms, a cyclopropyl group, a cyclobutyl group, a cyclopentyl group, a cyclohexyl group, a 1-adamantyl group, a 2-adamantyl group, a 1-norbornyl group, a 2-norbornyl group, and the like may be given; and preferably a cyclopentyl group and a cyclohexyl group may be given.

The trialkylsilyl group having 3 to 10 carbon atoms is expressed as —Si($R^a$)($R^b$)($R^c$), and examples of ($R^a$), ($R^b$), and ($R^c$) include the alkyl groups described above. Specifically, a trimethylsilyl group, a triethylsilyl group, a t-butyldimethylsilyl group, a vinyldimethylsilyl group, a propyldimethylsilyl group, and the like may be given.

The triarylsilyl group having 18 to 30 ring-forming carbon atoms is expressed as —Si($Ar^a$)($Ar^b$)($Ar^c$), and examples of ($Ar^a$), ($Ar^b$), and ($Ar^c$) include the aryl groups described above. Specifically, a triphenylsilyl group and the like may be given.

As the alkylarylsilyl group having 8 to 15 carbon atoms (provided that the number of ring-forming carbon atoms of the aryl portion is 6 to 14), a dialkylarylsilyl group and an alkyldiarylsilyl group may be given. The dialkylarylsilyl group is expressed as —Si($R^a$)($R^b$)($Ar^c$); examples of ($R^a$) and ($R^b$) include the alkyl groups described above, and examples of ($Ar^c$) include the aromatic hydrocarbon groups described above. Specifically, a phenyldimethylsilyl group and the like may be given.

The alkyldiarylsilyl group is expressed as —Si($R^a$)($Ar^b$)($Ar^c$); examples of ($R^a$) include the alkyl groups described above, and examples of ($Ar^b$) and ($Ar^c$) include the aryl groups described above. Specifically, a methyldiphenylsilyl group and the like may be given.

The substituted amino group is expressed as —N($Ar^a$)($Ar^b$); examples of ($Ar^a$) and ($Ar^b$) include the aryl groups and the heteroaryl groups described above. Specifically, a diphenylamino group, a dibiphenylamino group, a dibenzofuranylbiphenylamino group, and the like may be given. As the group containing a substituted amino group, an aryl group substituted with the substituted amino group mentioned above may be given.

As the halogen atom, F, Cl, Br, I, and the like may be given.

As the substituent of each group of the compound represented by Formula (1), the alkyl groups, the cycloalkyl groups, the substituted silyl groups, the aromatic hydrocarbon groups, the heterocyclic groups, and the halogen atoms mentioned above, and in addition an alkoxy group, an aralkyl group, a silyl group, a hydroxyl group, a nitro group, a cyano group, a carboxy group, an aryloxy group, a substituted amino group, and the like may be given. Further, "unsubstituted" means that a hydrogen atom is bonded.

In the compound of Formula (1), one or more of $Ar_1$, $Ar_2$, and $Ar_3$ may be bonded to a group containing a substituted amino group or a substituted or unsubstituted carbazole group to form a diamine compound, a triamine compound, or the like. As the group containing a substituted amino group, a group containing an amino group having the substituted or unsubstituted aromatic hydrocarbon group or the substituted or unsubstituted heterocyclic group having 5 to 30 ring-forming atoms described above may be given. Specifically, a diphenylamino group, a dibiphenylamino group, and a dibenzofuranylbiphenylamino group, and a group in which any of these substituted amino groups is bonded to an aromatic hydrocarbon group (benzene, naphthalene, anthracene, a 9,9-dimethylfluorenyl group, and the like) may be given.

Specific examples of the compound represented by Formula (1) are shown below.

[Chem. 3]

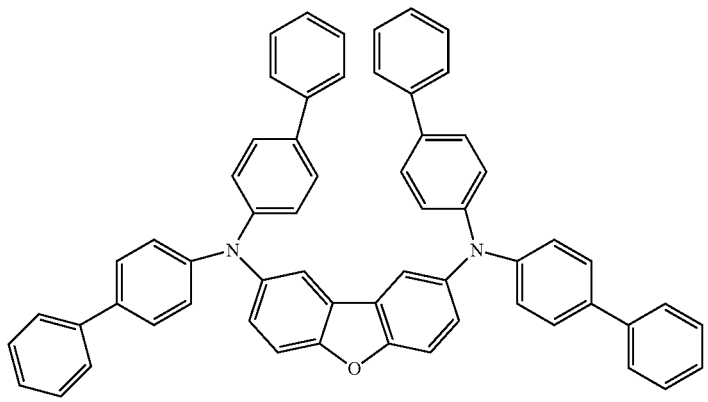

-continued
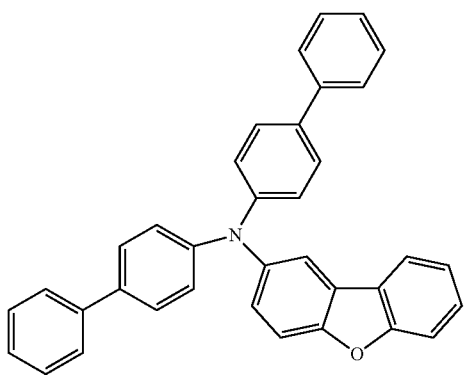
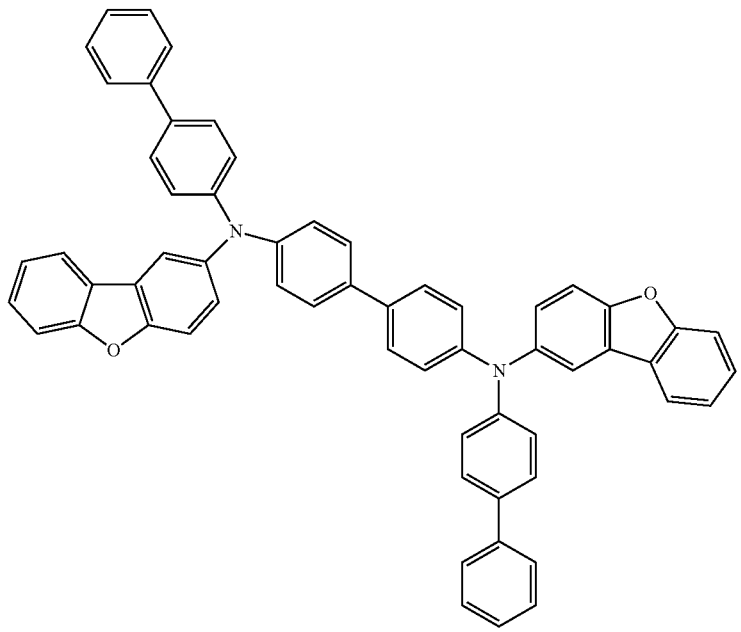
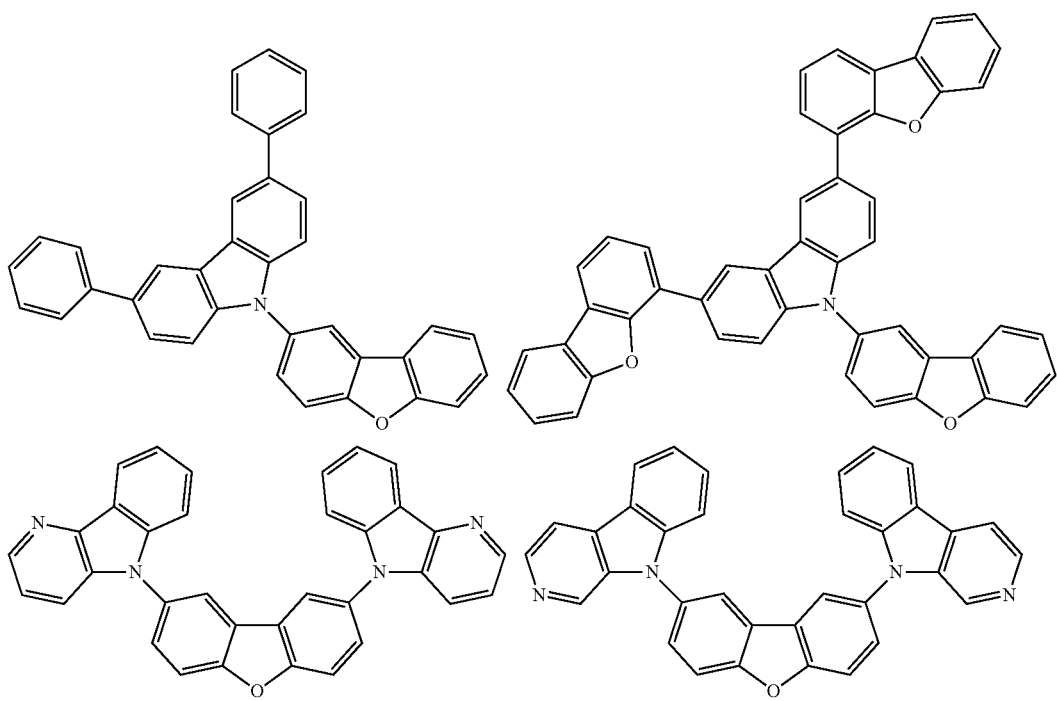

[Chem. 4]
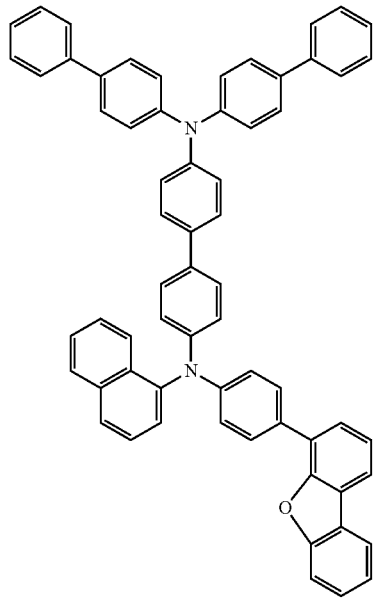
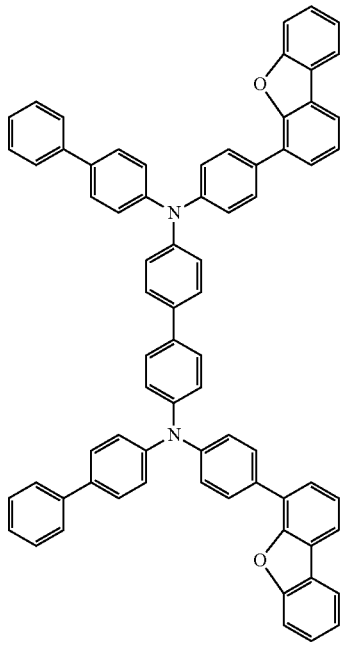
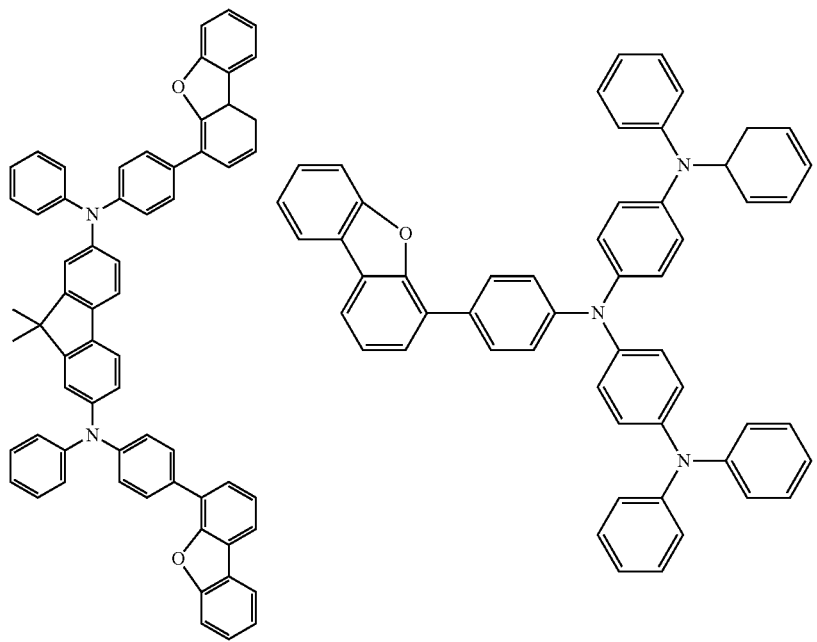

-continued
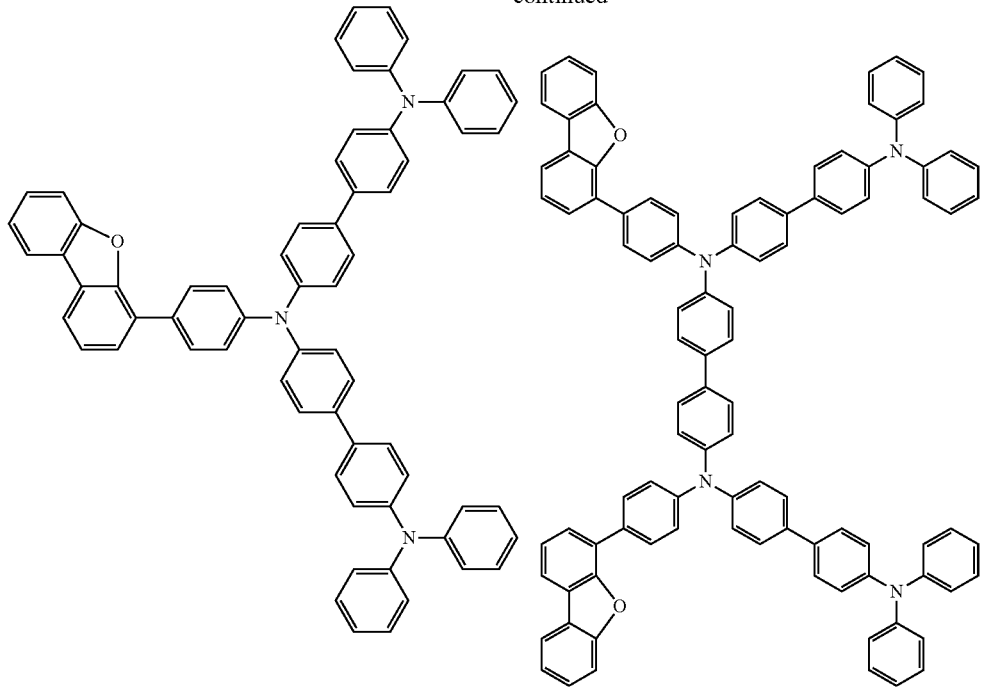
[Chem. 5]
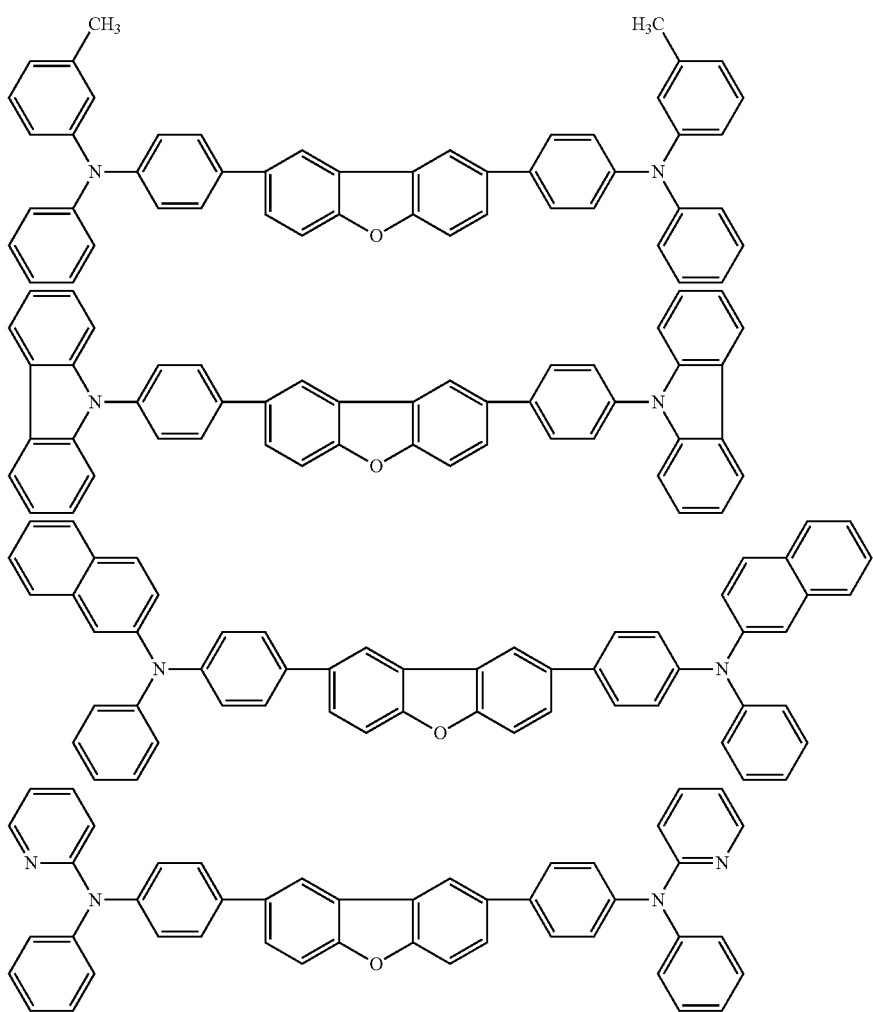

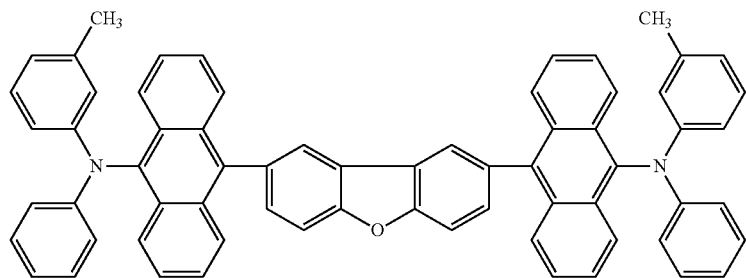
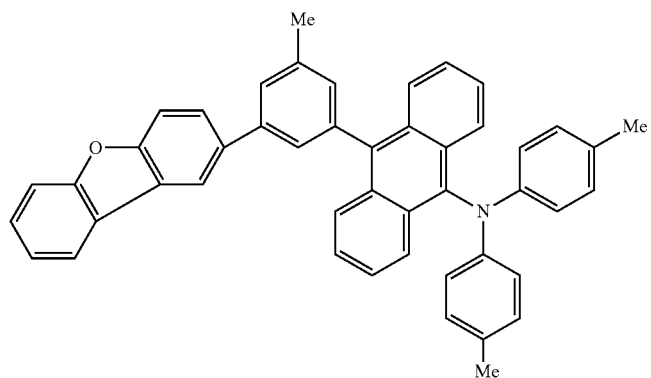
[Chem. 6]
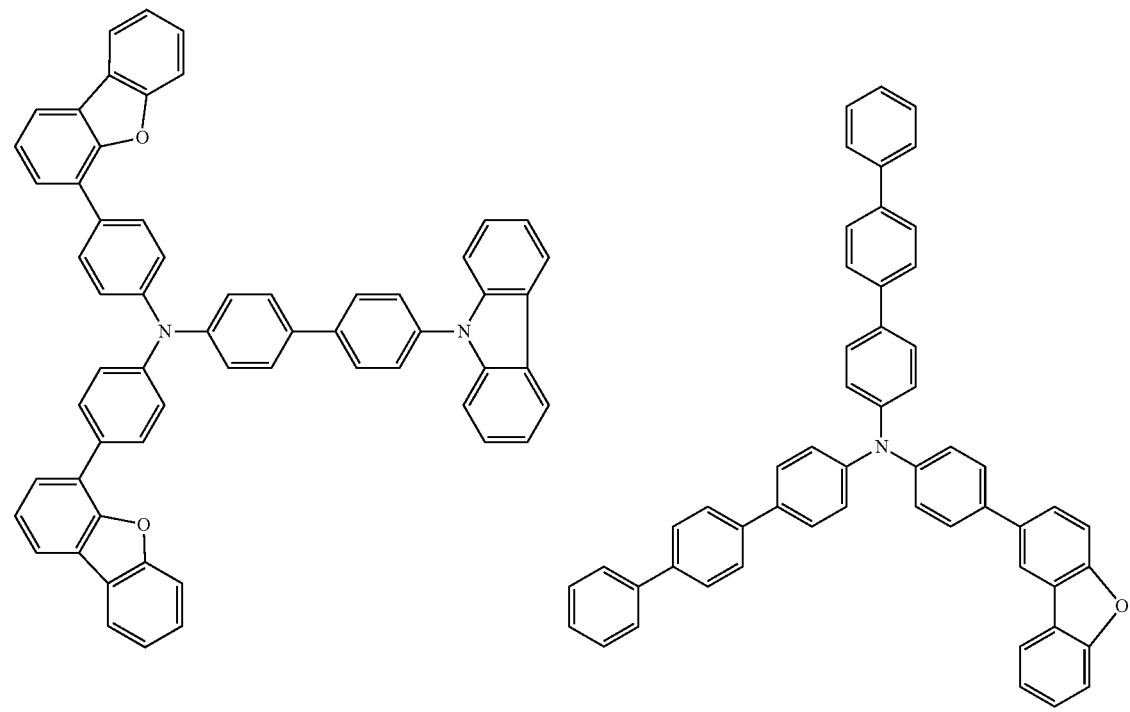

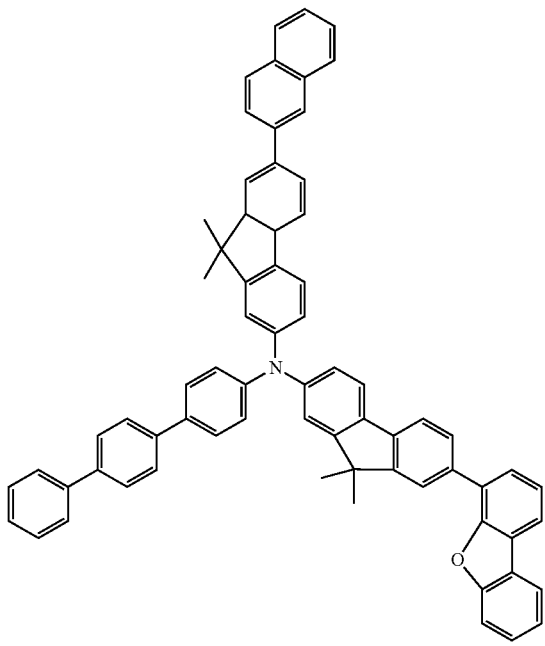
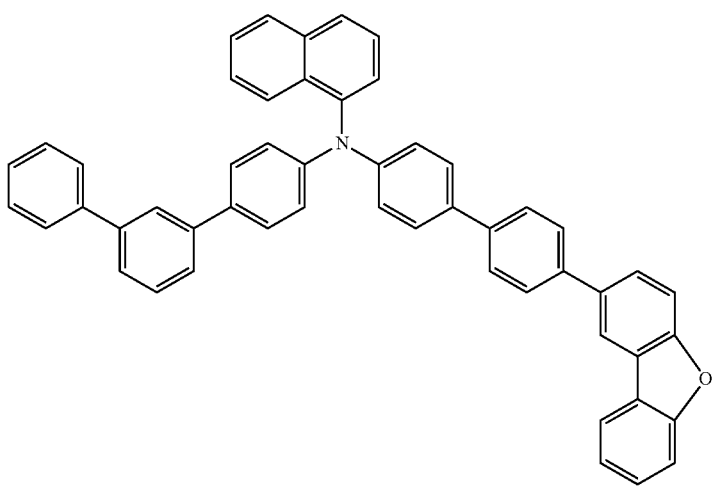

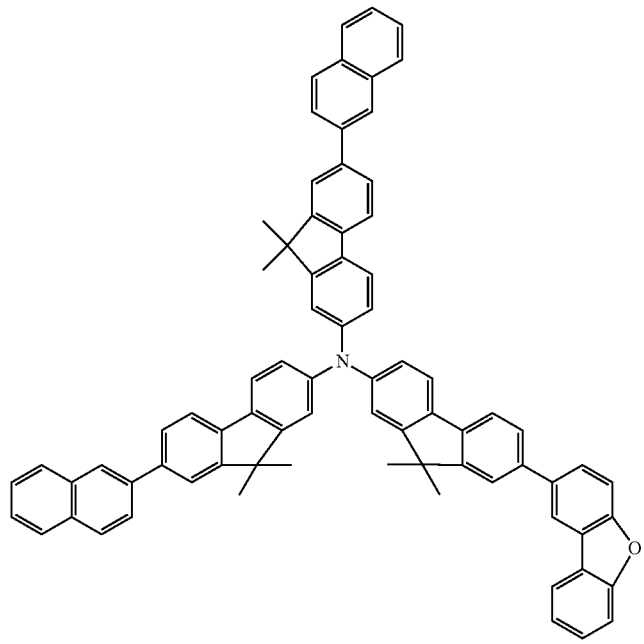
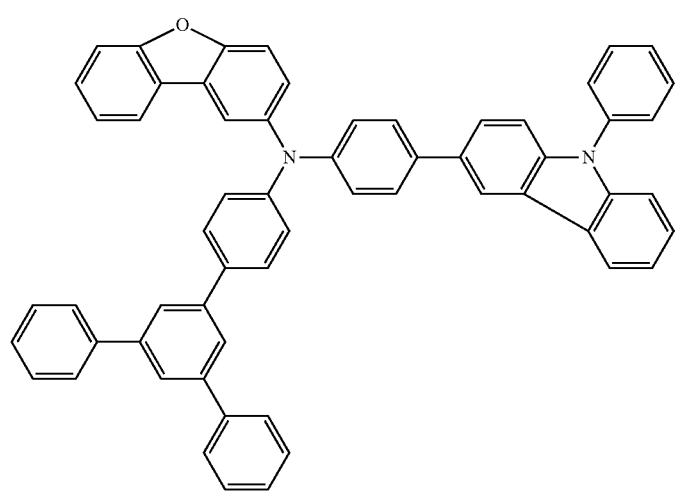

-continued
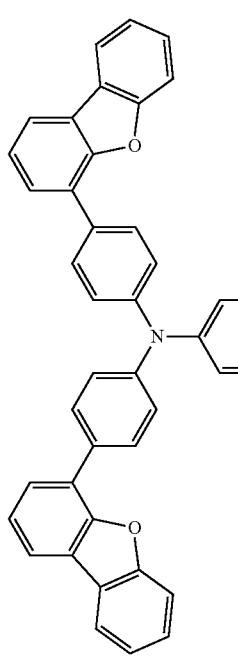
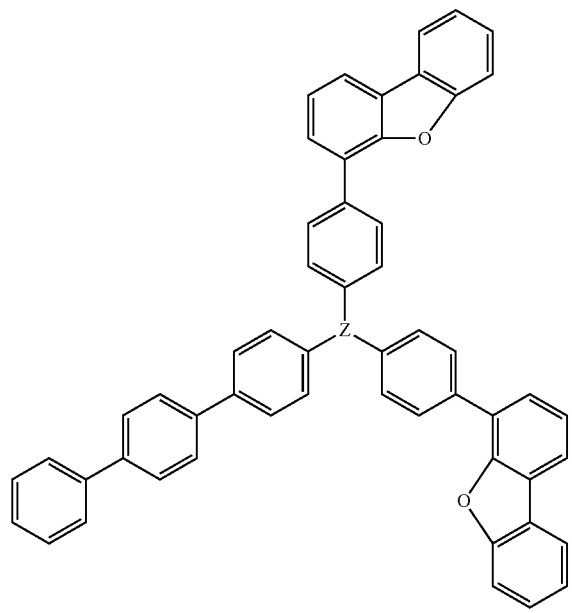
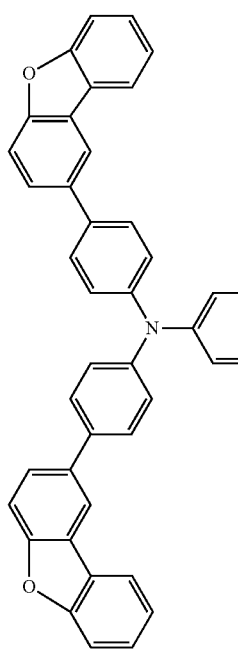
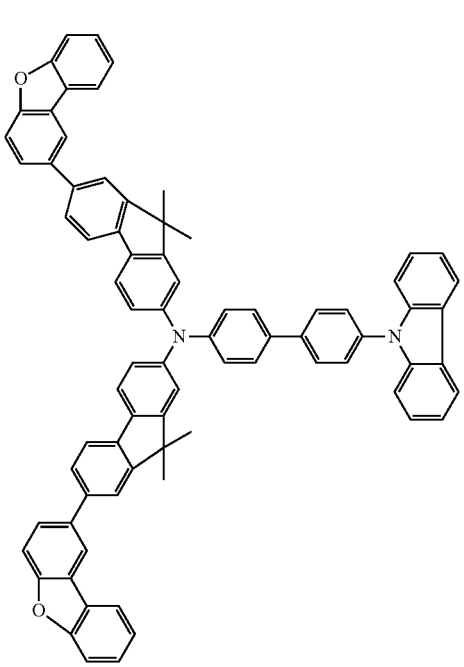

-continued
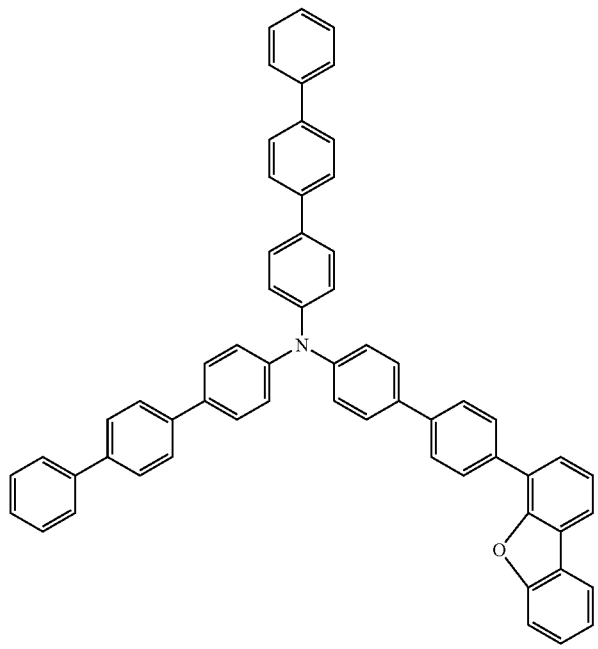
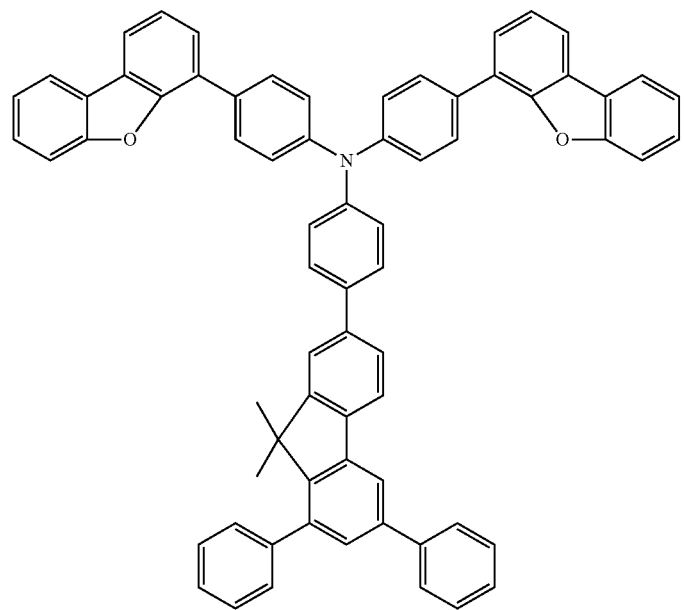

[Chem. 7]
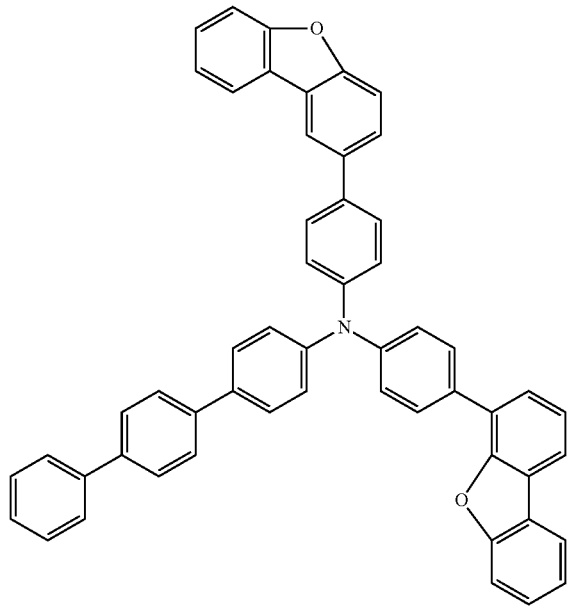
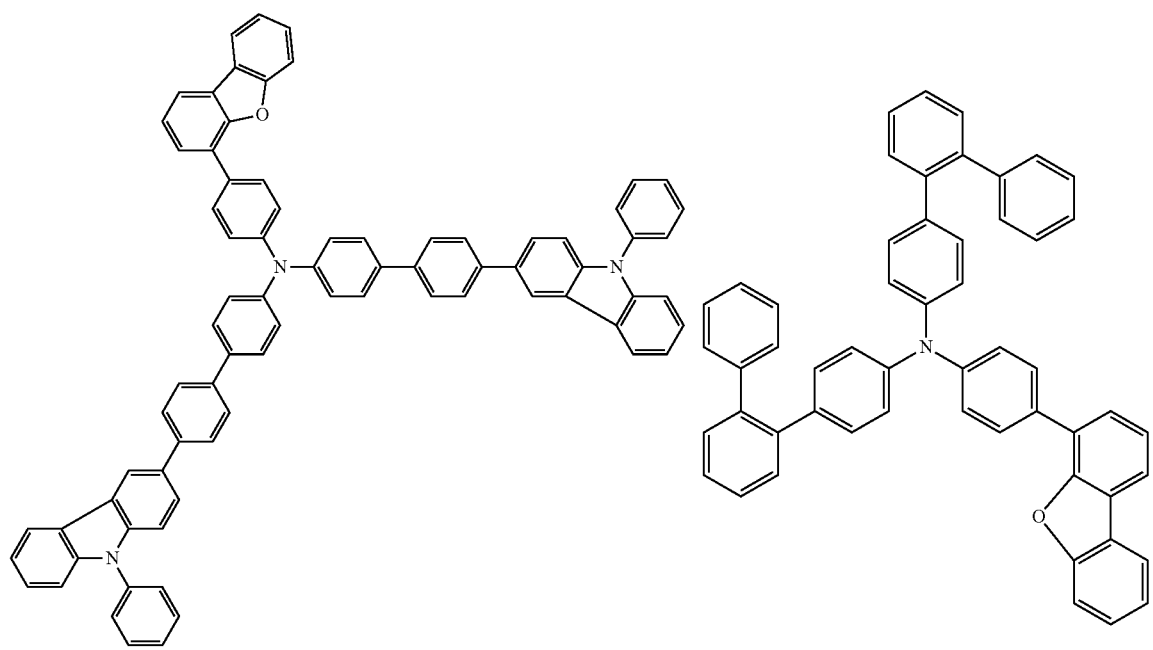

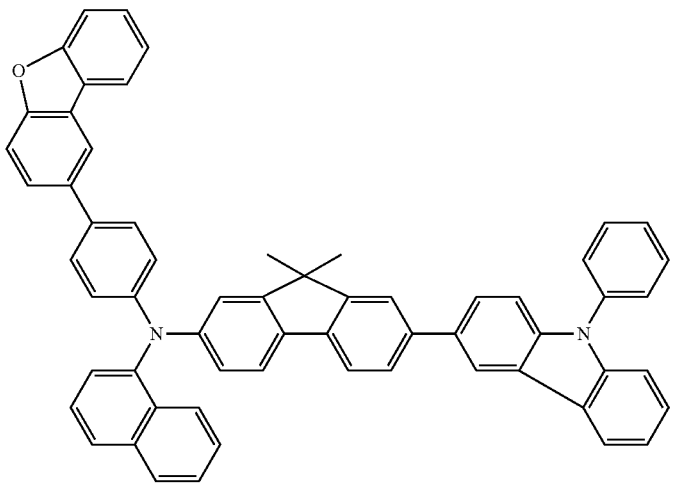
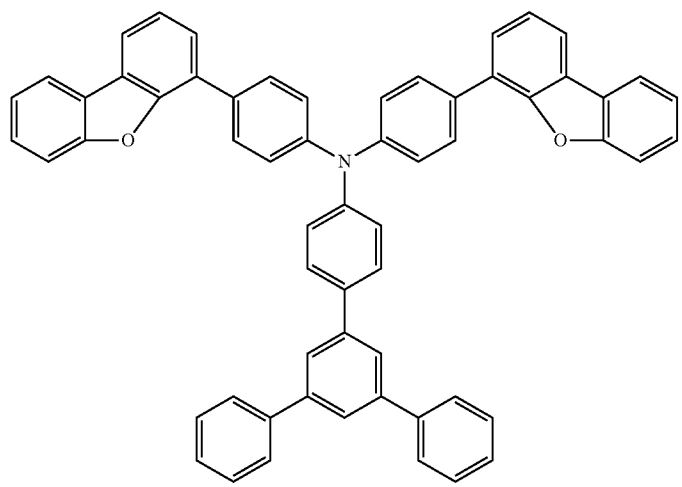
[Chem. 8]
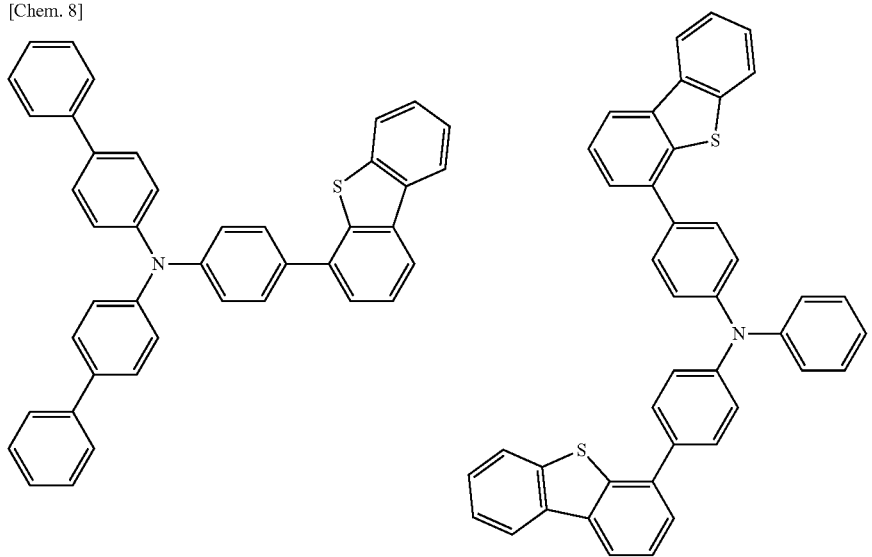

-continued

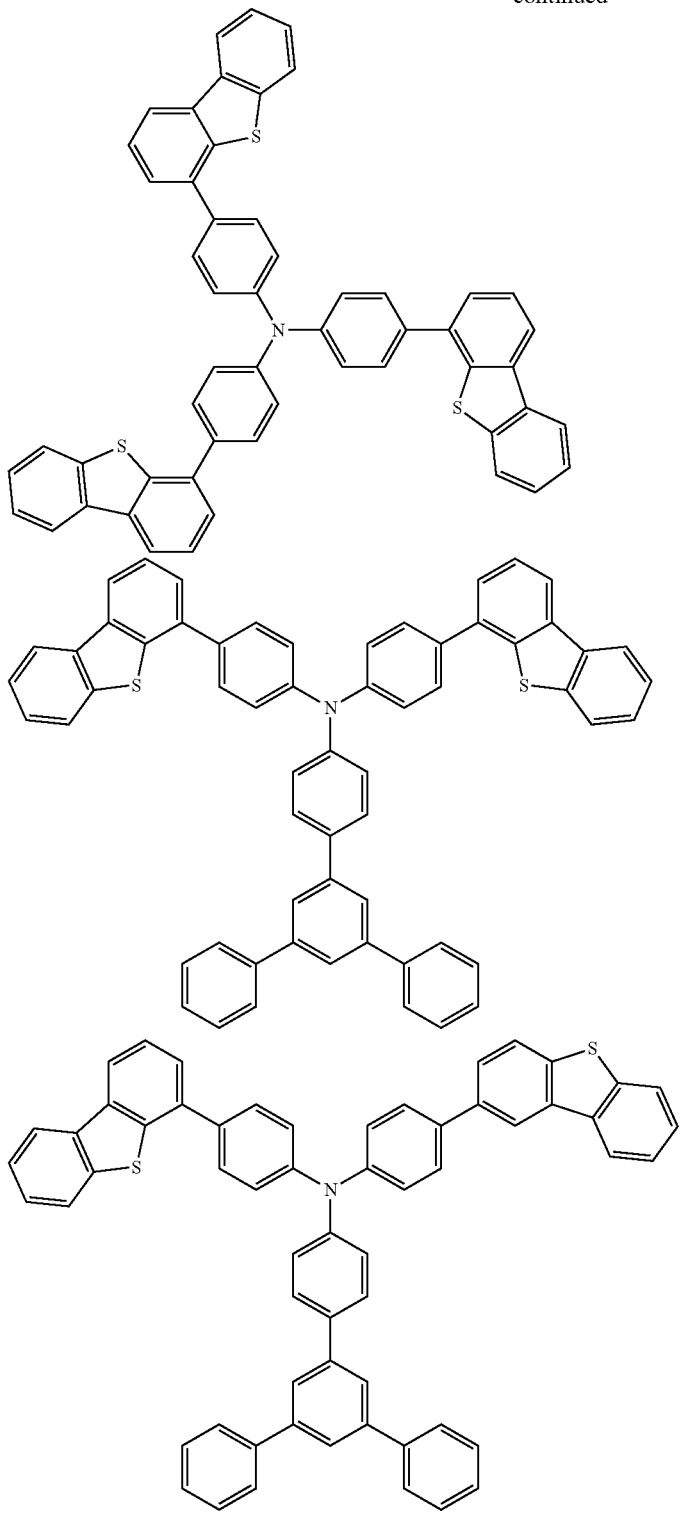

For the compound of Formula (1), for example, JP 2006-151844A, JP 2008-021687A, WO 2007/125714, WO 2010-061824, and JP 2005-112765A may be given as references.

The thickness of the intermediate region is 0.1 nm to 20 nm, preferably 5 nm to 10 nm. By using a compound represented by Formula (1) as the intermediate region, the supply of electrons to the anode-side light emitting region can be performed with good balance while electrons at the interface between the cathode-side light emitting region and the intermediate region are blocked; thus, the thickness of the intermediate region can be set larger than before. The content ratio of the compound represented by Formula (1) in the intermediate region is not particularly limited, but is preferably 1 mass % to 100 mass %, more preferably 80 mass % to 100 mass %, and particularly preferably 100 mass %. As other compounds usable for the intermediate region, a host material of the light emitting region and a compound used in the hole transport region or the electron transport region may be given.

As the azine-based compound described above, a compound represented by Formula (3) below may be given.

[Chem. 9]

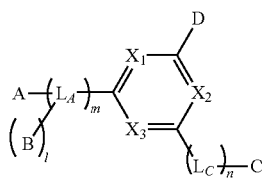

(3)

Here, $X_1$ represents —CH or a nitrogen atom, $X_2$ represents —CH or a nitrogen atom, and $X_3$ represents —CH or a nitrogen atom, provided that $X_1$, $X_2$, and $X_3$ are not —CH at the same time; the value of l is 0 or 1, the value of m is 0, 1, or 2, and the value of n is 0, 1, or 2, provided that, when m=0, l=0; A represents a carbazolyl group, a dibenzofuranyl group, or a dibenzothiophene group; B represents a substituted or unsubstituted aromatic hydrocarbon group having more than or equal to 6 and less than or equal to 30 ring-forming carbon atoms, or a substituted or unsubstituted heterocyclic group having more than or equal to 5 and less than or equal to 30 ring-forming atoms; C represents a substituted or unsubstituted aromatic hydrocarbon group having more than or equal to 6 and less than or equal to 30 ring-forming carbon atoms, or a substituted or unsubstituted heterocyclic group having more than or equal to 5 and less than or equal to 30 ring-forming atoms; D represents a substituted or unsubstituted aromatic hydrocarbon group having more than or equal to 6 and less than or equal to 30 ring-forming carbon atoms, or a substituted or unsubstituted heterocyclic group having more than or equal to 5 and less than or equal to 30 ring-forming atoms; $L_A$ represents a substituted or unsubstituted aromatic hydrocarbon group having more than or equal to 6 and less than or equal to 30 ring-forming carbon atoms, or a substituted or unsubstituted heterocyclic group having more than or equal to 5 and less than or equal to 30 ring-forming atoms; $L_C$ represents a substituted or unsubstituted aromatic hydrocarbon group having more than or equal to 6 and less than or equal to 30 ring-forming carbon atoms, or a substituted or unsubstituted heterocyclic group having more than or equal to 5 and less than or equal to 30 ring-forming atoms; the substitutions mentioned above are each individually and independently selected from methyl, ethyl, isopropyl, tertiary butyl, phenyl, naphthyl, biphenyl, terphenyl, phenanthryl, anthracenyl, pyrenyl, chrysenyl, fluorenyl, 9,9-dimethylfluorenyl, 9,9-diphenylfluorenyl, spirofluorenyl, pyridine, pyrimidine, a triazine, indole, imidazole, purine, isoquinoline, quinoline, quinazoline, carbazole, phenanthridine, acridine, phenanthroline, fluorine, chlorine, a cyano group, a silyl group, and deuterium.

Note that it is preferable that $X_1$ be a nitrogen atom, $X_2$ be a nitrogen atom, and $X_3$ be —CH. Further, A is preferably any of a 3-carbazolyl group, a 9-carbazolyl group, a 2-dibenzofuranyl group, a 4-dibenzofuranyl group, a 2-dibenzothiophenyl group, and a 4-dibenzothiophenyl group. Furthermore, the aromatic hydrocarbon of B is preferably any of phenyl, naphthyl, biphenyl, terphenyl, phenanthryl, anthracenyl, pyrenyl, chrysenyl, fluorenyl, 9,9-diphenylfluorenyl, and spirofluorenyl. Further, the heterocyclic group of B is preferably any of pyridine, pyrimidine, a triazine, indole, imidazole, purine, isoquinoline, quinoline, quinazoline, carbazole, phenanthridine, acridine, and phenanthroline. Furthermore, the aromatic hydrocarbons of C, D, $L_A$, and $L_C$ are preferably each independently selected from the prescription of the aromatic hydrocarbon of B described above. Further, the heterocyclic groups of C, D, $L_A$, and $L_C$ are preferably each independently selected from the prescription of the heterocyclic group of B described above. Further, when m=0, A is directly bonded to the azine ring containing $X_1$. When l=0, B does not exist. When n=, C is directly bonded to the azine ring containing $X_1$.

Specific examples of the compound of Formula (3) are shown below.

[Chem. 10]

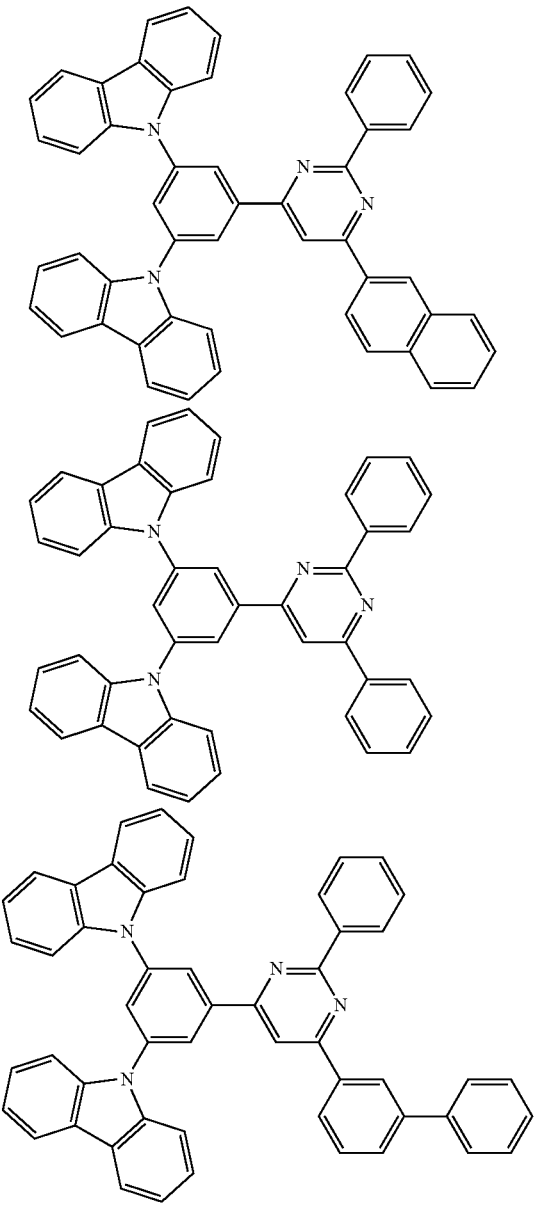

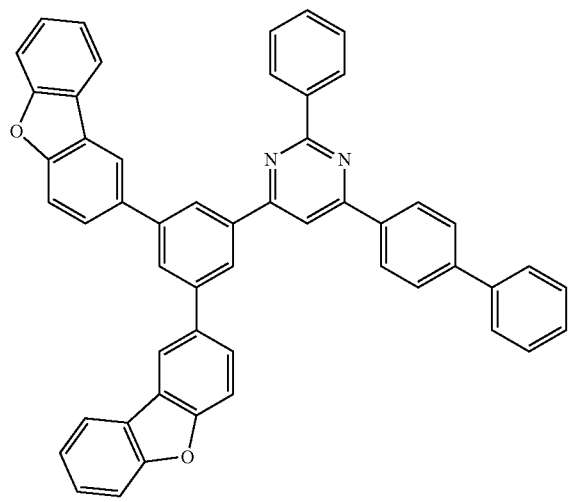
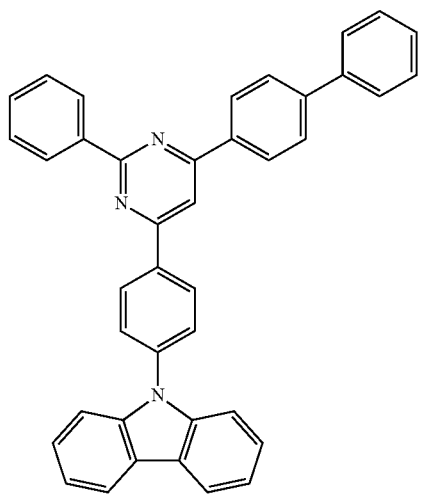
[Chem. 11]
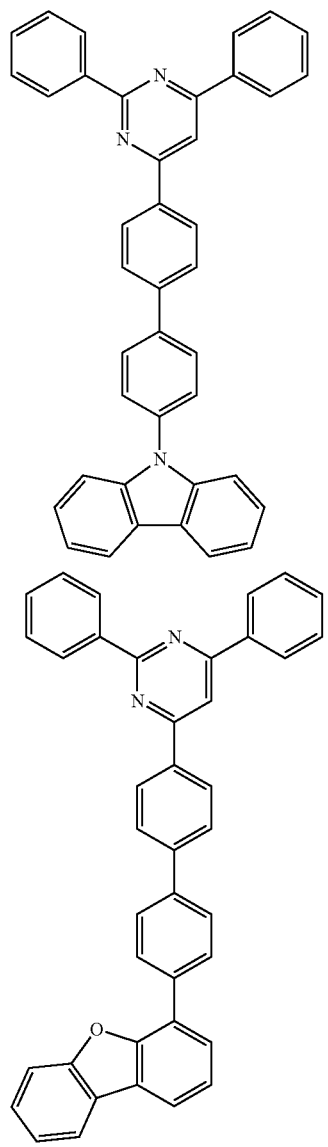
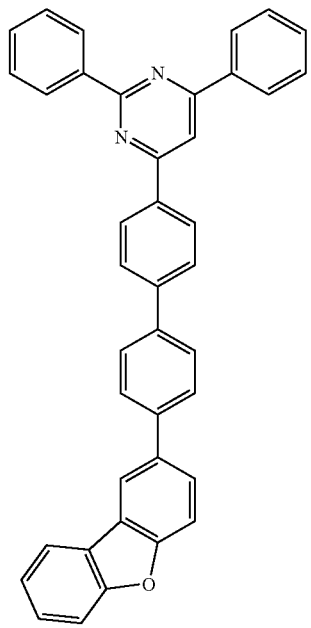
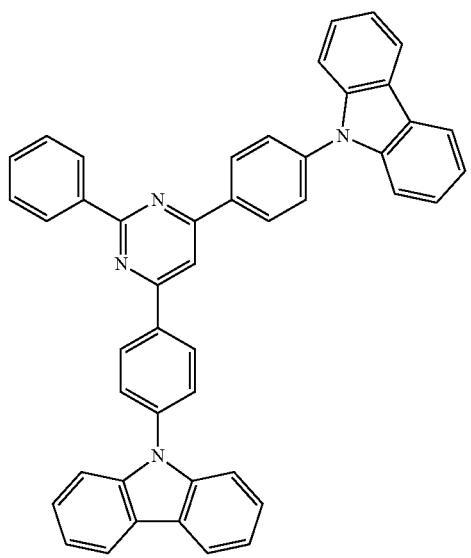

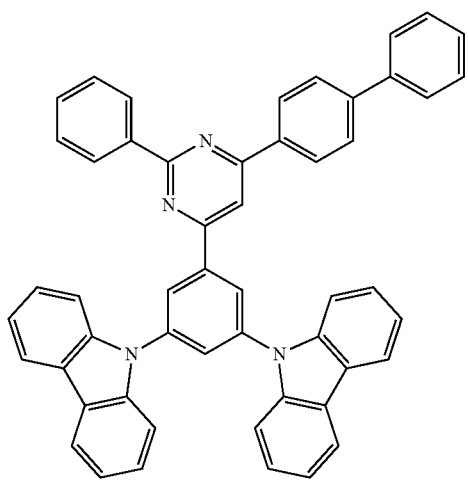
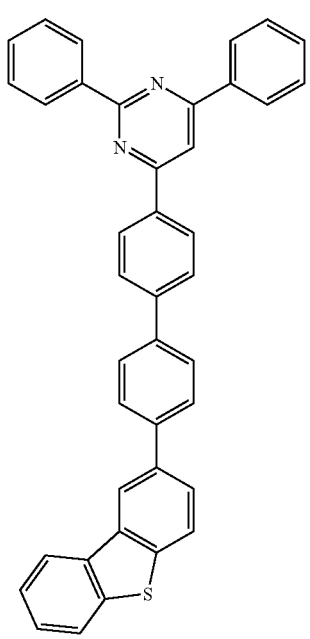
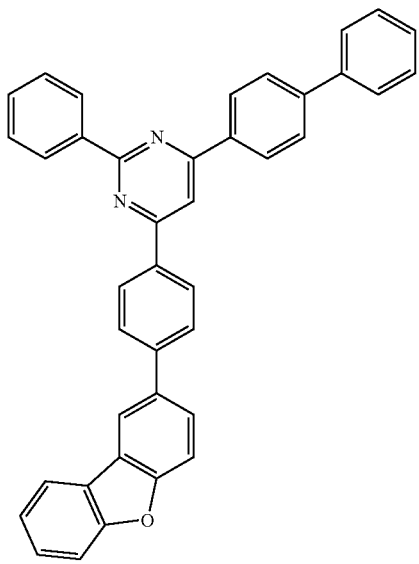
[Chem. 12]
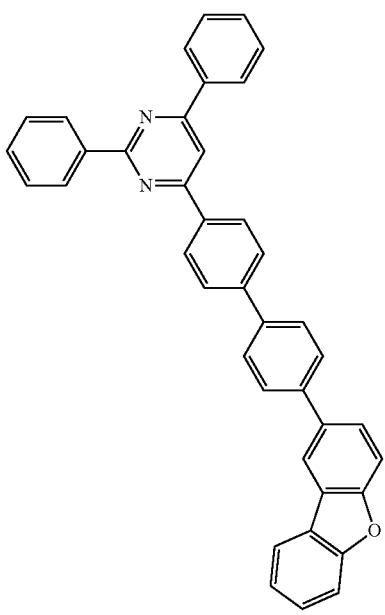
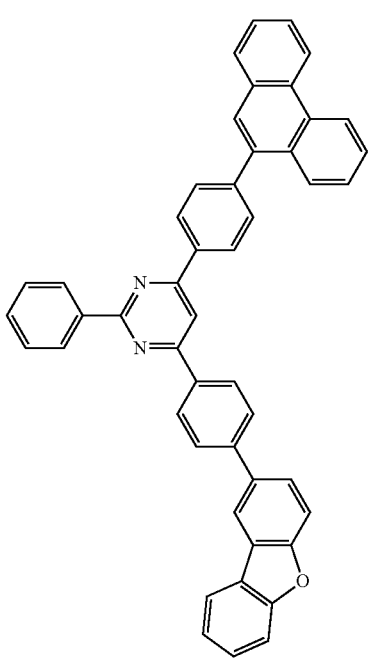

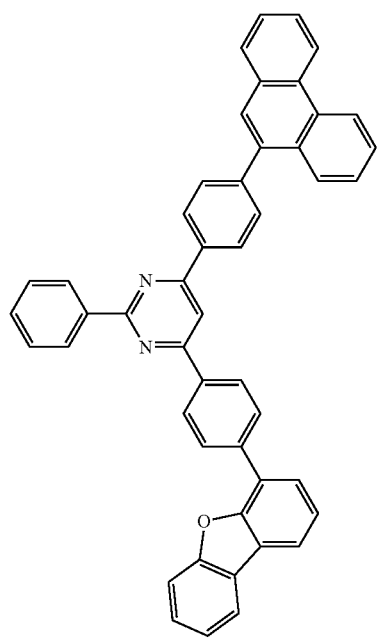
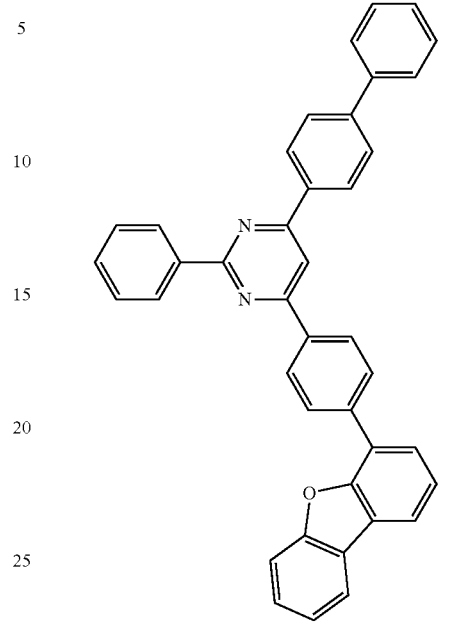
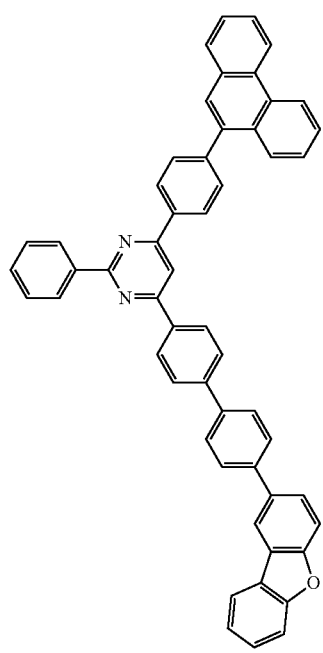
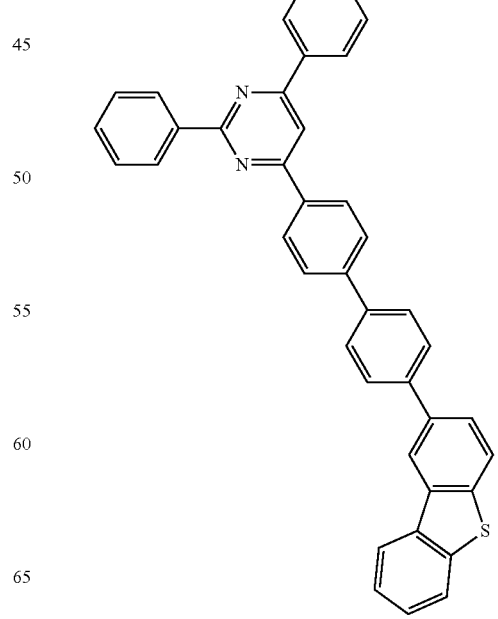

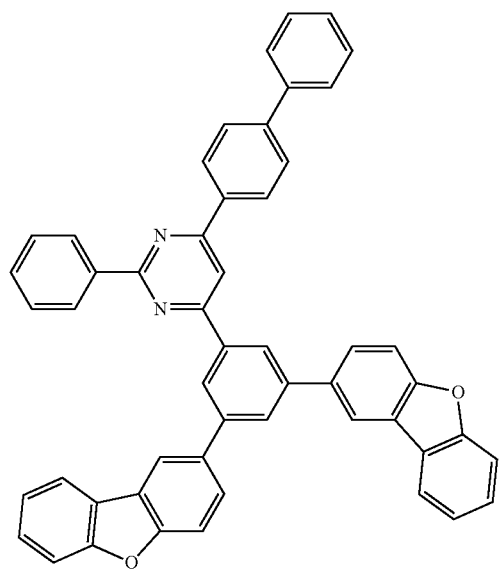
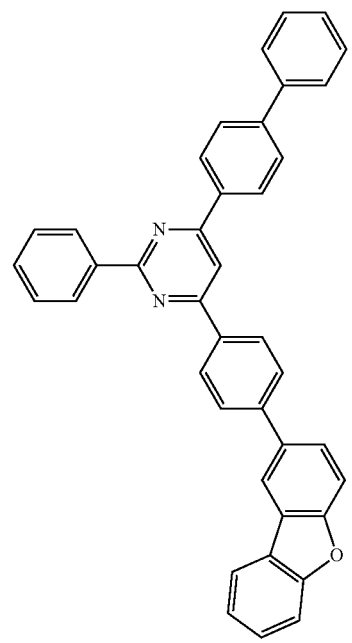
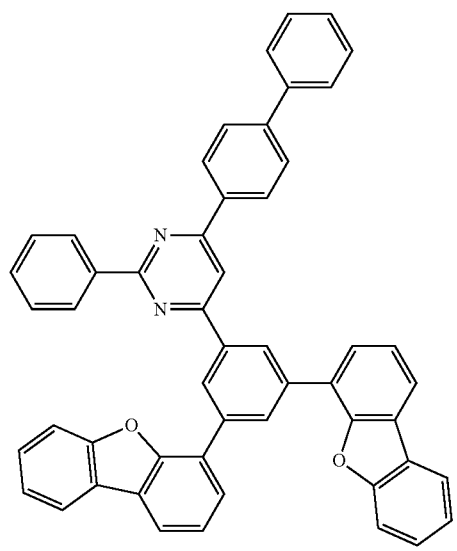
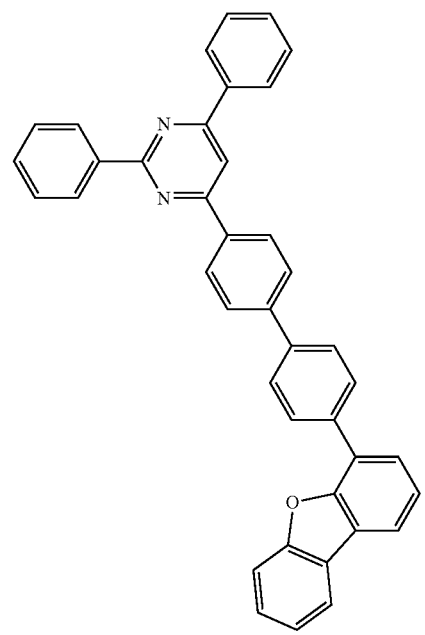

51
-continued
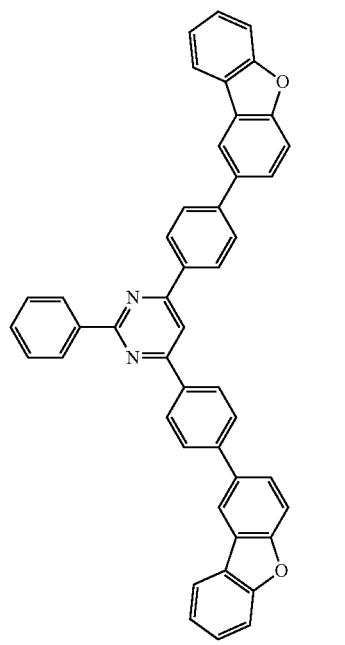
52
-continued
[Chem.13]
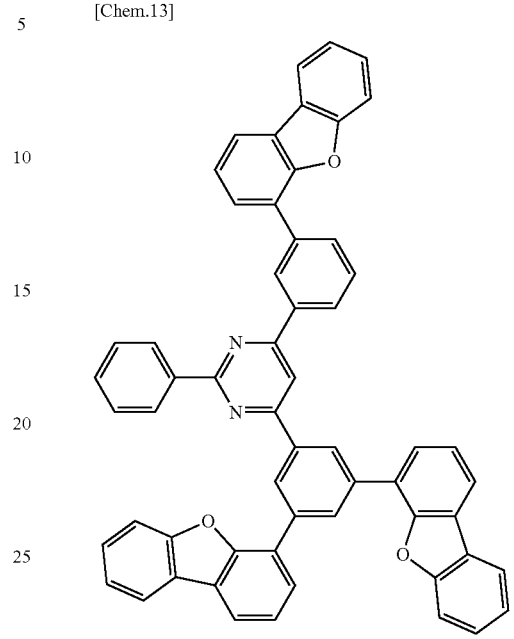
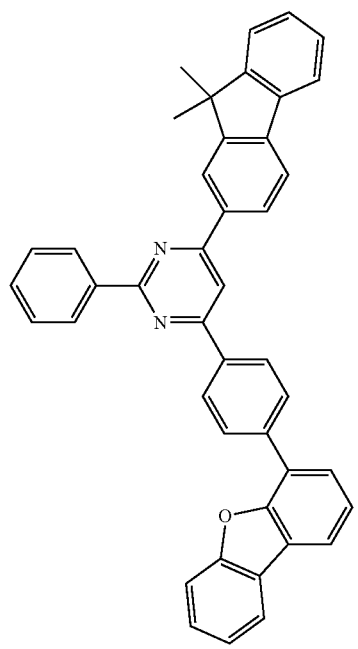
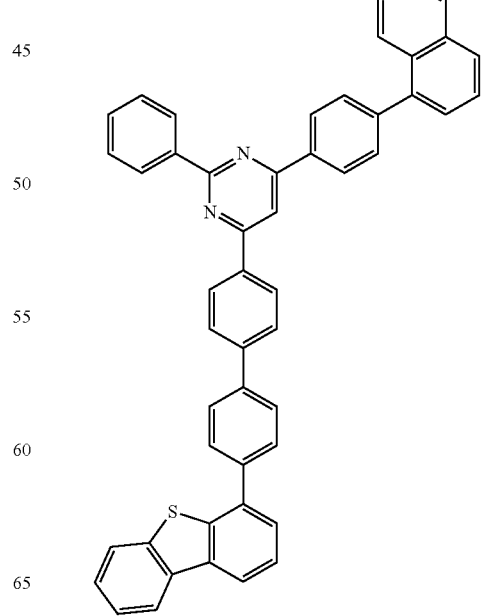

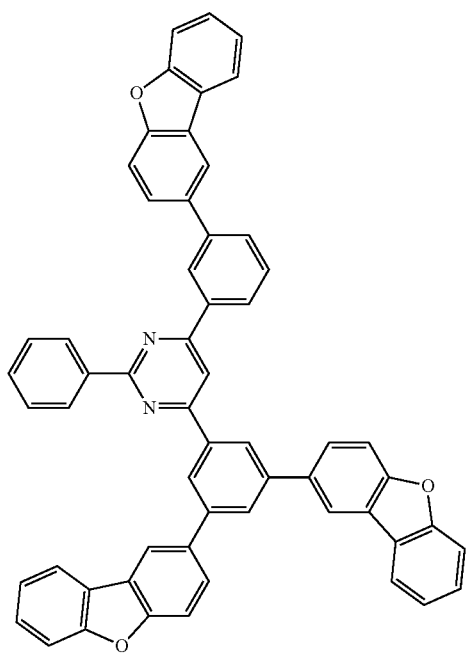
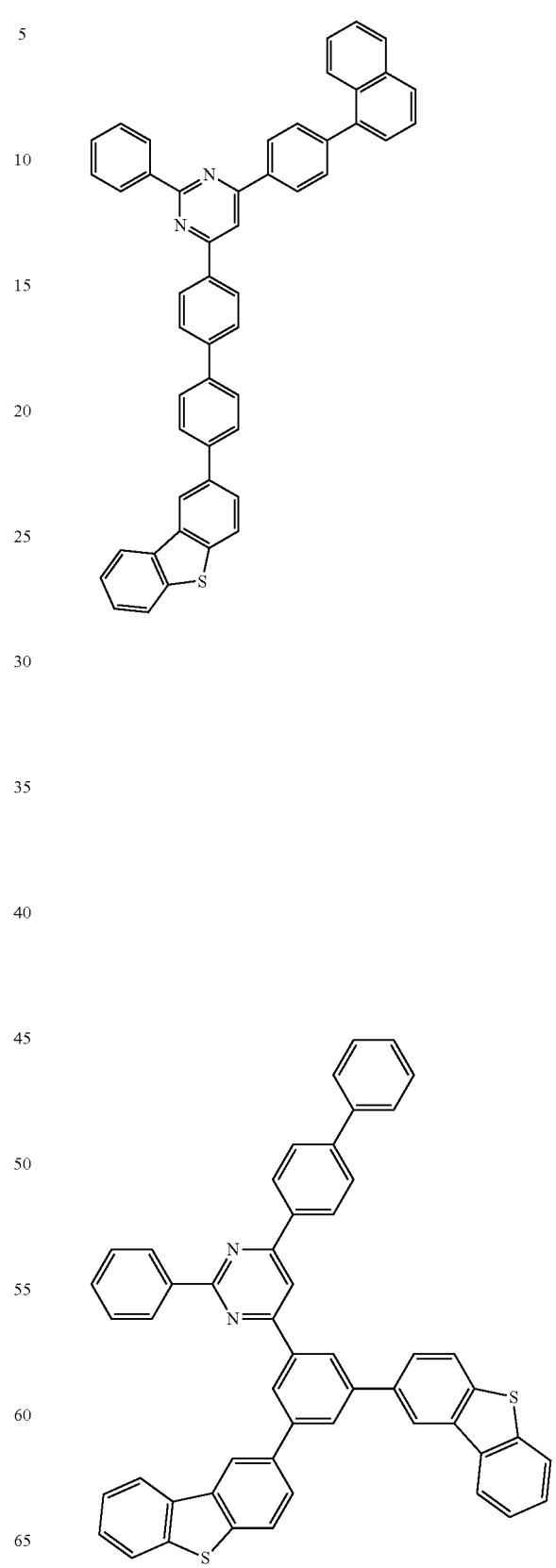

55
-continued
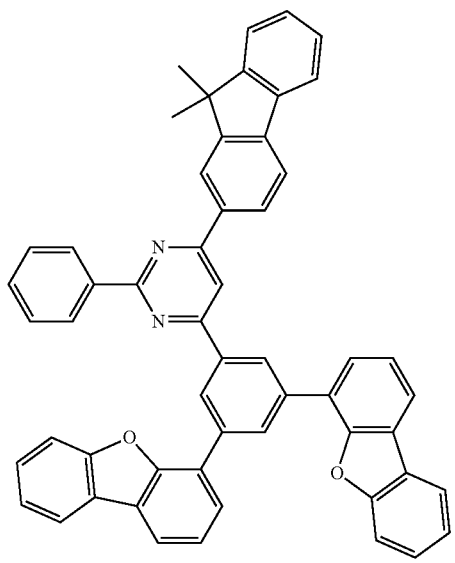
[Chem. 14]
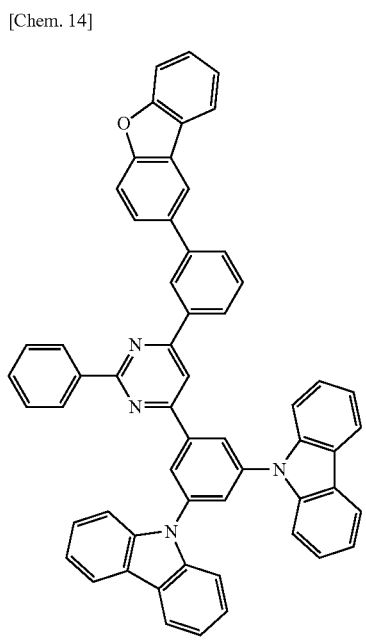
56
-continued
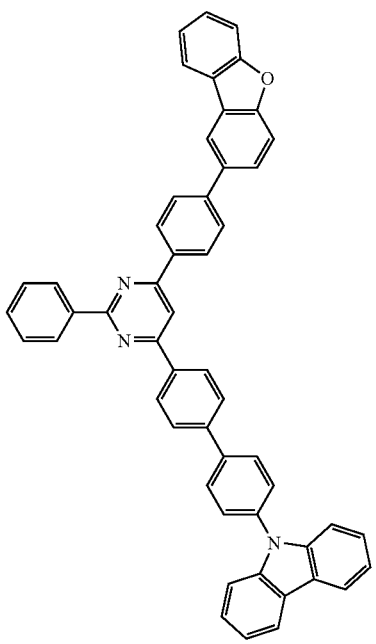
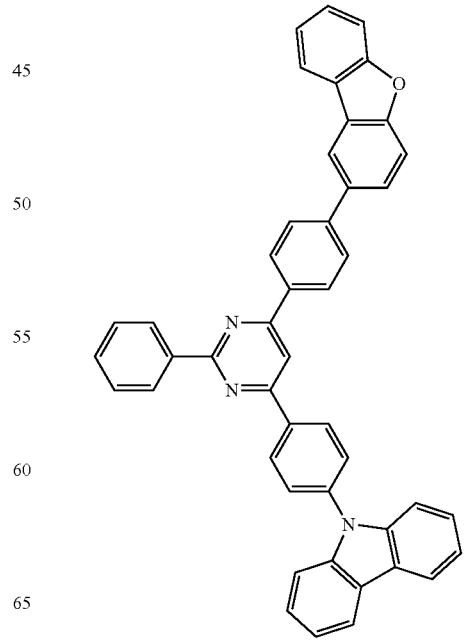

-continued
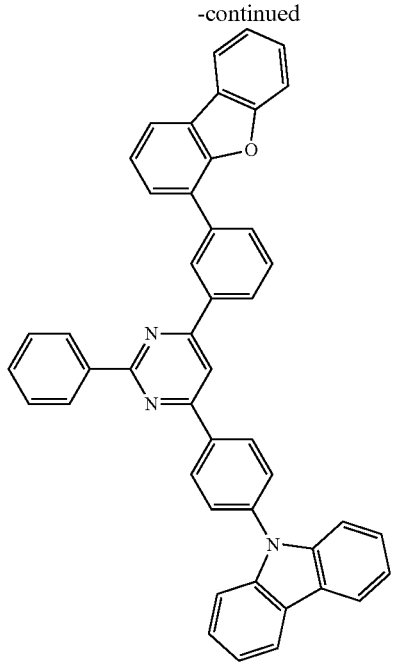
[Chem. 15]
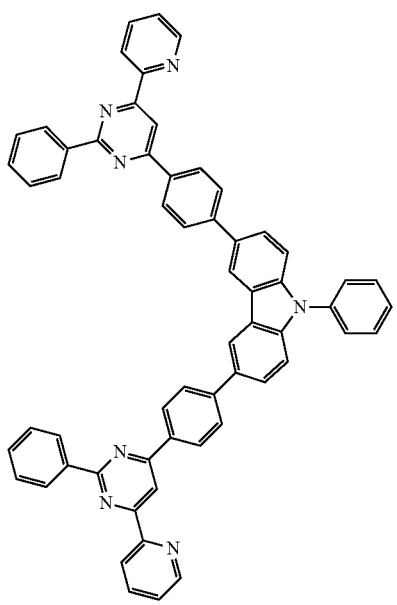
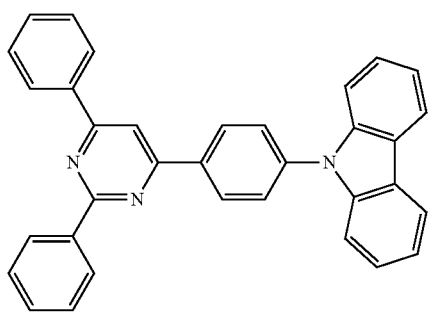
-continued
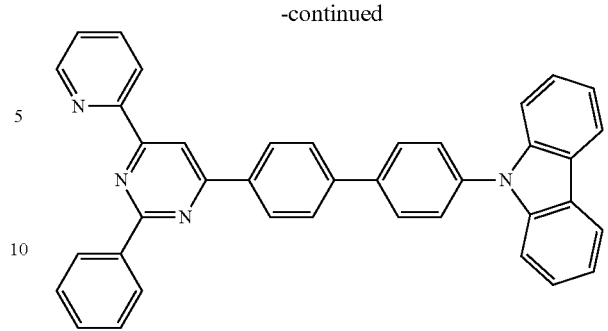
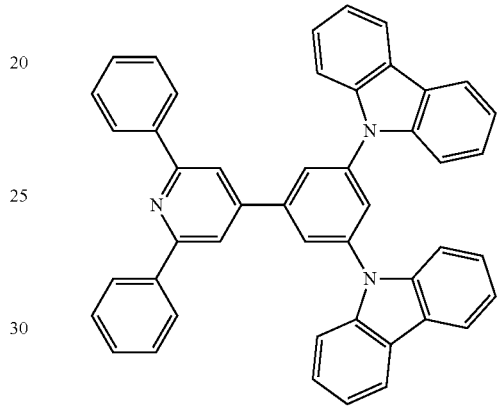
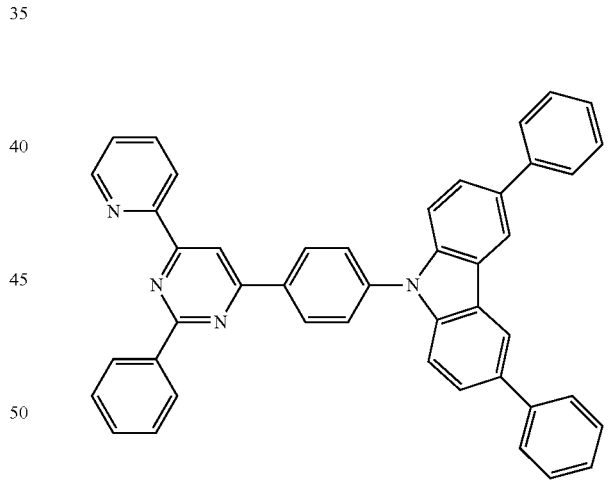
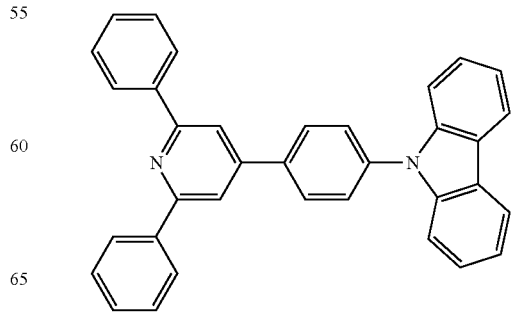

[Chem. 16]

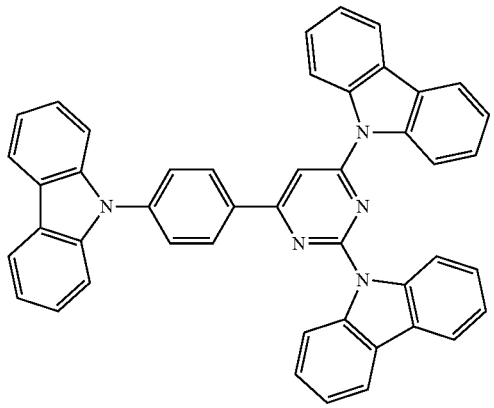

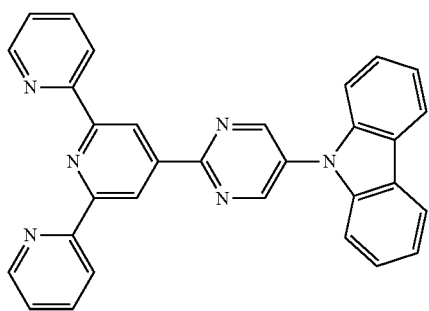

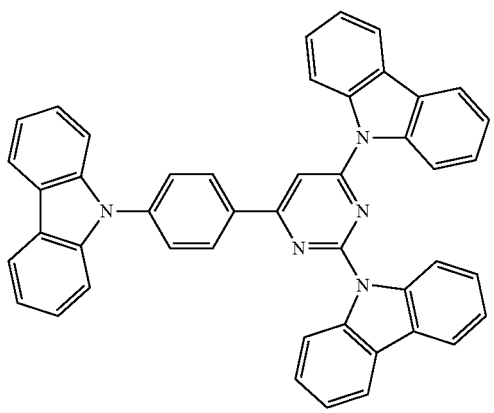

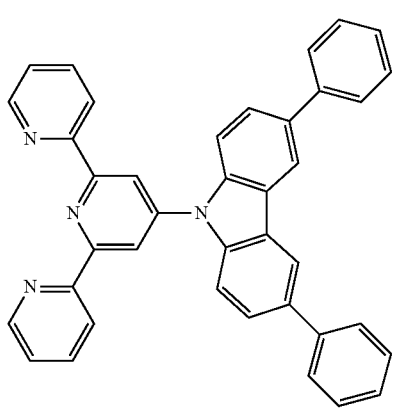

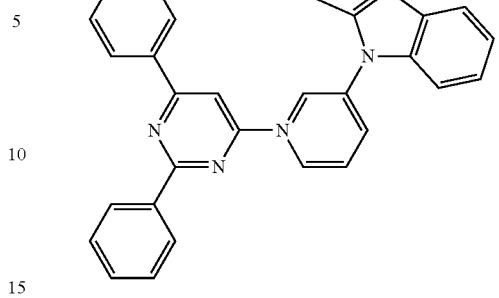

It is preferable that the material contained in the light emitting region have a charge injection function (the functions of being able to inject holes from the anode or the hole supply layer and being able to inject electrons from the cathode or the electron supply layer during electric field application), a charge transport function (the function of causing injected holes and electrons to move by the force of the electric field), and a light emission function (the function of providing a place of the recombination of electrons and holes and leading these carriers to light emission).

The light emitting region may be a fluorescence light emitting region, or may be a phosphorescence light emitting region.

Examples of the host material contained in the fluorescence light emitting region other than azine-based compounds include a styryl derivative, a naphthacene derivative, and an aromatic amine. As the styryl derivative, a distyryl derivative, a tristyryl derivative, a tetrastyryl derivative, and a styrylamine derivative may be given. As the aromatic amine, a compound having 2 to 4 nitrogen atoms each substituted with an aromatic ring group may be given.

It is preferable that, among the plurality of light emitting regions, at least one light emitting region other than the light emitting region containing an azine-based compound as the host material described above contain a material with an ionization potential of less than 5.6 eV as a host material. Further, this light emitting region is preferably the light emitting region nearest to the anode side among the plurality of light emitting regions. Thereby, hole injection from the anode is stabilized. As the compound with an ionization potential of less than 5.6 eV (hole transporting material), a polycyclic aromatic hydrocarbon compound in which the mother skeleton has 4 to 7 ring members may be given. The mother skeleton is preferably pyrene, benzopyrene, chrysene, naphthacene, a benzonaphthacene, a dibenzonaphthacene, perylene, or coronene.

More specifically, a compound represented by Formula (4) below may be given as an example. Hole injection from the anode is stabilized by using this compound.

[Chem. 17]

(4)

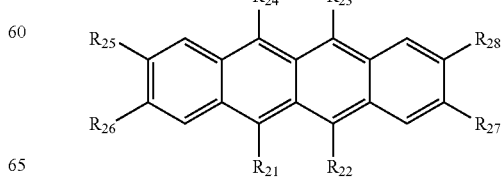

Here, in Formula (4), $R_{21}$ to $R_{28}$ each represent a hydrogen atom, a fluorine atom, a substituted or unsubstituted alkyl group having 1 to 10 carbon atoms, a substituted or unsubstituted cycloalkyl group having 3 to 10 carbon atoms, a substituted or unsubstituted alkylsilyl group having 3 to 30 carbon atoms, a substituted or unsubstituted arylsilyl group having 8 to 30 ring-forming carbon atoms, a substituted or unsubstituted alkoxy group having 1 to 20 carbon atoms, a substituted or unsubstituted aryloxy group having 6 to 20 ring-forming carbon atoms, a substituted or unsubstituted aromatic hydrocarbon group having 6 to 30 ring-forming carbon atoms, or a substituted or unsubstituted heterocyclic group having 5 to 30 ring-forming atoms. Note that specific examples of these groups include groups similar to those shown as examples of the compounds of Formulae (1) and (3) described above.

Specifically, the compounds of Formula (6-1) to Formula (6-5) below and the like may be given.

[Chem. 18]

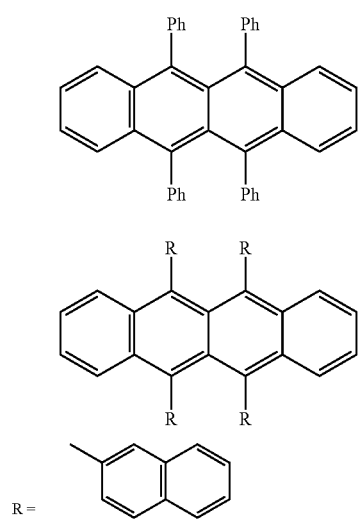

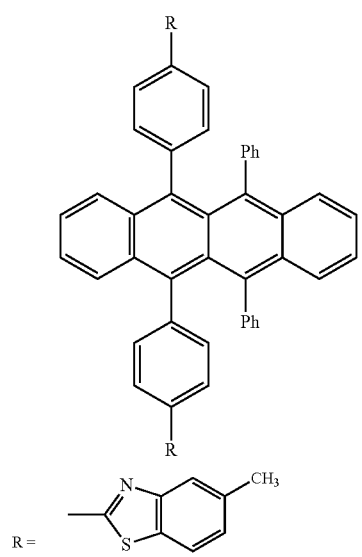

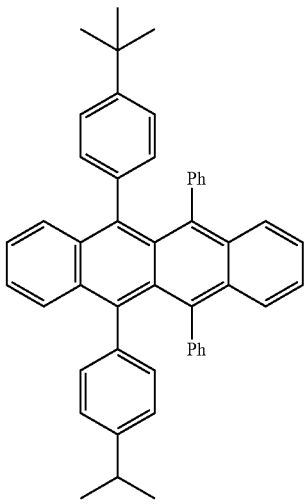

Examples of a dopant material of the fluorescence light emitting region include fluorescent materials such as laser dyes such as a styrylbenzene-based dye, an oxazole-based dye, a perylene-based dye, a coumarin-based dye, and an acridine-based dye, polycyclic aromatic hydrocarbon-based materials such as an anthracene derivative, a naphthacene derivative, a pentacene derivative, a chrysene derivative, a diketopyrrolopyrrole derivative, a pyran derivative, and a styryl derivative, a pyrromethene-skeleton compound, a metal complex, a quinacridone derivative, cyanomethylenepyran-based derivatives (DCM and DCJTB), a benzothiazole-based compound, a benzimidazole-based compound, a metal chelated oxinoid compound, and the like. The doping concentration of each of these fluorescent materials is preferably more than or equal to 0.5% and less than or equal to 15% in terms of film thickness ratio.

The light emitting region containing a hole transporting material preferably contains, as a dopant material, a perylene derivative, a diketopyrrolopyrrole derivative, a pyrromethene complex, a pyran derivative, or a styryl derivative.

A host suitable for the phosphorescence light emitting region is a compound having the function of causing a phosphorescence light emitting compound to emit light as a result of the occurrence of energy transfer from an excited state of the host to the phosphorescence light emitting compound. The host compound is not particularly limited as long as it is a compound that has a large triplet energy gap and can transfer exciton energy to the phosphorescence light emitting compound, and may be selected in accordance with the objective, as appropriate. Specific examples of such a host compound include a condensed ring compound containing a combination of a benzene ring, a naphthalene ring, and a heterocycle, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, heterocyclic tetracarboxylic anhydrides of naphthalene, perylene, and the like, various metal complex polysilane-based compounds typified by a metal complex of a phthalocyanine derivative or an 8-quinolinol derivative, a metal phthalocyanine, and a metal complex containing benzoxazole or benzothiazole as a ligand, electrically conductive macromolecular oligomers such as a poly(N-vinylcarbazole) derivative, an aniline-based copolymer, a thiophene oligomer, and polythiophene, macromolecular compounds such as a polythiophene derivative, a polyphenylene derivative, a polyphenylenevinylene derivative, and a polyfluorene derivative, and the like. A host compound may be used singly, or two or more host compounds may be used in combination. Specific examples include compounds such as the following.

[Chem. 19]

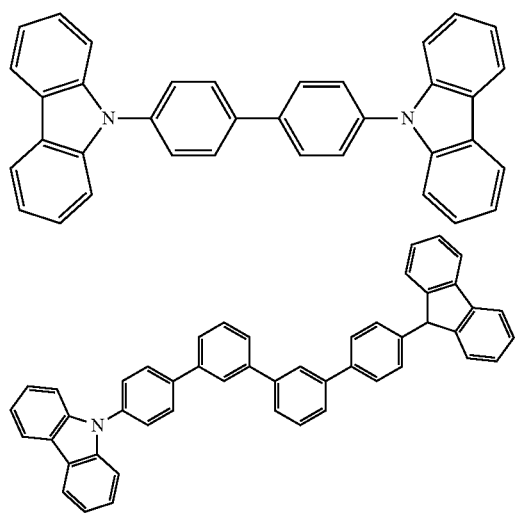

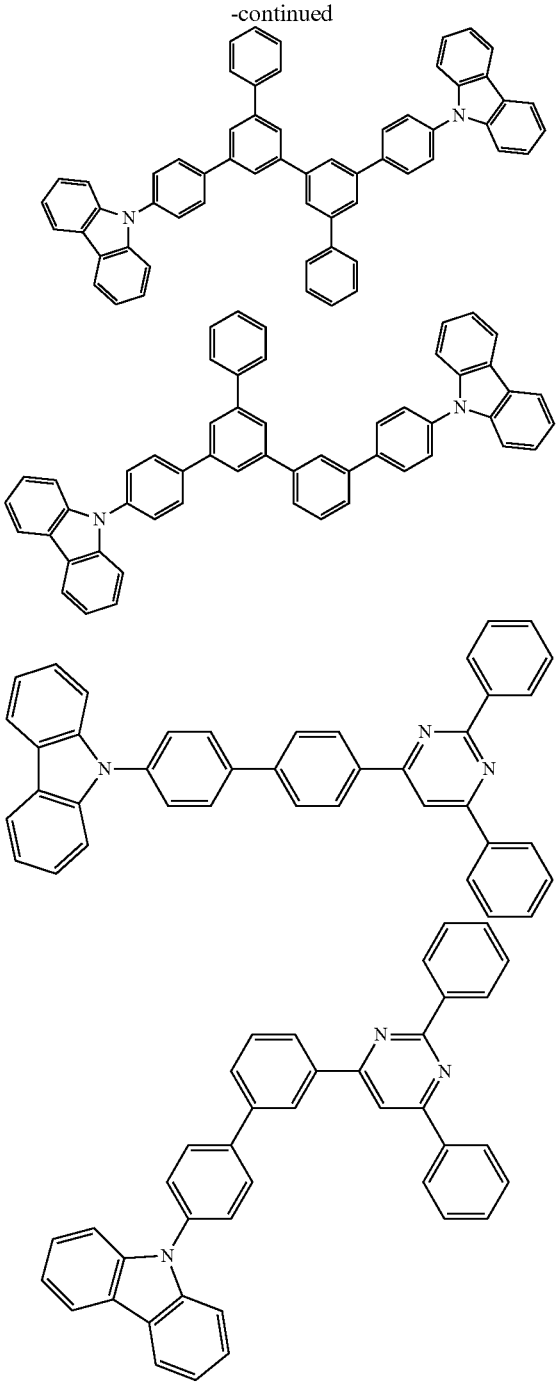

The phosphorescence light emitting compound (phosphorescence light emitting dopant) is a compound that can emit light from triplet excitons. The phosphorescence light emitting compound is not particularly limited as long as it emits light from triplet excitons; but is preferably a metal complex containing at least one metal selected from the group consisting of Ir, Ru, Pd, Pt, Os, and Re, and is more preferably a porphyrin metal complex or an ortho-metalated metal complex. A porphyrin platinum complex may be given as a porphyrin metal complex. A phosphorescence light emitting compound may be used singly, or two or more phosphorescence light emitting compounds may be used in combination.

As a ligand contained in an ortho-metalated metal complex, although there are various ligands, preferably a 2-phenylpyridine derivative, a 7,8-benzoquinoline derivative, a 2-(2-thienyl)pyridine derivative, a 2-(1-naphthyl)pyridine derivative, a 2-phenylquinoline derivative, and the like may be given. These derivatives may contain a substituent, as necessary. In particular, a ligand in which a fluoride or a trifluoromethyl group is introduced is preferable as a blue color-based dopant. Furthermore, a ligand other than the ligands mentioned above, such as an acetylacetonate or picric acid, may be contained as an auxiliary ligand. In addition, also a known phosphorescent dopant having a desired luminous color may be used. Specific examples include an amine having a stilbene structure, an aromatic amine, a perylene derivative, a coumarin derivative, a borane derivative, and a pyran derivative. Among these, a phosphorescent dopant material of an iridium complex, a platinum complex, or a rhenium complex is preferably used.

The content amount of the phosphorescence light emitting compound (phosphorescence light emitting dopant) in the light emitting region is not particularly limited, and may be selected in accordance with the objective, as appropriate; and is, for example, 0.1 mass % to 70 mass %, preferably 1 mass % to 30 mass %. By the content amount of the phosphorescence light emitting compound being more than or equal to 0.1 mass %, light emission becoming feeble is prevented, and the effect of containing the compound can be sufficiently exhibited. On the other hand, by setting the content amount to less than or equal to 70 mass %, a phenomenon called concentration quenching is suppressed, and a reduction in the performance of the light emitting element can be prevented.

The red light emitting region preferably contains the hole transporting material mentioned above. The green light emitting region may contain a fluorescence light emitting material or a phosphorescence light emitting material. In the blue light emitting region, blue light emission can be caused to occur by, for example, using the azine compound described above as a host material and doping the azine compound with a blue fluorescent dopant material. Note that it is preferable to use the azine derivative shown in Formula (3) above as a host material contained in the blue light emitting region and the green light emitting region.

As a blue color dopant material, a compound having a light emission peak in the range of approximately 400 nm to 490 nm may be given. As such a compound, organic substances such as a naphthalene derivative, an anthracene derivative, a naphthacene derivative, a styrylamine derivative, and a bis(azinyl)methene boron complex may be given. Among these, an aminonaphthalene derivative, an aminoanthracene derivative, an aminochrysene derivative, an aminopyrene derivative, a styrylamine derivative, and a bis(azinyl)methene boron complex are preferably used.

It is preferable that the organic layer have a configuration in which a first light emitting region, an intermediate region, a second light emitting region, and a third light emitting region are stacked in this order from the anode side; the first light emitting region contain at least the hole transporting material described above as a host material, and the second light emitting region and the third light emitting region contain the azine derivative described above as a host material.

Further, at least one light emitting region other than the light emitting region containing the azine derivative described above as a host material may contain at least a phosphorescence light emitting material as a host material. In this case, the phosphorescence light emitting material is preferably a carbazole derivative or a quinoline complex derivative. In particular, it is preferable that, in the organic layer, a first light emitting region, an intermediate region, and a second light emitting region be stacked in this order from the anode side; the first light emitting region contain at least a phosphorescence light emitting material as a host material, and the second light emitting region contain an azine derivative as a host material.

The layer (the hole supply layer etc.) included in the hole transport region functions as a buffer layer for enhancing the efficiency of injecting holes into the light emitting region and preventing leakage. The film thickness of the hole supply layer is, for example, 5 nm to 300 nm, preferably 10 nm to 200 nm, depending on the configuration of the entire light emitting element, particularly on the relationship with the electron supply layer.

The material contained in the hole supply layer may be selected in view of relationships with the materials contained in an electrode and an adjacent layer, as appropriate, and examples include benzine, styrylamine, triphenylamine, a porphyrin, triphenylene, an azatriphenylene, tetracyanoquinodimethane, a triazole, imidazole, an oxadiazole, a polyarylalkane, a phenylenediamine, an arylamine, oxazole, anthracene, fluorenone, a hydrazone, and a stilbene, derivatives of these, a polysilane-based compound, and heterocyclic conjugate-based monomers, oligomers, and polymers such as a vinylcarbazole-based compound, a thiophene-based compound, and an aniline-based compound.

In a case where the hole supply layer has a two-layer configuration, as the material contained in the first layer (the anode side) and the second layer (the light emitting region side), α-naphthylphenylphenylenediamine, a porphyrin, a metal tetraphenylporphyrin, a metal naphthalocyanine, hexacyanoazatriphenylene, 7,7,8,8-tetracyanoquinodimethane (TCNQ), F4-TCNQ, tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylenevinylene), poly(thiophenevinylene), poly(2,2'-thienylpyrrole), and the like may be given.

Further, by using the compounds shown in Formula (21), Formula (22), Formula (23), and Formula (24) below, hole supply from the hole supply layer to the light emitting region can be optimized for electron supply from the electron supply layer to the light emitting region.

[Chem. 20]

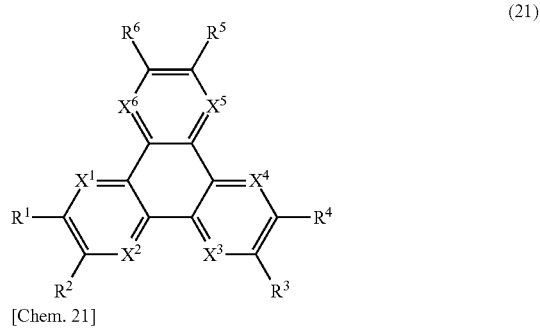

(21)

[Chem. 21]

(22)

-continued

[Chem. 22]

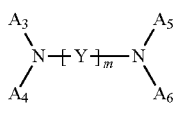
(23)

[Chem. 23]

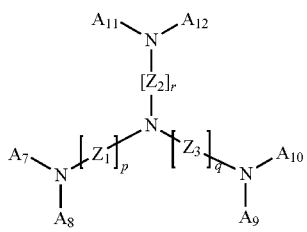
(24)

In Formula (21), $R^1$ to $R^6$ each independently represent a substituent selected from the group consisting of substituents selected from a hydrogen atom, a halogen atom, a hydroxyl group, an amino group, an arylamino group, a carbonyl group having less than or equal to 20 carbon atoms, a carbonyl ester group having less than or equal to 20 carbon atoms, an alkyl group having less than or equal to 20 carbon atoms, an alkenyl group having less than or equal to 20 carbon atoms, an alkoxyl group having less than or equal to 20 carbon atoms, an aryl group having less than or equal to 30 carbon atoms, a heterocyclic group having less than or equal to 30 carbon atoms, a nitrile group, a cyano group, a nitro group, and a silyl group, or a derivative thereof; adjacent ones of $R^1$ to $R^6$ may be bonded to each other to form a cyclic structure. Further, $X^1$ to $X^6$ each independently represent a carbon atom or a nitrogen atom. Note that the azatriphenylene derivative shown in Formula (21) above is suitably used for the hole supply layer because the content ratio of nitrogen in the compound is increased by X being substituted with a nitrogen atom. Specific examples of the azatriphenylene derivative shown in Formula (21) include the compound of Formula (21-1) below and the like.

[Chem. 24]

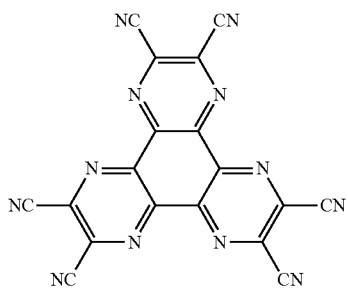
(21-1)

In Formula (22), $A_0$ to $A_2$ each independently represent an aromatic hydrocarbon group having 6 to 30 carbon atoms and substituted with a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group, or a silyl group. Specific examples of the amine derivative shown in Formula (22) include the compounds of Formula (22-1) to Formula (22-9) below and the like.

[Chem. 25]

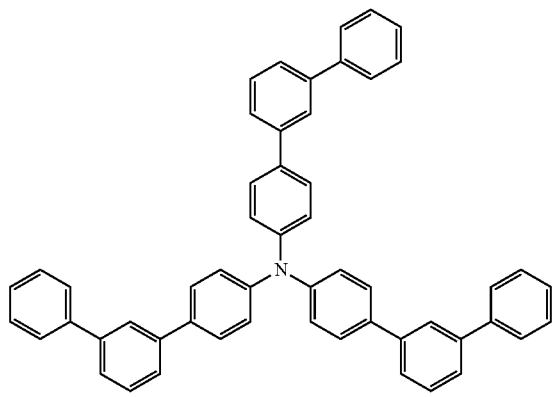
(22-1)

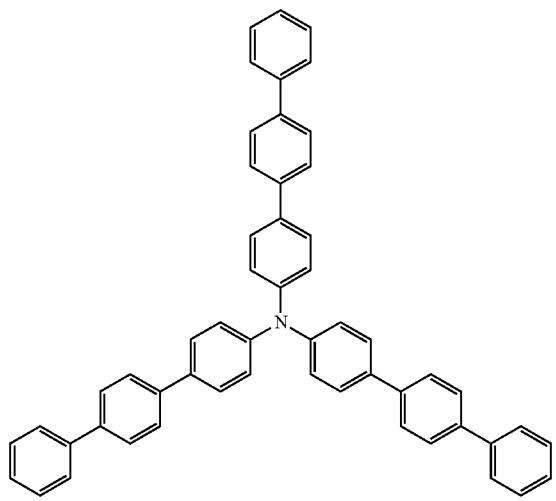
(22-2)

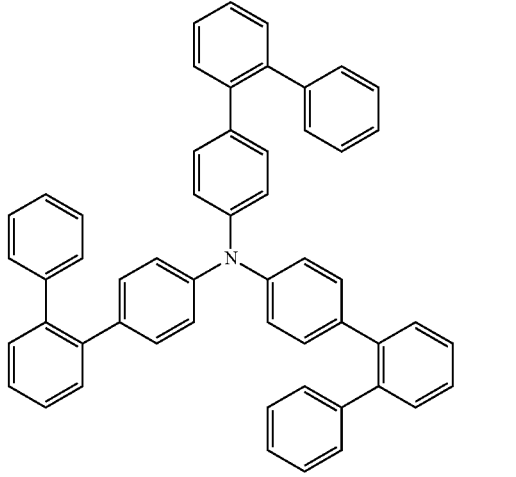
(22-3)

(22-4)

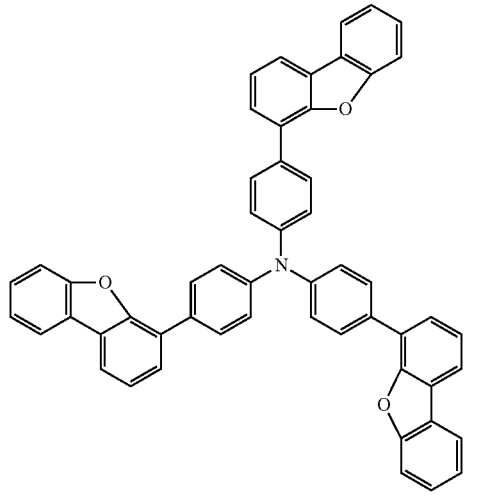

(22-7)

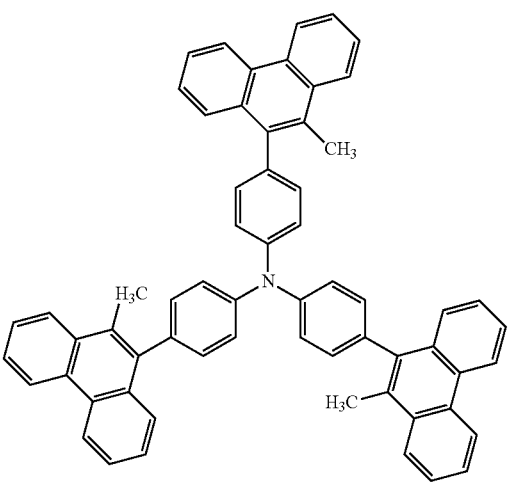

(22-5)

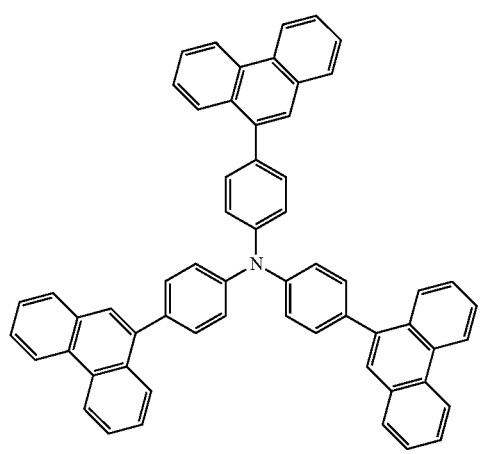

(22-8)

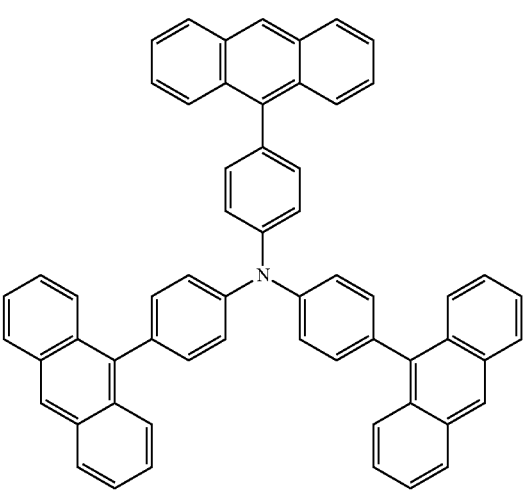

(22-6)

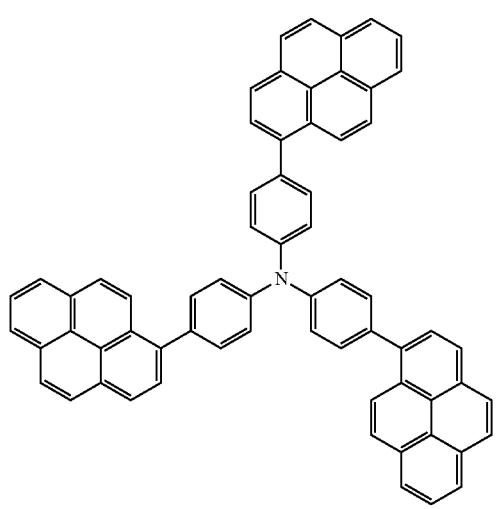

(22-9)

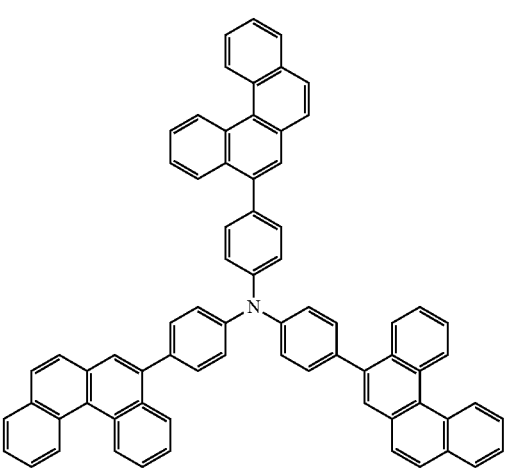

In Formula (23), $A_3$ to $A_6$ each independently represent an aromatic hydrocarbon group having 6 to 20 carbon atoms and substituted with a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group, or a silyl group. $A_3$ and $A_4$, and $A_5$ and $A_6$ may each be bonded together via a linking group. Y represents a divalent aromatic hydrocarbon group containing benzene, naphthalene, anthracene, phenanthrene, naphthacene, fluoranthene, or perylene in which the ring carbon atoms except the bonding part(s) with nitrogen (N) are each independently substituted with a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group, or a silyl group. m represents an integer of 1 or more. Specific examples of the diamine derivative shown in Formula (23) include the compounds of Formula (23-1) to Formula (23-84) below and the like.

[Chem. 26]

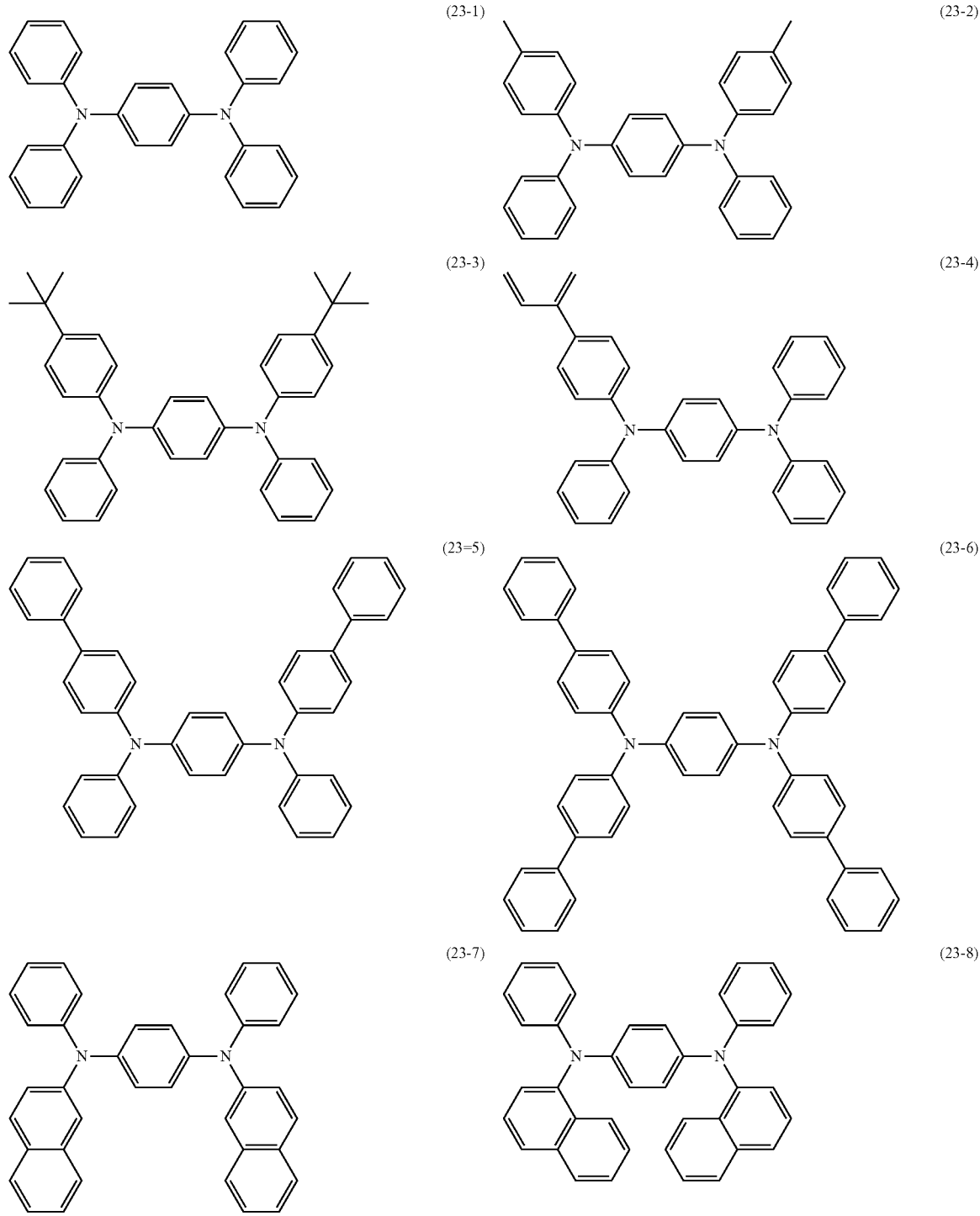

-continued
(23-9)
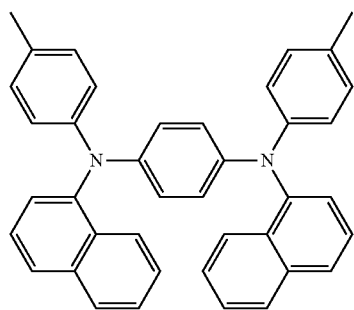
(23-10)
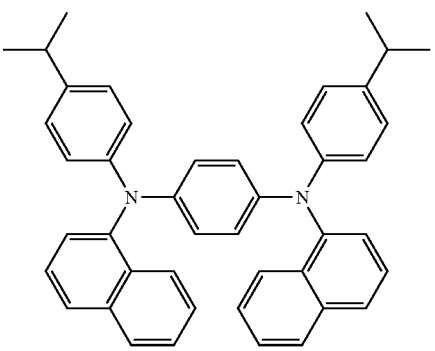
(23-11)
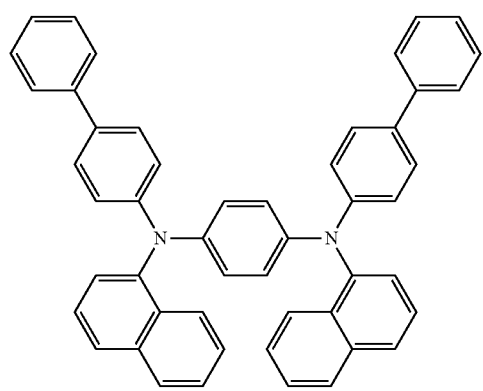
(23-12)
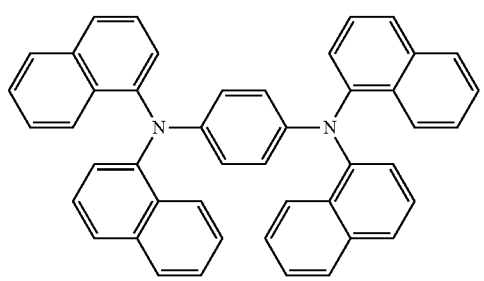
(23-13)
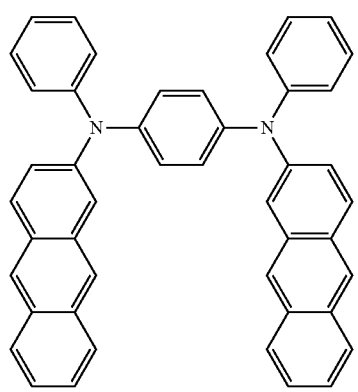
(23-14)
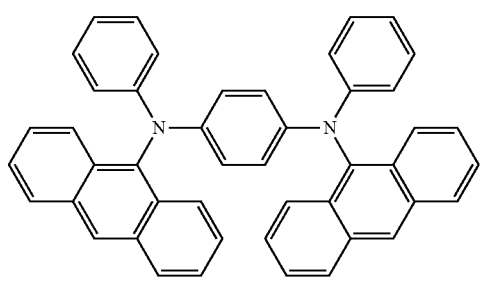
(23-15)
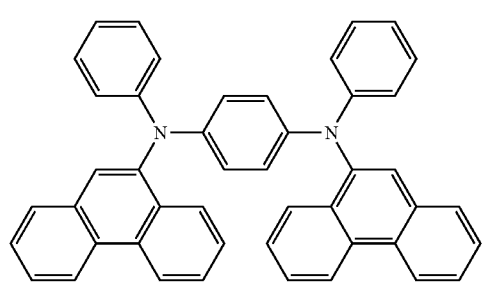
(23-16)
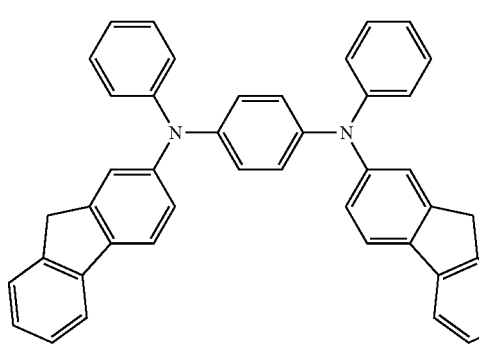

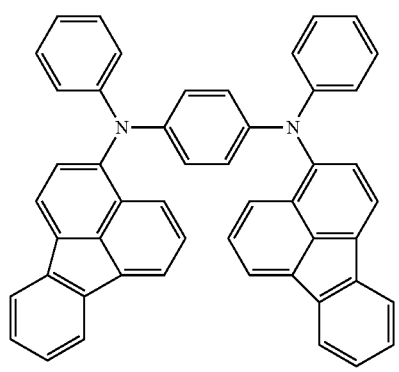
(23-17)
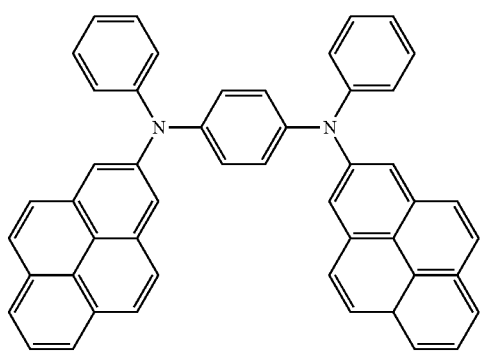
(23-18)
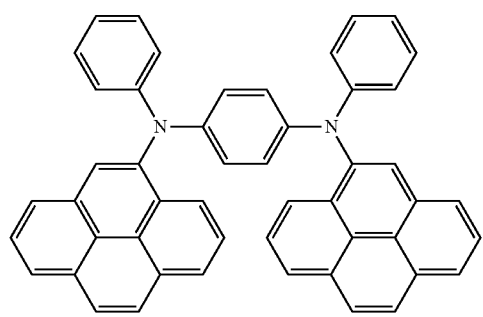
(23-19)
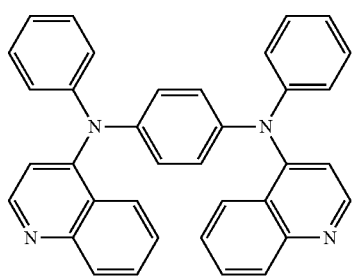
(23-20)
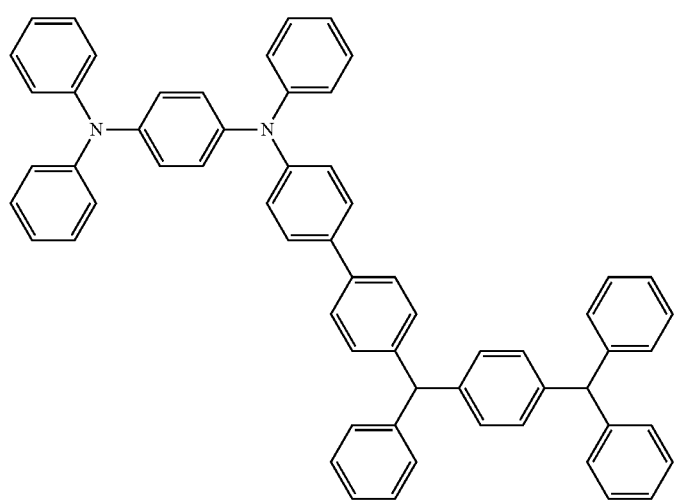
(23-21)

(23-22)
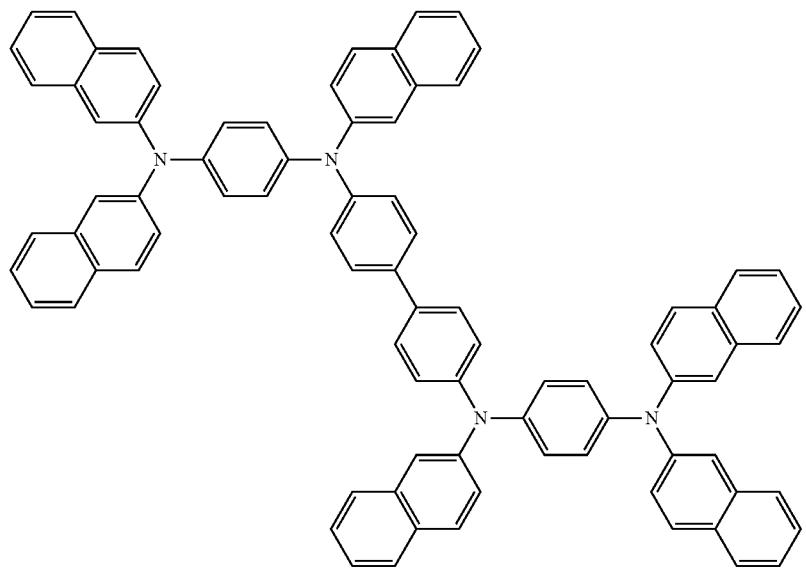
(23-23)
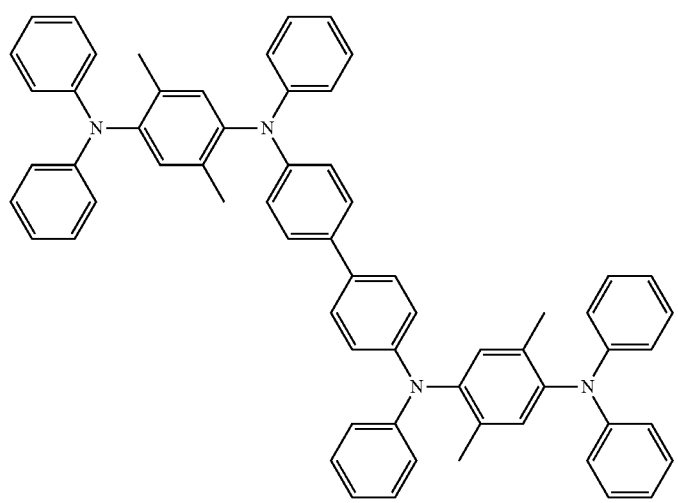
(23-24)
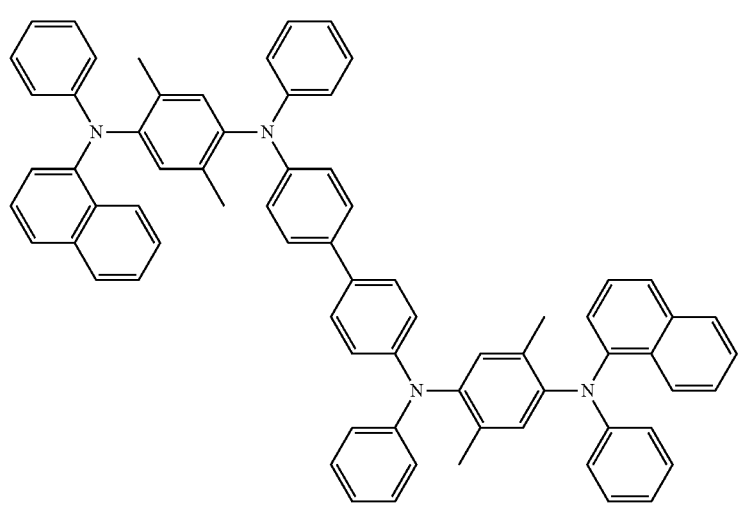

-continued
[Chem. 27]
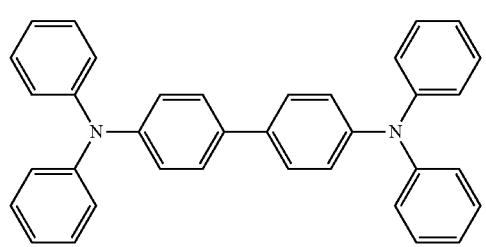
(23-25)
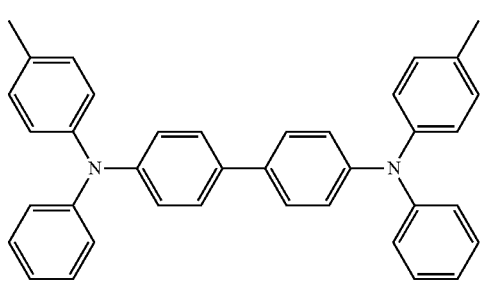
(23-26)
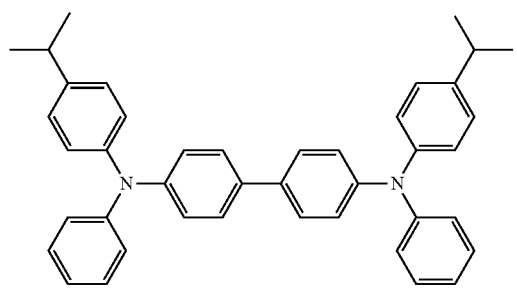
(23-27)
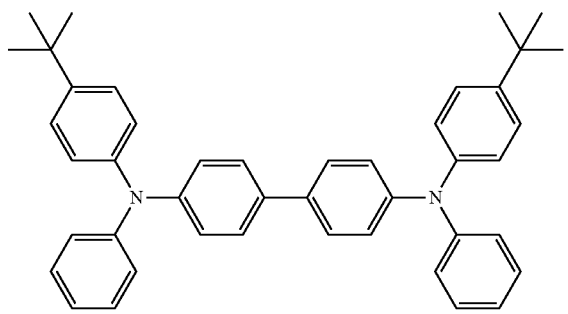
(23-28)
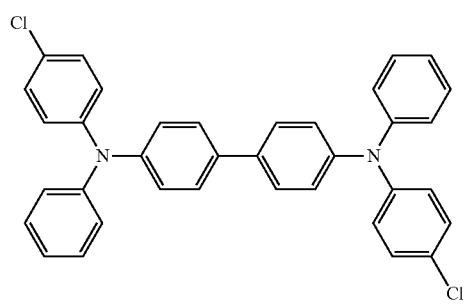
(23-29)
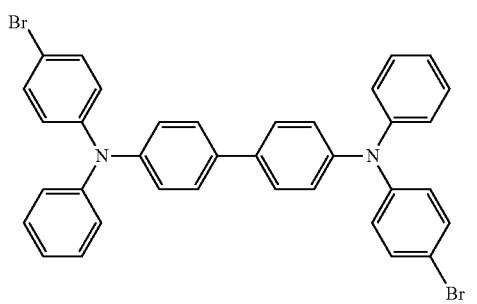
(23-30)
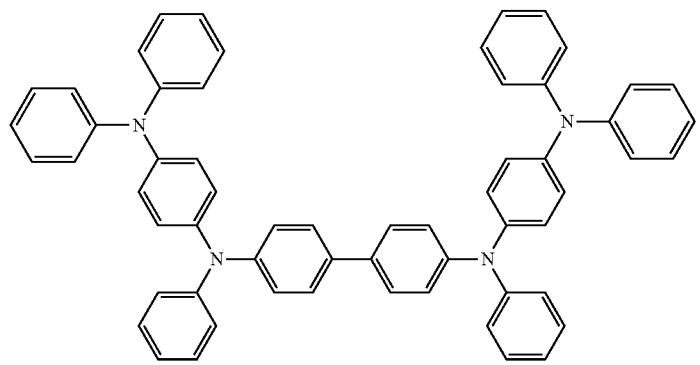
(23-31)

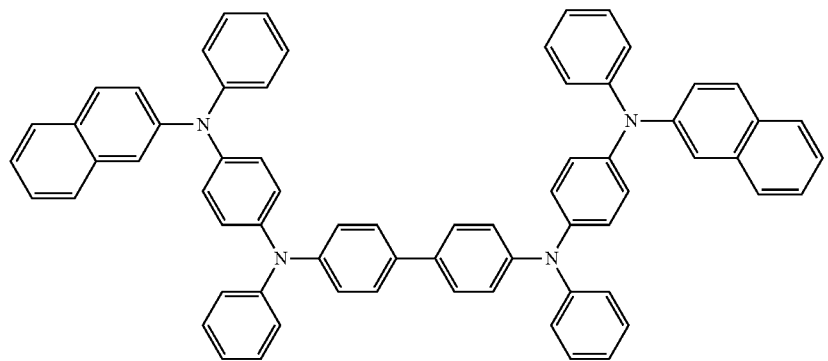
(23-32)
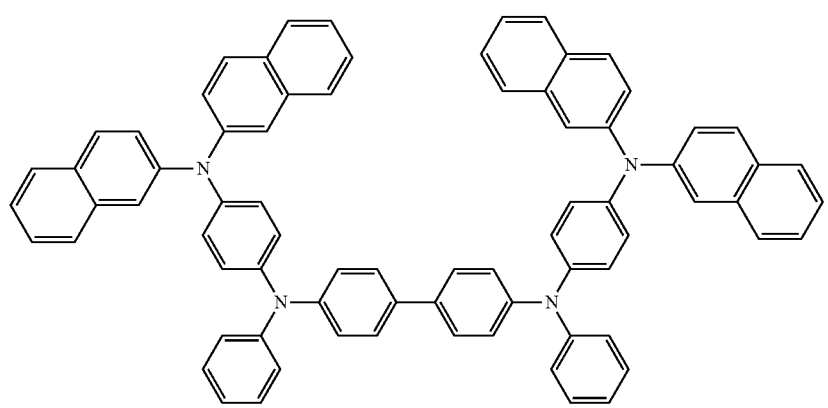
(23-33)
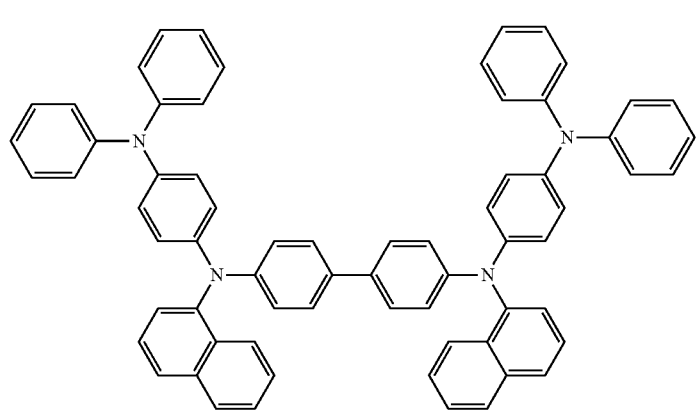
(23-34)
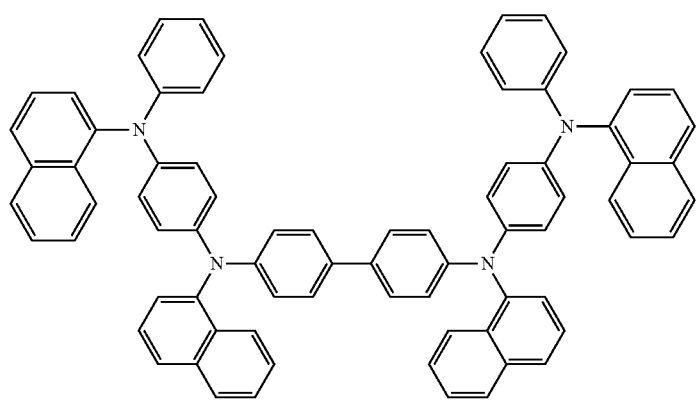
(23-35)

(23-36)
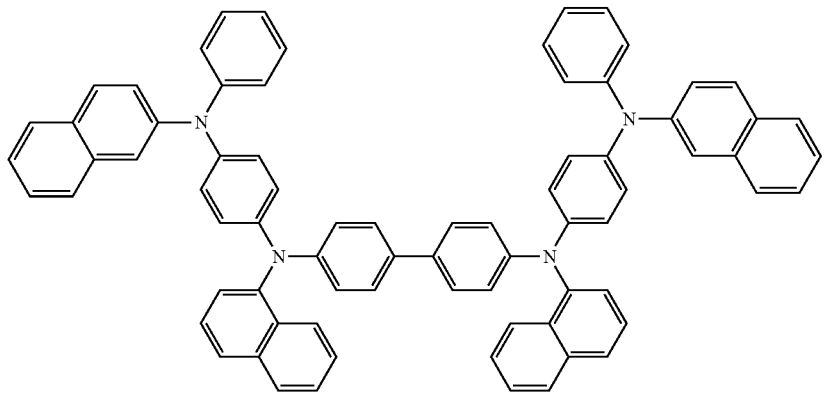
(23-37)
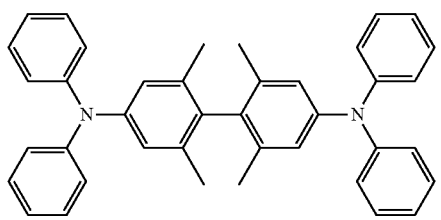
(23-38)
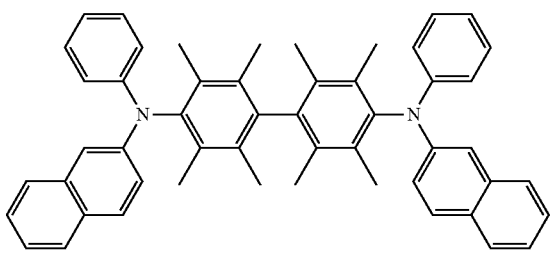
(23-39)
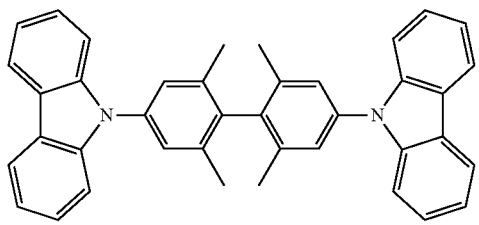
(23-40)
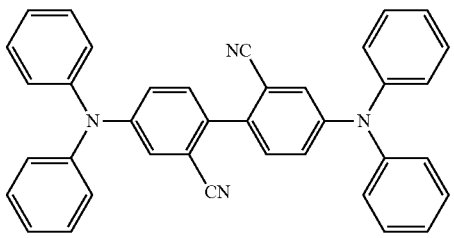
(23-41)
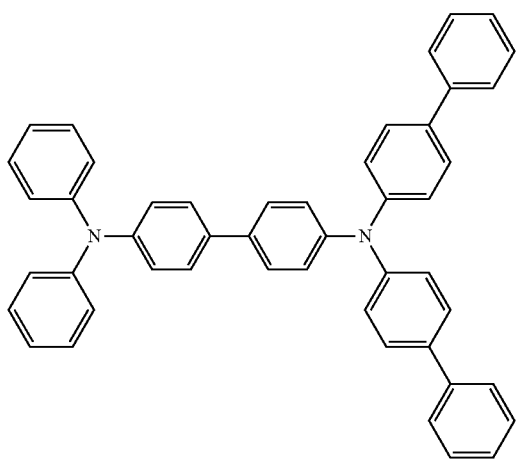
(23-42)
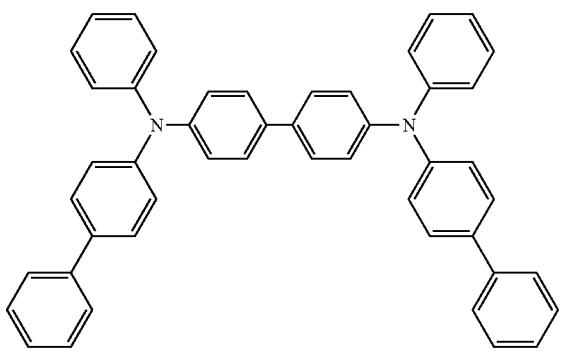

-continued
(23-43)
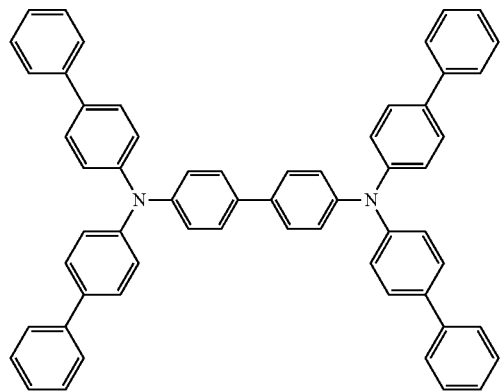
(23-44)
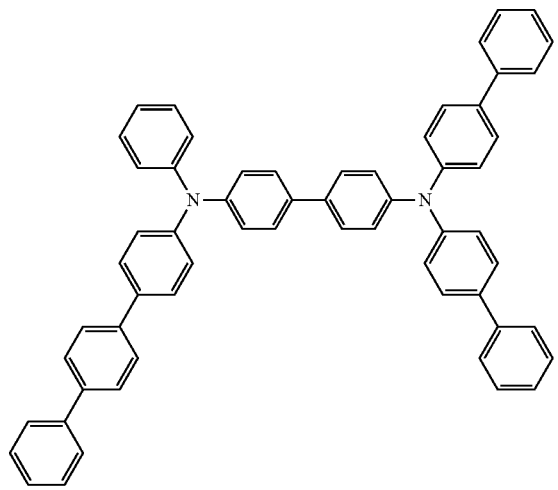
(23-45)
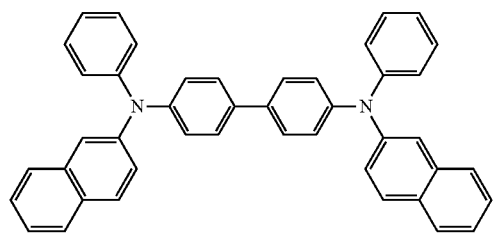
(23-46)
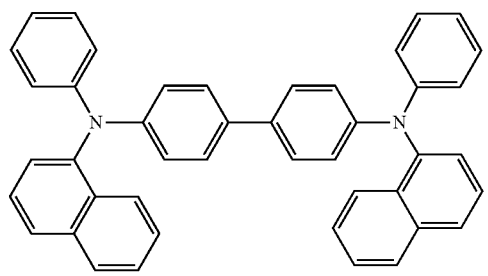
(23-47)
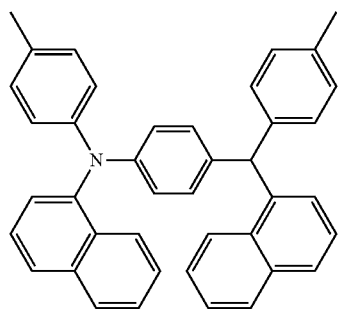
(23-48)
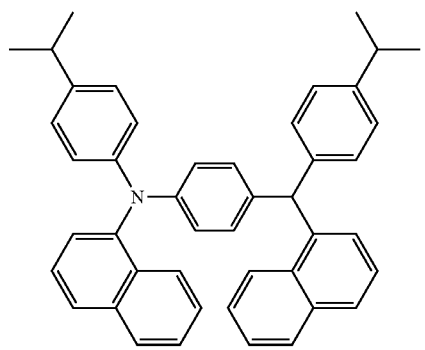
(23-49)
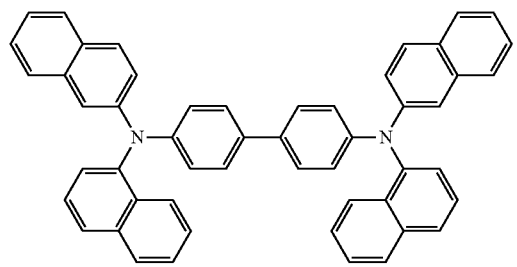
(23-50)
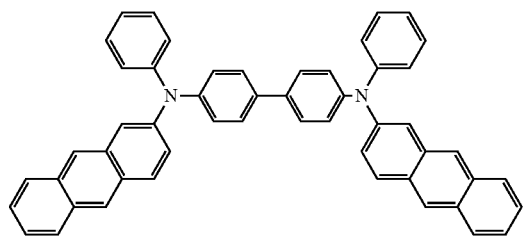

-continued
(23-51)
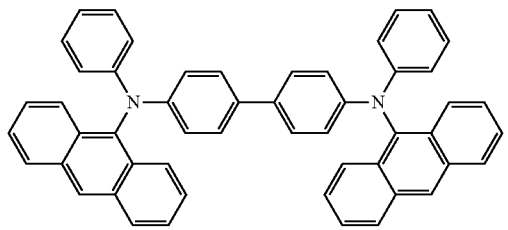
(23-52)
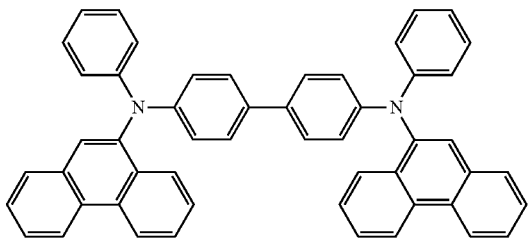
[Chem. 28]
(23-53)
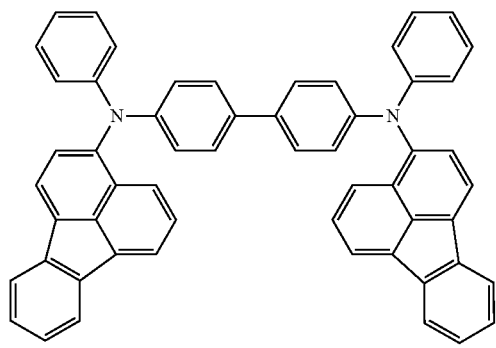
(23-54)
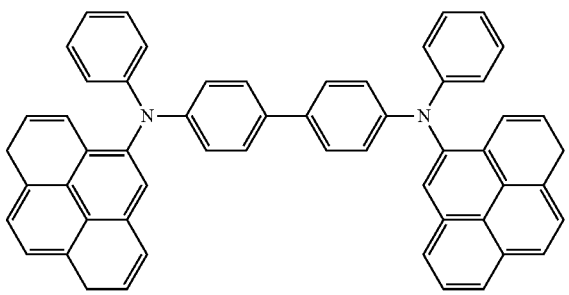
(23-55)
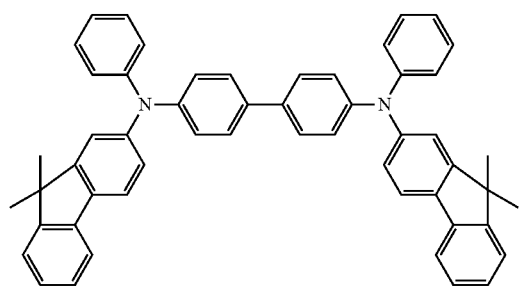
(23-56)
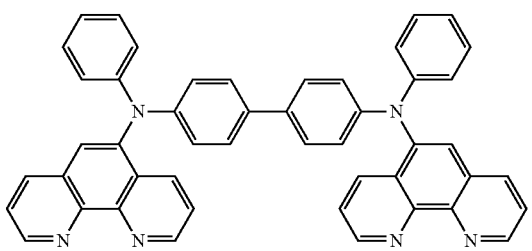
(23-57)
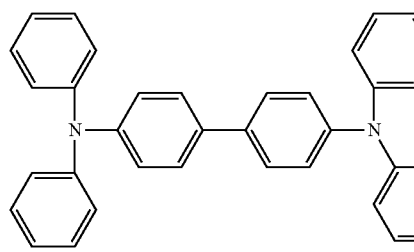
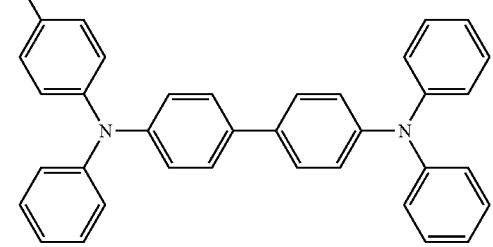

(23-58)
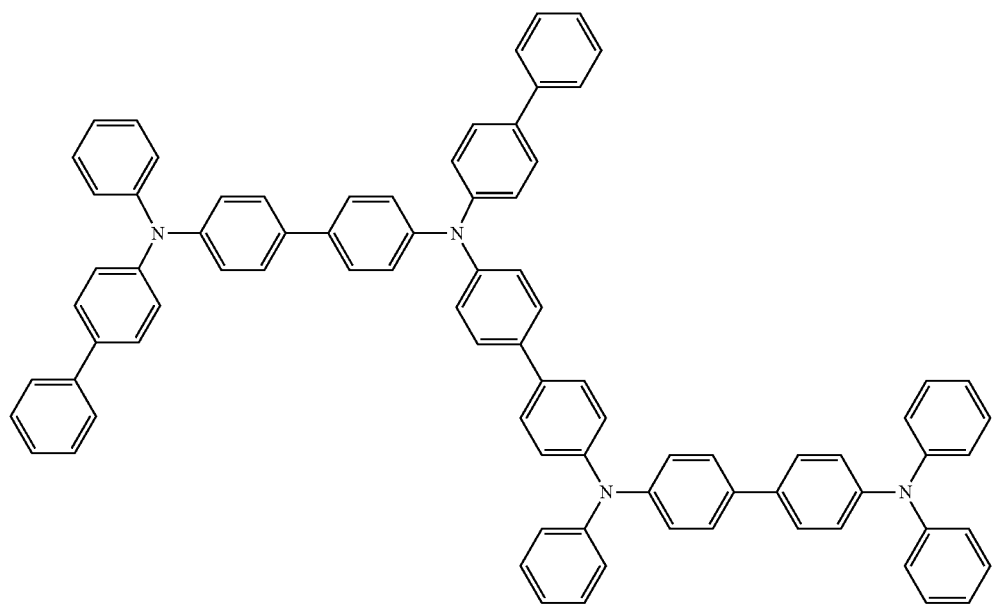
(23-59)
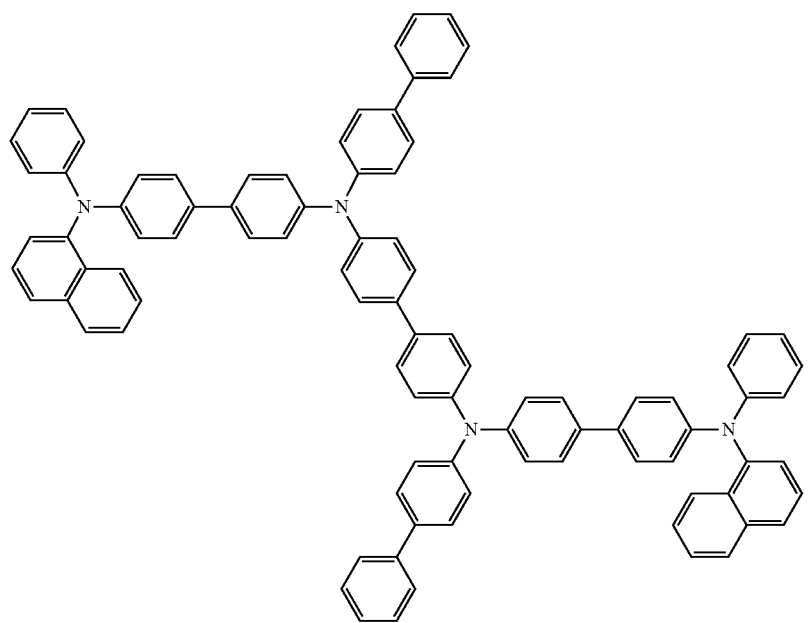

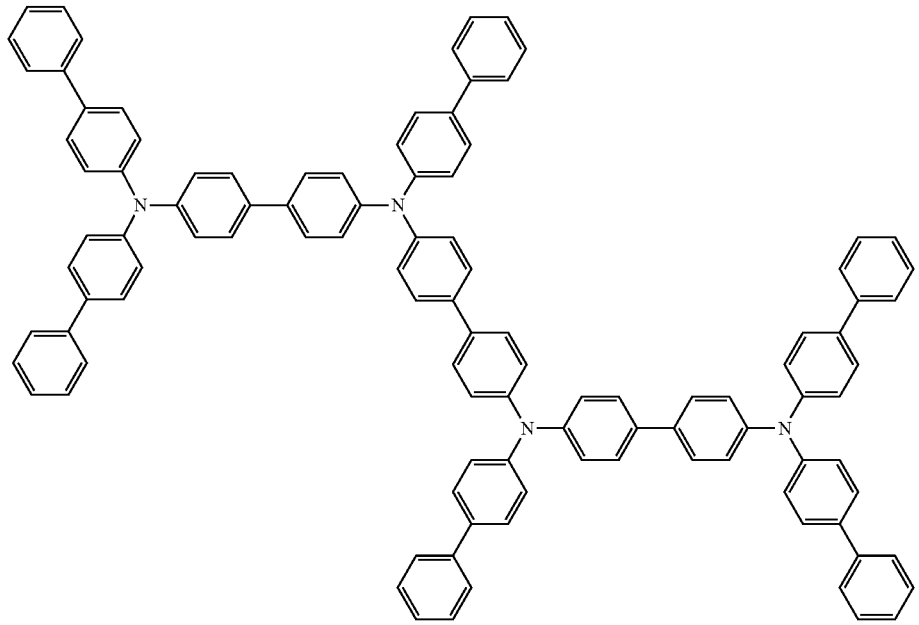
(23-60)
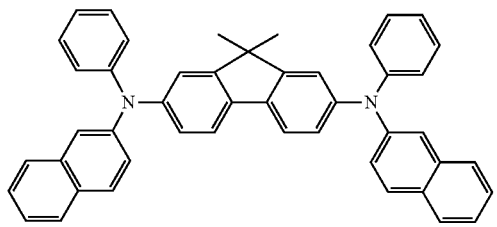
(23-61)
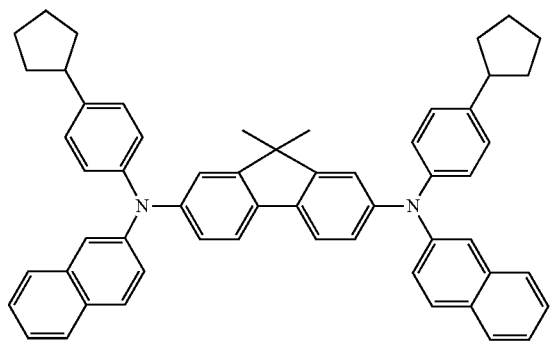
(23-62)
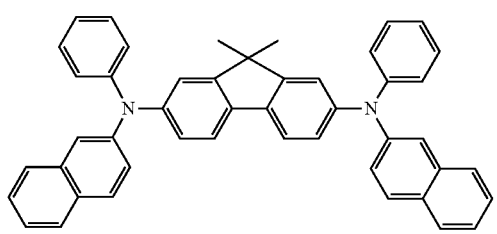
(23-63)
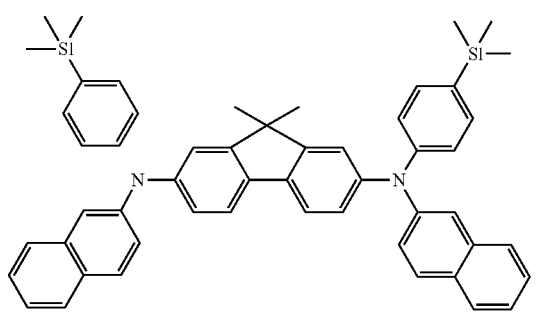
(23-64)
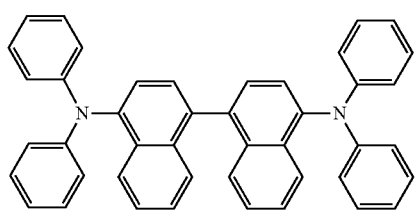
(23-65)
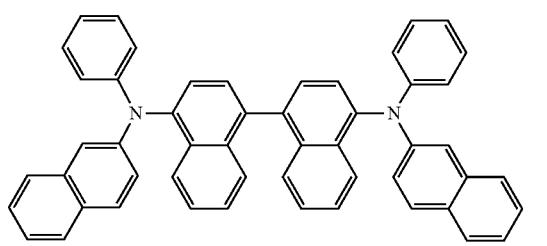
(23-65)

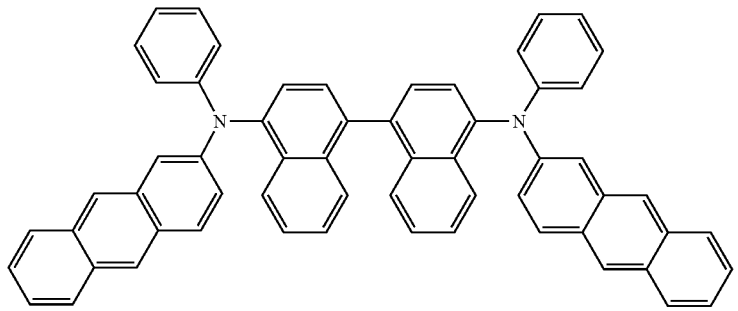
(23-67)
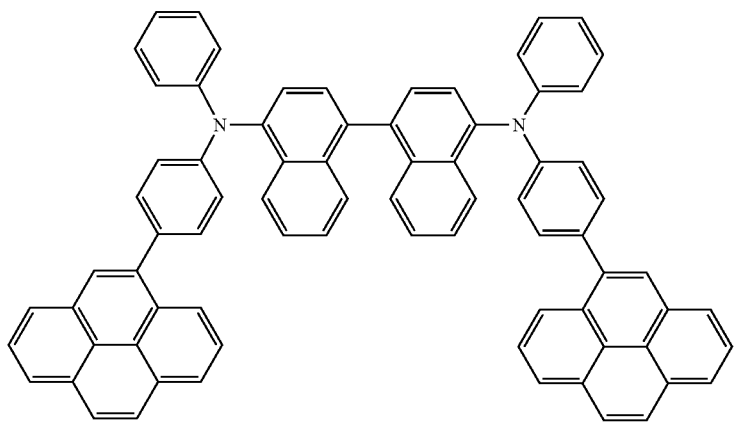
(23-68)
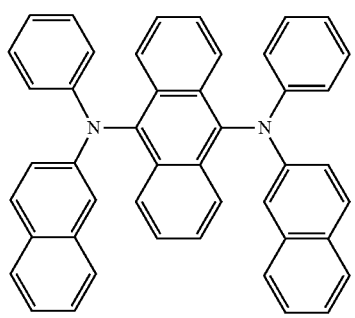
(23-69)
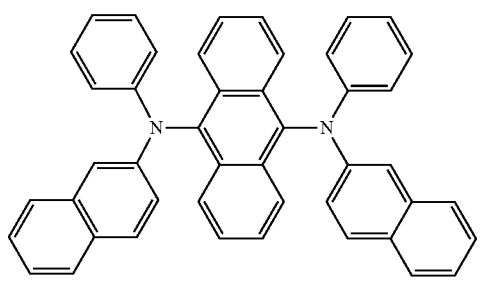
(23-70)
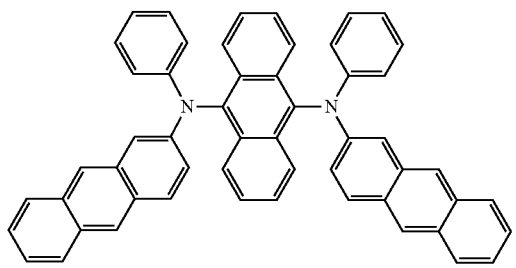
(23-71)

-continued
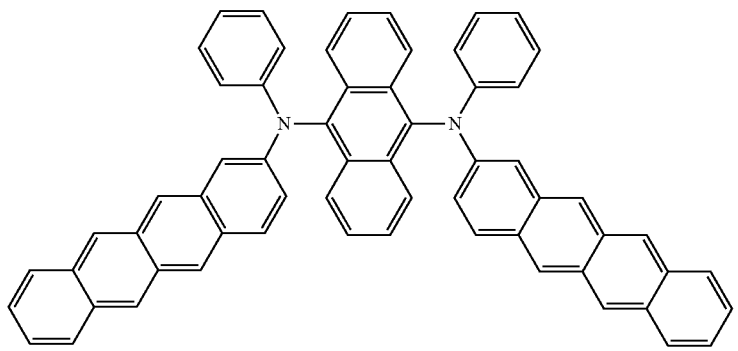
(23-72)
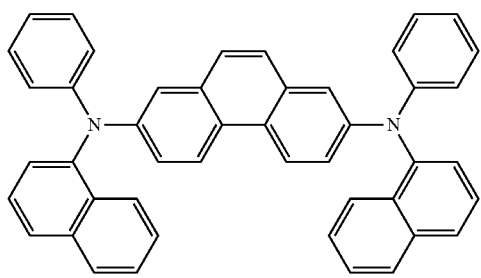
(23-73)
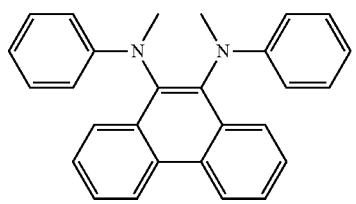
(23-74)
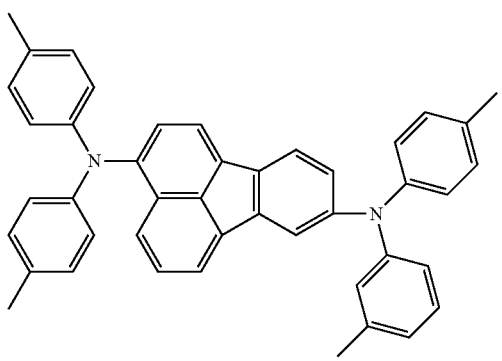
(23-75)
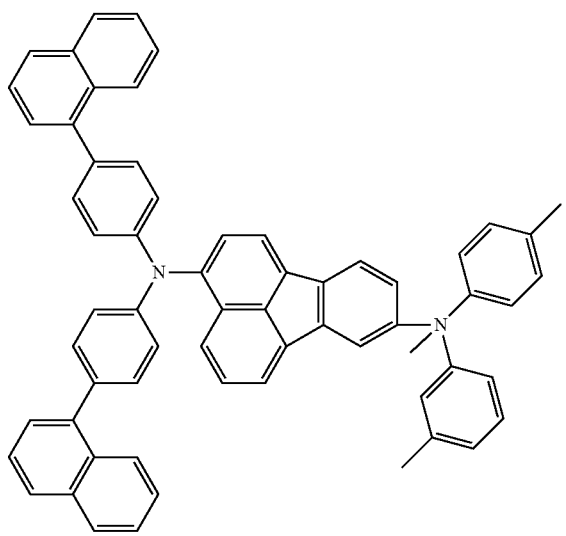
(23-76)
[Chem. 29]
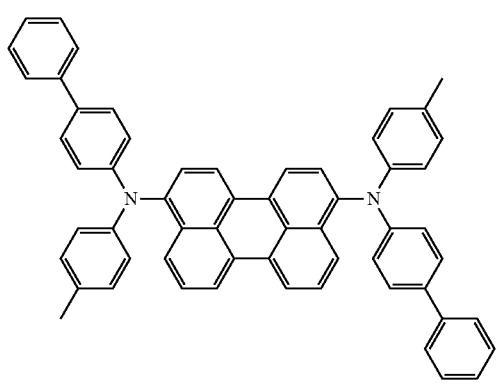
(23-77)

-continued
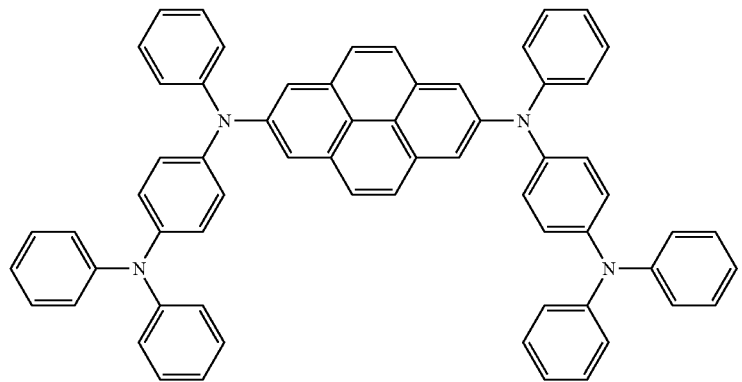
(23-78)
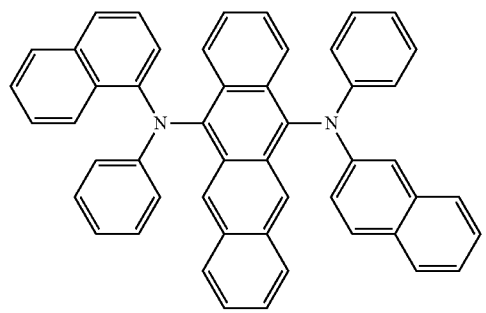
(23-79)
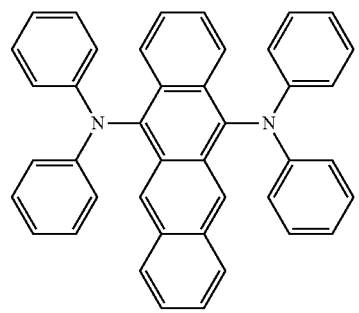
(23-80)
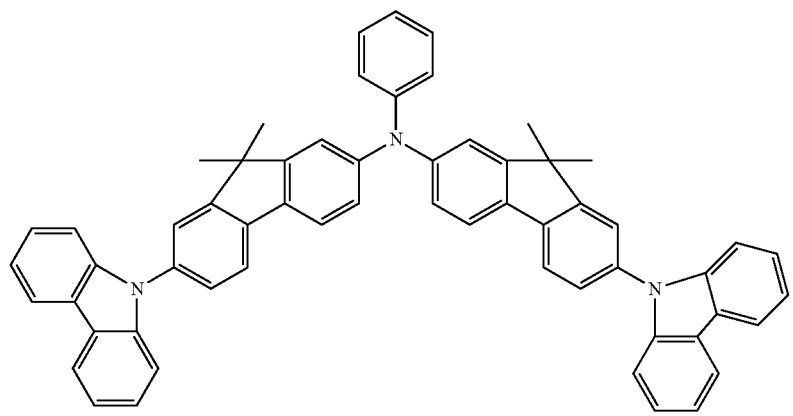
(23-81)

(23-82)

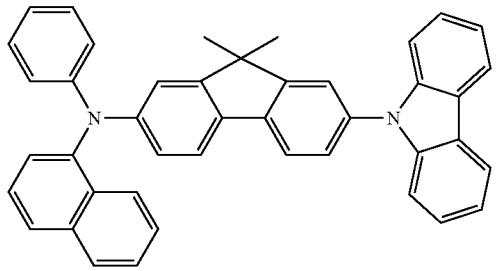

(23-83)

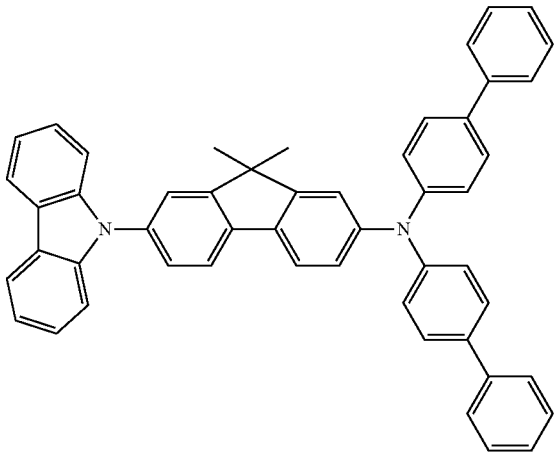

(23-84)

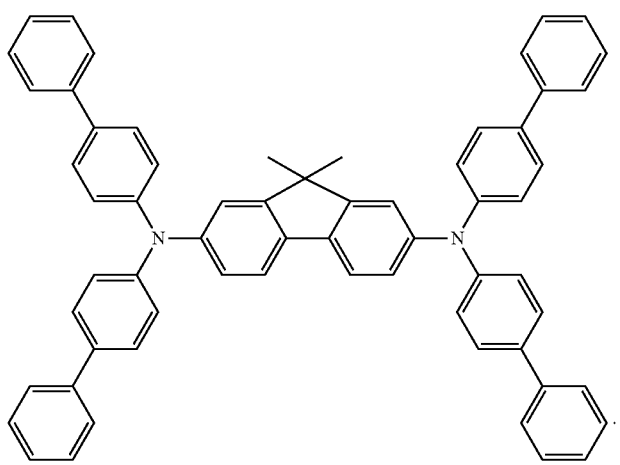

In Formula (24), $A_7$ to $A_{12}$ each independently represent an aromatic hydrocarbon group having 6 to 20 carbon atoms and substituted with a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group, or a silyl group. Adjacent $A_7$ and $A_9$, $A_9$ and $A_{10}$, and $A_{11}$ and $A_{12}$ may each be bonded together via a linking group. $Z_1$ to $Z_3$ each represent a divalent aromatic hydrocarbon group containing benzene, naphthalene, anthracene, phenanthrene, naphthacene, fluoranthene, or perylene in which the ring carbon atoms except the bonding part(s) with nitrogen (N) are each independently substituted with a hydrogen atom, a halogen atom, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group, or a silyl group. p, q, and r each represent an integer of 1 or more. Specific examples of the triarylamine multimer shown in Formula (24) include the compounds of Formula (24-1) to Formula (24-15) below and the like.

[Chem. 30]

(24-1)

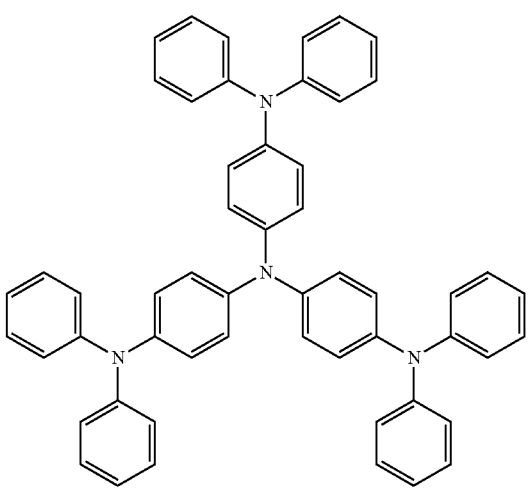

(24-2)
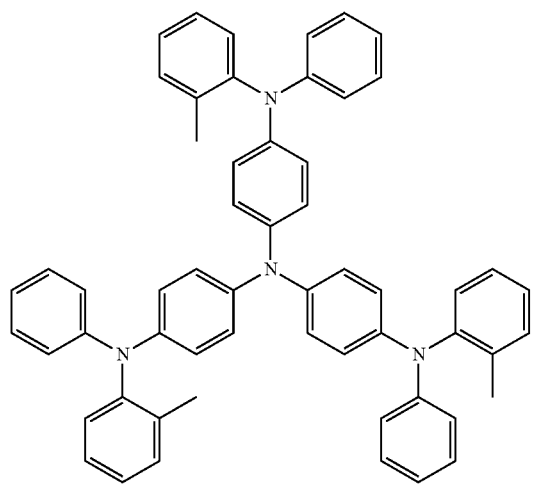
(24-3)
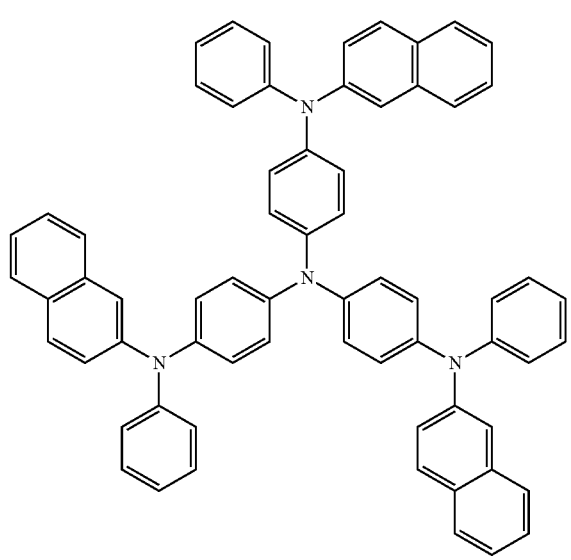
(24-4)
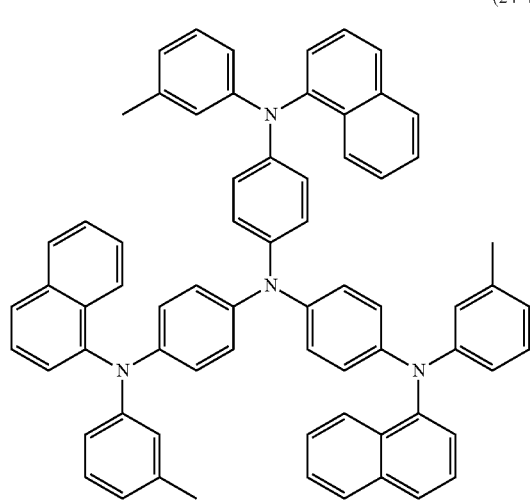
(24-5)
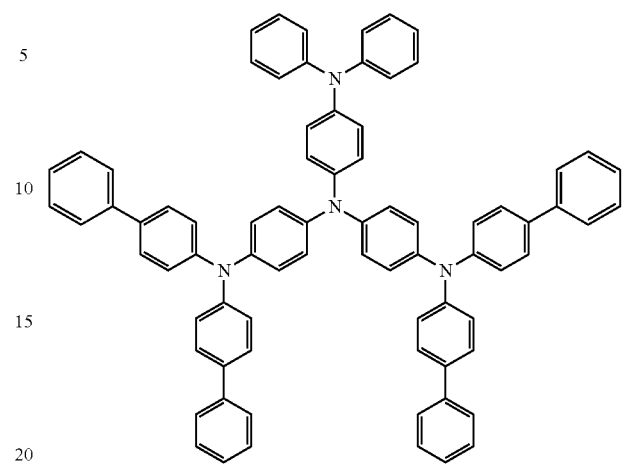
(24-6)
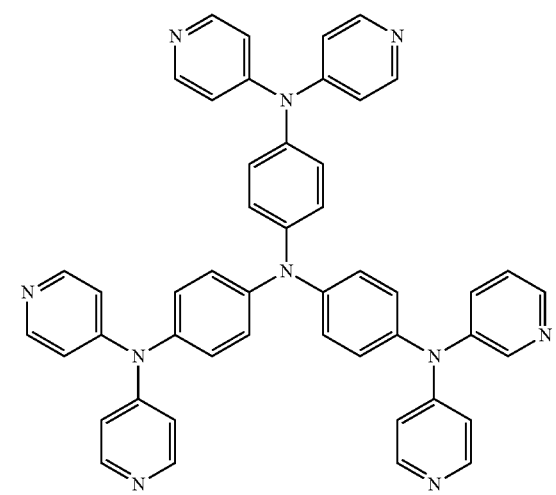
(24-7)
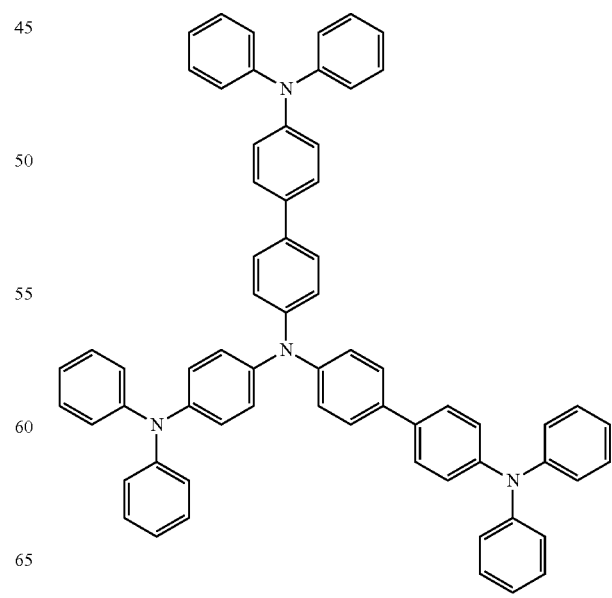

(24-8)
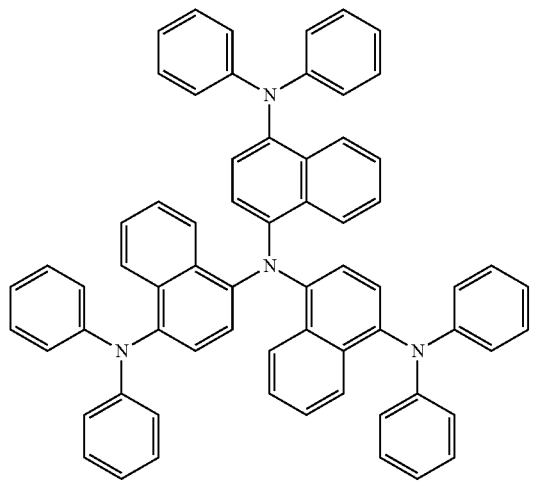
(24-9)
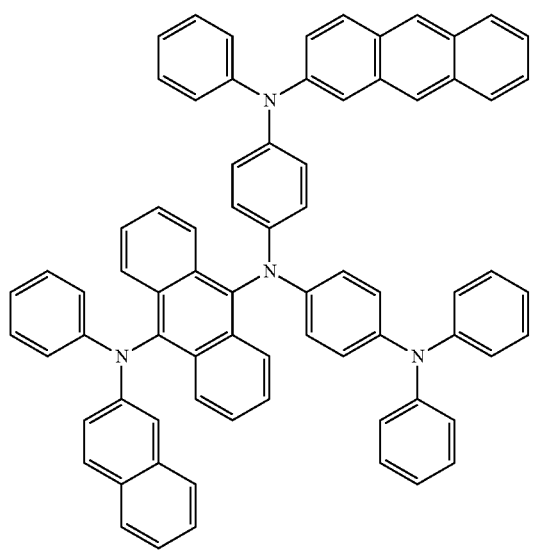
(24-10)
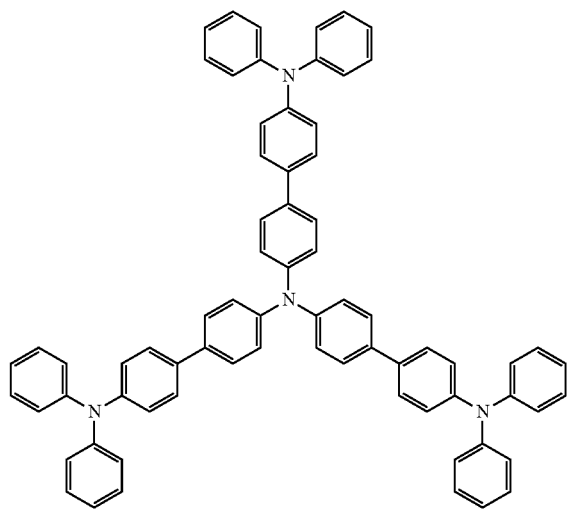
(24-11)
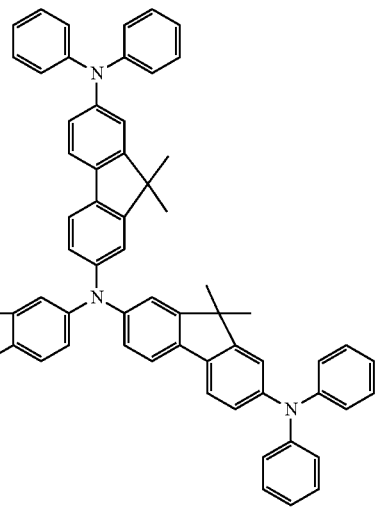
(24-12)
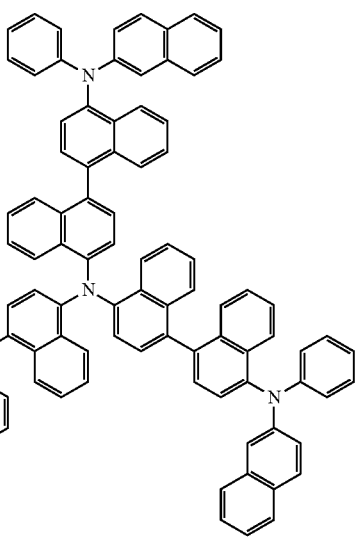
(24-13)
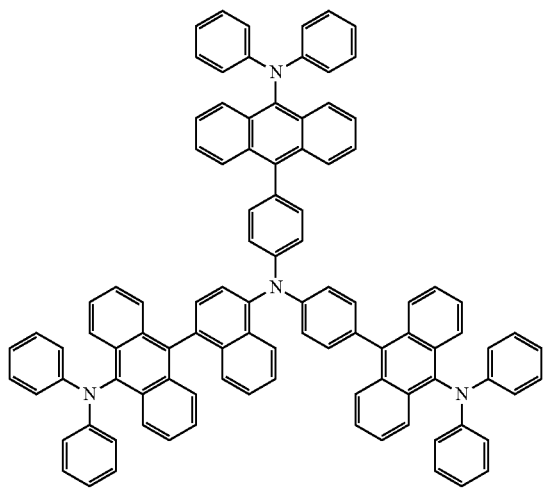

-continued (24-14)

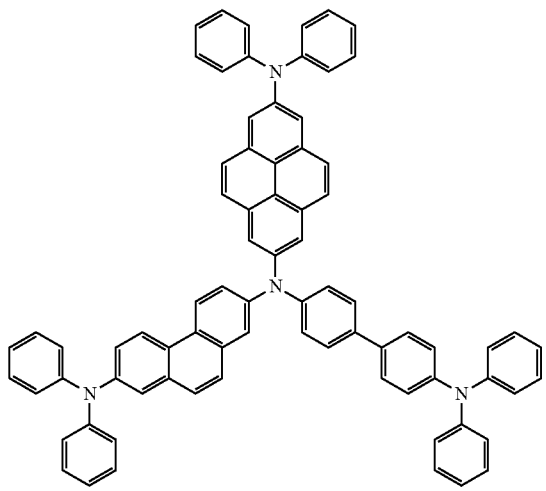

(24-15)

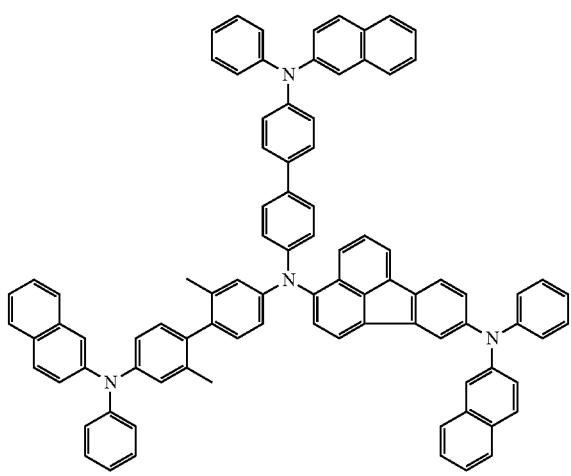

The various compounds described hereinabove may be used for either of the first layer and the second layer of the hole supply layer, but it is preferable that a compound with a composition of a high nitrogen content ratio be used for the first layer.

As layers included in the electron transport region, an electron injection layer and an electron transport layer (hereinafter, occasionally referred to as an electron injection layer-transport layer) may be given. The electron injection layer-transport layer is a layer that helps the injection of electrons into the light emitting region and transports electrons up to the light emitting region, and has a large electron mobility. As the thickness of the electron injection layer-transport layer, several nanometers to several micrometers may be given; in particular, when the film thickness is thick, it is preferable that, in order to avoid a voltage rise, the electron mobility be at least more than or equal to $10^{-5}$ cm$^2$/V·s when an electric field of $10^4$ V/cm to $10^6$ V/cm is applied.

As the material used for the electron injection layer-transport layer, a metal complex of 8-hydroxyquinoline or a derivative thereof and a nitrogen-containing heterocycle derivative are suitable. Specific examples of the metal complex of 8-hydroxyquinoline or the derivative thereof include a metal chelate oxinoid compound containing a chelate of oxine (commonly, 8-quinolinol or 8-hydroxyquinoline), such as tris(8-quinolinol)aluminum. Examples of the nitrogen-containing heterocycle derivative include oxazole, thiazole, an oxadiazole, a thiadiazole, a triazole, pyridine, pyrimidine, a triazine, phenanthroline, benzimidazole, an imidazopyridine, and the like; among these, a benzimidazole derivative, a phenanthroline derivative, and an imidazopyridine derivative are preferable.

The electron supply layer is a layer for transporting electrons injected from the cathode to the light emitting region, and the film thickness of the electron supply layer is, depending on the general configuration of the light emitting element, 10 nm to 200 nm, preferably 20 nm to 180 nm, for example. As the material of the electron transport layer, an organic material having an excellent electron transport capacity is preferably used. By enhancing the efficiency of transporting electrons to the light emitting region, particularly to the red light emitting region and the green light emitting region, the change in luminous color in the red light emitting region and the green light emitting region due to the electric field strength is suppressed. As such an organic material, specifically, a nitrogen-containing heterocycle derivative with an electron mobility of more than or equal to $10^{-6}$ cm$^2$/V·s and less than or equal to $1.0 \times 10^{-1}$ cm$^2$/V·s may be given.

As a specific material, the benzimidazole derivatives represented by Formula (9) below may be given, but the material is not limited to these.

[Chem. 31]

(9)

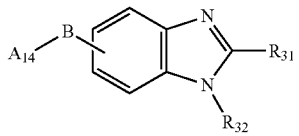

In Formula (9), $A_{14}$ represents a hydrogen atom, a halogen atom, an alkyl group having 1 to 20 carbon atoms or a derivative thereof, or a hydrocarbon group having 6 to 60 carbon atoms or a nitrogen-containing heterocycle group having a polycyclic aromatic hydrocarbon group in which 3 to 40 aromatic rings are condensed or a derivative thereof. B represents a single bond, or a divalent aromatic ring group or a derivative thereof. $R_{31}$ and $R_{32}$ each independently represent a hydrogen atom, a halogen atom, an alkyl group having 1 to 20 carbon atoms or a derivative thereof, an aromatic hydrocarbon group having 6 to 60 carbon atoms or a derivative thereof, a nitrogen-containing heterocycle group or a derivative thereof, or an alkoxy group having 1 to 20 carbon atoms or a derivative thereof.

Specific examples of the compound shown in Formula (9) include the compounds of Formula (9-1) to Formula (9-49) below and the like. Note that "Ar(α)" corresponds to the benzimidazole skeleton including $R_{31}$ and $R_{32}$ in Formula (9), and "B" corresponds to B in Formula (9). Further, "Ar(1)" and "Ar(2)" correspond to $A_{14}$ in Formula (9), and Ar(1) and Ar(2) are bonded to B in this order.

TABLE 1

(Table 2)

| | Ar (α) | B | Ar (1) | Ar (2) |
|---|---|---|---|---|
| (9-1) | | | | |
| (9-2) | | | | |
| (9-3) | | | | |
| (9-4) | | | | |
| (9-5) | | | | |
| (9-6) | | | | |

TABLE 1-continued (Table 2)

| Ar (α) | B | Ar (1) | Ar (2) |
|---|---|---|---|
| (9-7) | | | |
| (9-8) | | | |

TABLE 2

(Table 3)

| Ar (α) | B | Ar (1) | Ar (2) |
|---|---|---|---|
| (9-9) | | | |
| (9-10) | | | |
| (9-11) | | | |

TABLE 2-continued (Table 3)

| Ar (α) | B | Ar (1) | Ar (2) |
|---|---|---|---|
| (9-12) | | | |
| (9-13) | | | |
| (9-14) | | | |
| (9-15) | | | |
| (9-16) | | | |
| (9-17) | | | |

TABLE 3

(Table 4)

| | Ar (α) | B | Ar (1) | Ar (2) |
|---|---|---|---|---|
| (9-18) | 6-methyl-1,2-diphenyl-benzimidazole | / | 9,10-dimethylanthracene | 2-methylnaphthalene |
| (9-19) | 5-methyl-1,2-diphenyl-benzimidazole | / | 9,10-dimethylanthracene | 2-methylnaphthalene |
| (9-20) | 4-methyl-1,2-diphenyl-benzimidazole | / | 9,10-dimethylanthracene | 2-methylnaphthalene |
| (9-21) | 7-methyl-1,2-diphenyl-benzimidazole | / | 9,10-dimethylanthracene | 2-methylnaphthalene |
| (9-22) | 2,6-dimethyl-1-phenyl-benzimidazole | / | 9,10-dimethylanthracene | 2-methylnaphthalene |
| (9-23) | 1,6-dimethyl-2-phenyl-benzimidazole | / | 9,10-dimethylanthracene | 2-methylnaphthalene |

TABLE 3-continued (Table 4)

| | Ar (α) | B | Ar (1) | Ar (2) |
|---|---|---|---|---|
| (9-24) | [5-methyl-1-phenyl-2-methylbenzimidazole] | / | [9,10-dimethylanthracene] | [2-methylnaphthalene] |
| (9-25) | [6-methyl-1-methyl-2-phenylbenzimidazole] | / | [9,10-dimethylanthracene] | [2-methylnaphthalene] |
| (9-26) | [5-methyl-1-methyl-2-phenylbenzimidazole] | / | [9,10-dimethylanthracene] | [2-methylnaphthalene] |

TABLE 4

(Table 5)

| | Ar (α) | B | Ar (1) | Ar (2) |
|---|---|---|---|---|
| (9-27) | [6-methyl-1-phenyl-2-(2-pyridyl)benzimidazole] | | [5,6,11,12-tetramethyltetracene] | [2-methylnaphthalene] |
| (9-28) | [5-methyl-1-phenyl-2-(2-pyridyl)benzimidazole] | | [5,6,11,12-tetramethyltetracene] | [2-methylnaphthalene] |

TABLE 4-continued
(Table 5)
| | Ar (α) | B | Ar (1) | Ar (2) |
|---|---|---|---|---|
| (9-29) | 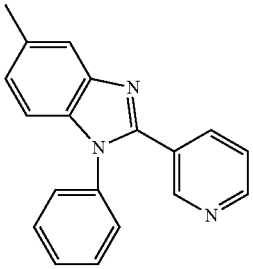 | | 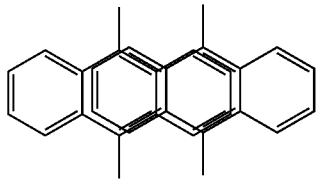 | 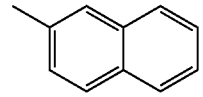 |
| (9-30) | 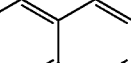 | | 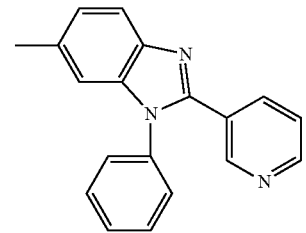 [SMILES: Cc1ccc2nc(-c3cccnc3)n(-c3ccccc3)c2c1] | 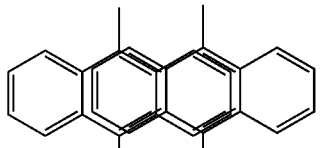 |
| (9-31) | 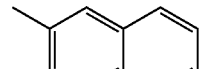 | | 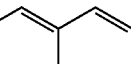 | 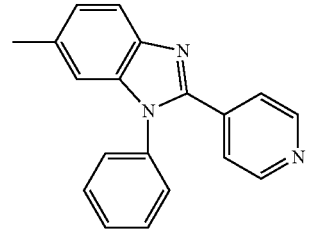 [SMILES: Cc1ccc2nc(-c3ccncc3)n(-c3ccccc3)c2c1] |
| (9-32) | 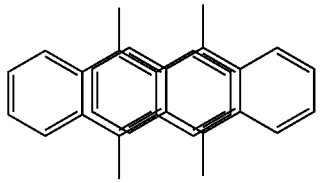 | | 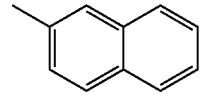 | 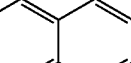 |
| (9-33) | 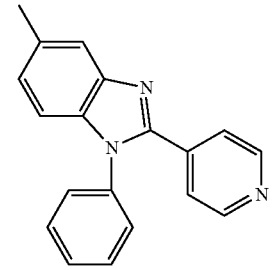 [SMILES: Cc1ccc2c(c1)nc(-c1ccncc1)n2-c1ccccc1] | | 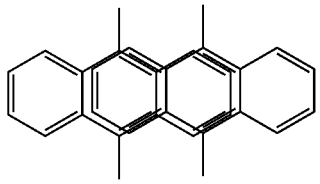 | 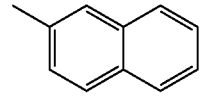 |
| (9-34) | 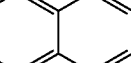 | | 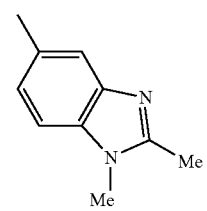 | 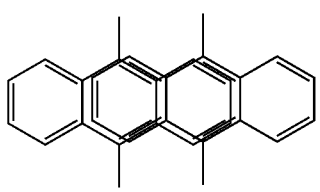 |

TABLE 4-continued (Table 5)

| Ar (α) | B | Ar (1) | Ar (2) |
|---|---|---|---|
| (9-35) | | | |

TABLE 5

(Table 6)

| Ar (α) | B | Ar (1) | Ar (2) |
|---|---|---|---|
| (9-36) | | | |
| (9-37) | | | |
| (9-38) | | | |
| (9-39) | | | |

TABLE 5-continued
(Table 6)
| | Ar (α) | B | Ar (1) | Ar (2) |
|---|---|---|---|---|
| (9-40) | 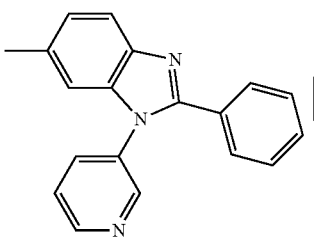 | 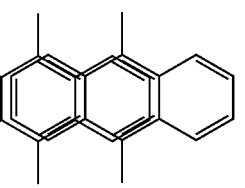 | | 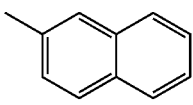 |
| (9-41) | 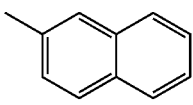 | 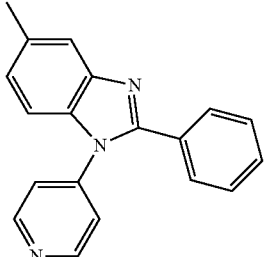 | | 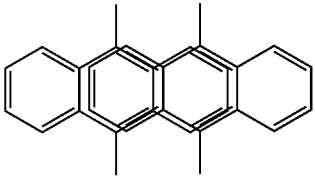 |
| (9-42) | 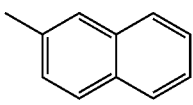 | 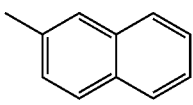 | | 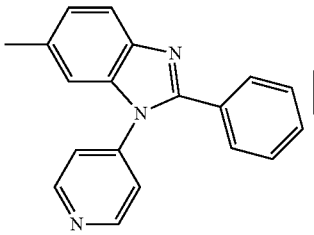 |
| (9-43) | 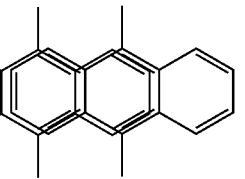 | 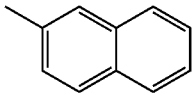 | | 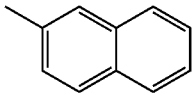 |

[Chem. 32]

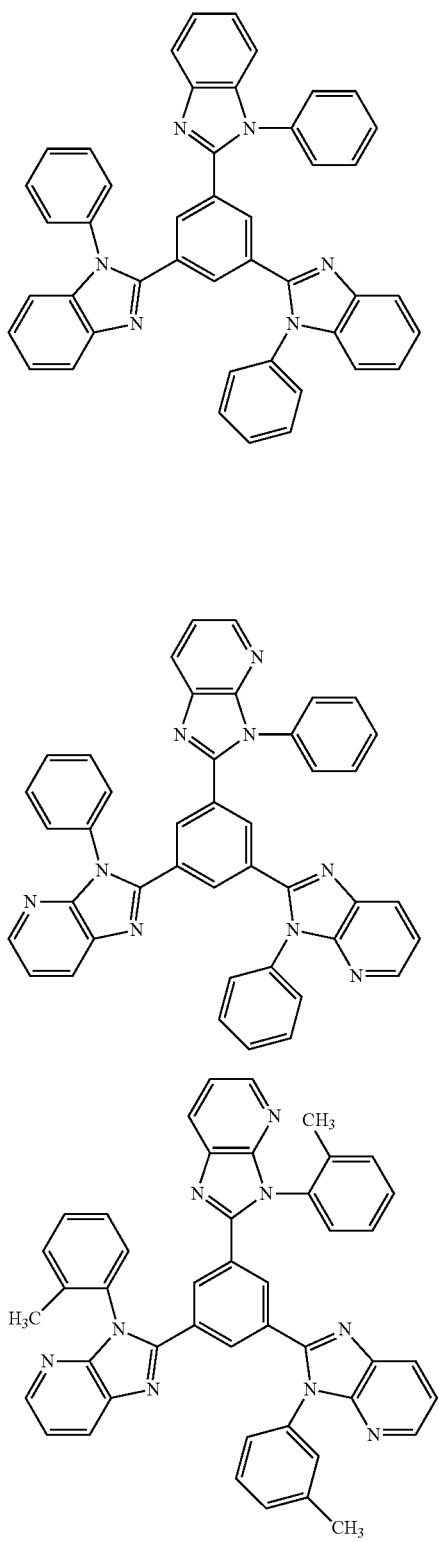

(9-44)

(9-45)

(9-46)

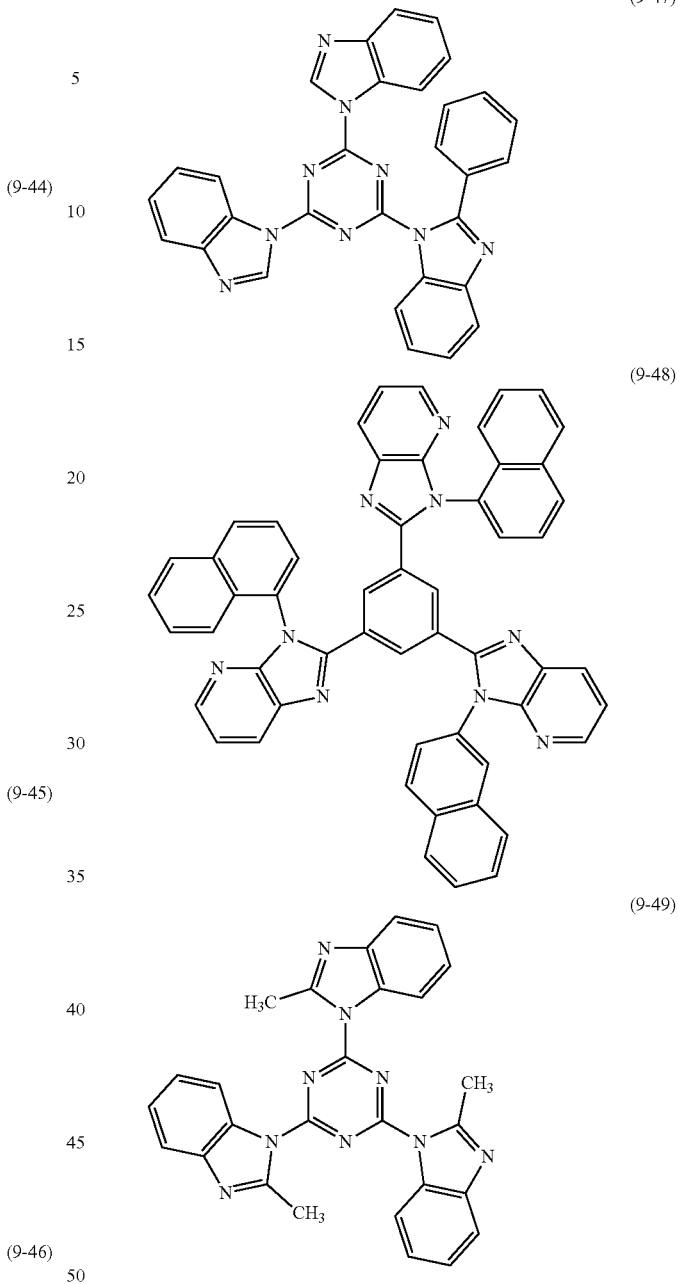

(9-47)

(9-48)

(9-49)

Note that the organic material used for the electron transport layer is preferably a compound containing an anthracene skeleton like the compounds mentioned above, but is not limited to these. For example, a benzimidazole derivative containing, in place of the anthracene skeleton, a pyrene skeleton or a chrysene skeleton may be used. Further, as well as one kind of organic material used for the electron transport layer, also a plurality of kinds of organic materials may be used by being mixed or stacked together. Further, the compounds mentioned above may be used for the electron injection layer.

The display device of the present disclosure may be used as a monitor device included in a personal computer, or be used as a monitor device incorporated in a television, a mobile phone, a personal digital assistant (PDA), or a game machine, for example. Alternatively, the display device may be used for an electronic viewfinder (EVF) or a head-mounted display (HMD).

Example 1

Example 1 relates to the light emitting elements according to the first aspect to the third aspect of the present disclosure and the display device of the present disclosure. Here, the light emitting element is specifically includes an organic electroluminescence element (organic EL element), and the display device of Example 1 specifically includes an organic electroluminescence display device (organic EL display device). The display device of Example 1 or the display device of Example 2 described later is a display device of an active matrix color display, and is an upper-surface light emitting display device. That is, light is emitted via the cathode (the second electrode).

Figure 3A:
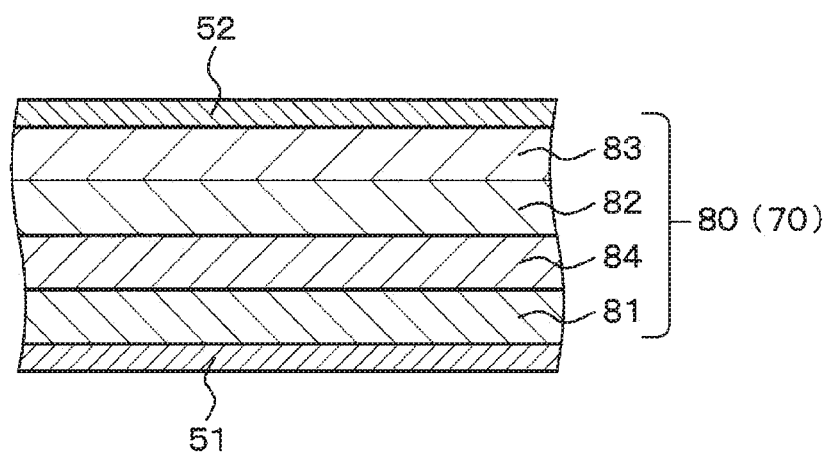
FIG. 3A is a schematic partial cross-sectional view of a light emitting layer in a light emitting element of Example 1 and an energy level diagram of the light emitting layer.

As shown in the schematic partial cross-sectional view of FIG. 1, the light emitting element of Example 1 has a structure in which an anode (in Example, corresponding to the first electrode) 51, an organic layer 70 containing an organic material and including a light emitting layer 80, and a cathode (in Example, corresponding to the second electrode) 52 are stacked. Then, as shown in the schematic partial cross-sectional view of FIG. 3A, the light emitting layer 80 includes, from the side of the anode 51 to the side of the cathode 52, two or more light emitting regions that emit different colors of light, and each light emitting region 82 or 83 contains a host material and a dopant material (guest material). Further, the display device of Example 1 includes a plurality of light emitting elements of Example 1 arranged in a two-dimensional matrix configuration.

Each of light emitting regions 81, 82, and 83 is a region where holes injected from the side of the anode 51 and electrons injected from the side of the cathode 52 recombine during application of voltage to the anode 51 and the cathode 52. Then, more specifically, the light emitting layer 80 includes, from the side of the anode 51 to the side of the cathode 52, the first light emitting region 81, an intermediate region (buffer region) 84, the second light emitting region 82, and the third light emitting region 83. In the light emitting element of Example 1, specifically, the first light emitting region 81 emits red light (wavelength: 620 nm to 750 nm), the second light emitting region 82 emits blue light (wavelength: 450 nm to 495 nm), and the third light emitting region 83 emits green light (wavelength: 495 nm to 570 nm), and white light is emitted as a whole. That is, the light emitting layer 80 emits white light. However, the configuration is not limited to such a configuration. The intermediate region (buffer region) 84 is provided in order to suppress the movement of surplus carriers between the first light emitting region 81, and the second light emitting region 82 and the third light emitting region 83.

In the light emitting element of Example 1, more specifically, the material represented by Structural Formula (41) below (Ip=5.57 eV) was used as a host material contained in the first light emitting region 81 that emits red light, and the material represented by Structural Formula (42) below was used as a dopant material. Further, the material represented by Structural Formula (43) below (Ip=6.0 eV) was used as a host material contained in the second light emitting region 82 that emits blue light, and the material represented by Structural Formula (44) below was used as a dopant material. Furthermore, the various materials shown in Table 1 below (specifically, azine-based compounds) were used as a host material contained in the third light emitting region 83 that emits green light, and the material represented by Structural Formula (45) below was used as a dopant material.

Figure 3B:
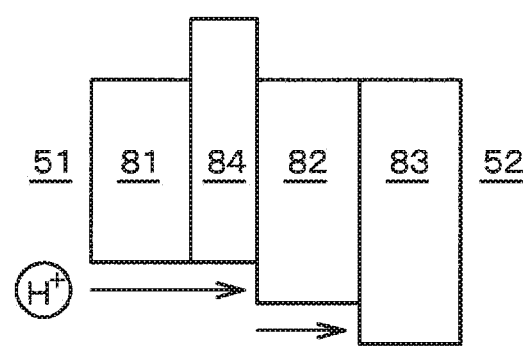
FIG. 3B is a schematic partial cross-sectional view of a light emitting layer in a light emitting element of Example 1 and an energy level diagram of the light emitting layer.

Table 1 further shows the absolute value $Ip_3$ (unit: eV) of the ionization potential Ip of the host material contained in the third light emitting region 83, a value $\Delta Ip$ (unit: eV) obtained by subtracting the absolute value of the ionization potential of the host material contained in the second light emitting region 82 from the absolute value of the ionization potential of the host material contained in the third light emitting region 83, the value of the band gap Eg (unit: eV), the value of the LUMO energy Ea (unit: eV), the energy Ti of the triplet excited state (unit: eV), $\Delta u'v'$, and the values of (x, y) (in Table 1, shown as CIE_x and CIE_y) in a chromaticity diagram. Further, an energy level diagram of the light emitting layer 80 is shown in FIG. 3B.

Figure 4:
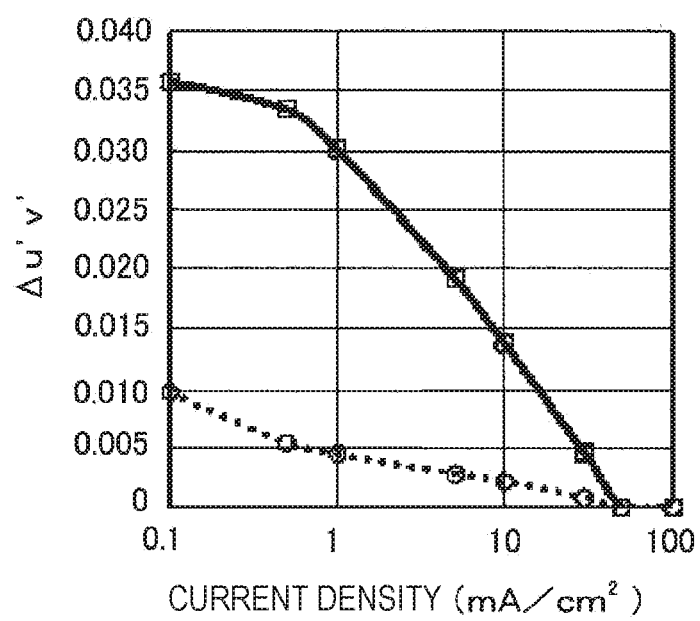
FIG. 4 is a diagram showing a change of $\Delta u'v'$ depending on a current density when a current of 50 milliamperes/cm$^2$ is passed between an anode and a cathode in a light emitting element of Example 1.

Here, the value of $\Delta u'v'$ is based on a u'v'-system UCS chromaticity diagram of CIE 1976. Then, specifically, the values of the chromaticity coordinates $(u'_1, v'_1)$ of white light emitted by the light emitting layer 80 when a current of 0.1 milliamperes/cm$^2$ is passed between the anode 51 and the cathode 52 are found by measurement, and the values of the chromaticity coordinates $(u'_2, v'_2)$ of white light emitted by the light emitting layer 80 when a current of 50 milliamperes/cm$^2$ is passed between the anode 51 and the cathode 52 are found by measurement. Then, the value of the difference $\Delta u'v'$ is found on the basis of the following formula. Note that the change of $\Delta u'v'$ depending on the current density when a current of 50 milliamperes/cm$^2$ is passed between the anode 51 and the cathode 52 is shown in FIG. 4. In FIG. 4, the broken line shows data of Example 1A, and the solid line shows data of Comparative Example 1B. From FIG. 4, it can be seen that the change of $\Delta u'v'$ depending on the current density is large in Comparative Example 1A and small in Example 1A. Here, in the example shown in FIG. 4, the value of the difference $\Delta u'v'$ between the values of the chromaticity coordinates of white light emitted by the light emitting layer 80 when a current of 0.1 milliamperes/cm$^2$ is passed between the anode 51 and the cathode 52 and the values of the chromaticity coordinates of white light emitted by the light emitting layer 80 when a current of 50 milliamperes/cm$^2$ is passed between the anode 51 and the cathode 52 is less than or equal to 0.01.

$$\Delta u'v' = \{(u'_1-u'_2)^2+(v'_1-v'_2)^2\}^{1/2}$$

TABLE 1

| | Host material structural formula | $Ip_3$ | $\Delta Ip$ | Eg | Ea | T1 | $\Delta u'v'$ | CIE_x | CIE_y |
|---|---|---|---|---|---|---|---|---|---|
| Example 1 A | 31 | 6.1 | 0.1 | 3.1 | 2.9 | 2.5 | 0.010 | 0.284 | 0.284 |
| Example 1 B | 32 | 6.1 | 0.1 | 3.6 | 2.5 | 2.9 | 0.014 | 0.253 | 0.274 |
| Example 1 C | 33 | 6.1 | 0.1 | 3.5 | 2.6 | 2.9 | 0.011 | 0.254 | 0.286 |
| Example 1 D | 34 | 6.5 | 0.5 | 3.5 | 3.0 | 2.7 | 0.012 | 0.259 | 0.281 |
| Comparative Example 1 A | 35 | 5.6 | −0.4 | 3.1 | 2.5 | 2.7 | 0.080 | 0.277 | 0.361 |

TABLE 1-continued
| | Host material structural formula | Ip$_3$ | ΔIp | Eg | Ea | T1 | Δu'v' | CIE_x | CIE_y |
|---|---|---|---|---|---|---|---|---|---|
| Comparative Example 1 B | 36 | 6.0 | 0.0 | 3.0 | 3.0 | 1.8 | 0.036 | 0.268 | 0.307 |
| Comparative Example 1 C | 37 | 6.0 | 0.0 | 3.1 | 2.9 | 2.3 | 0.040 | 0.267 | 0.295 |
[Chem. 33]
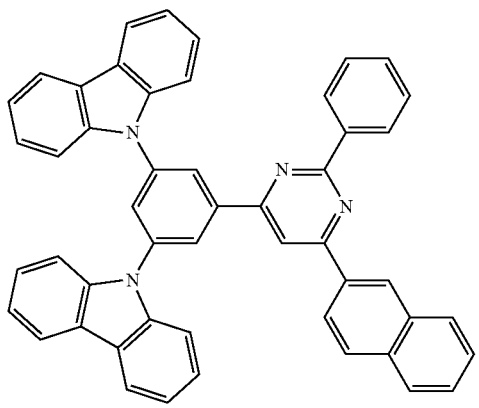
(31)
[Chem. 34]
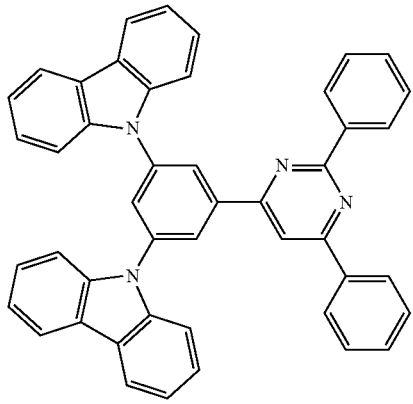
(32)
[Chem. 35]
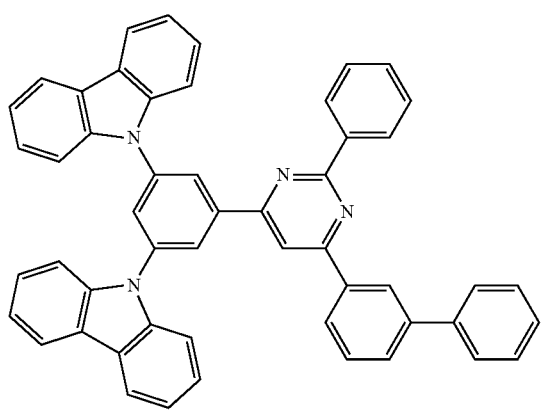
(33)
[Chem. 36]
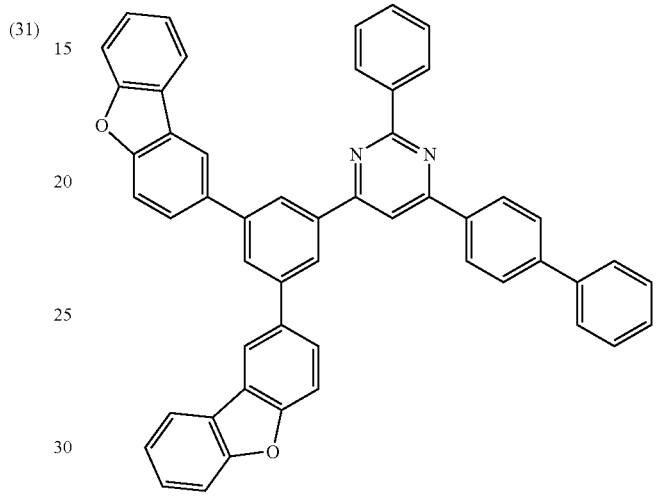
(34)
[Chem. 37]
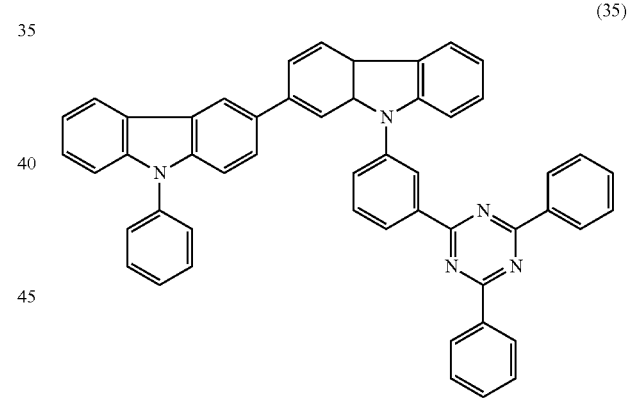
(35)
[Chem. 38]
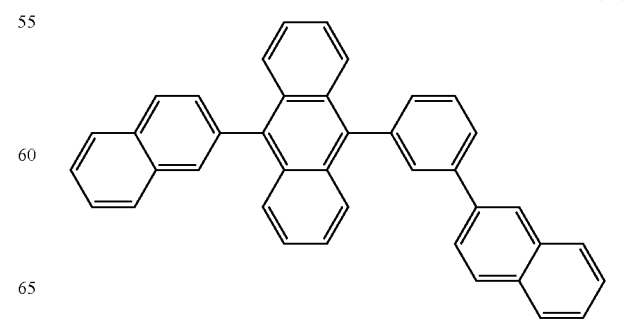
(36)

[Chem. 39]

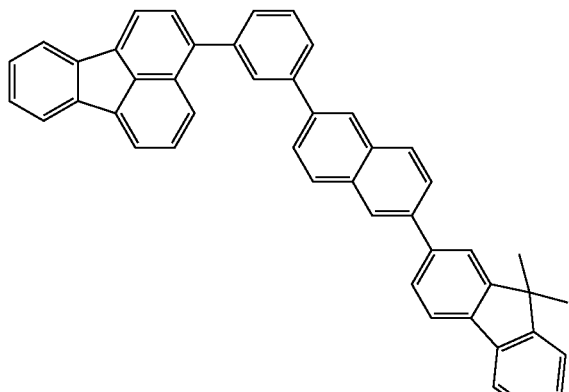
(37)

[Chem. 40]

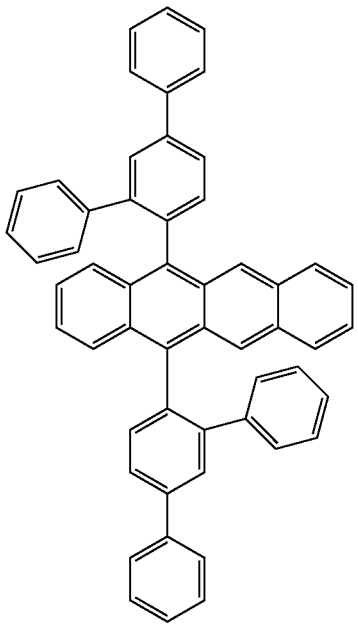
(41)

[Chem. 41]

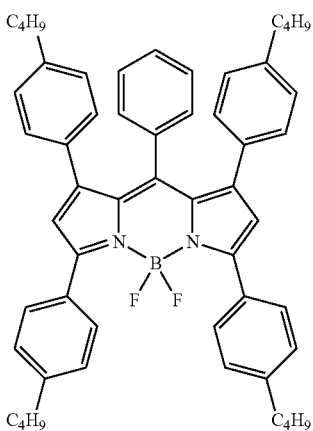
(42)

[Chem. 42]

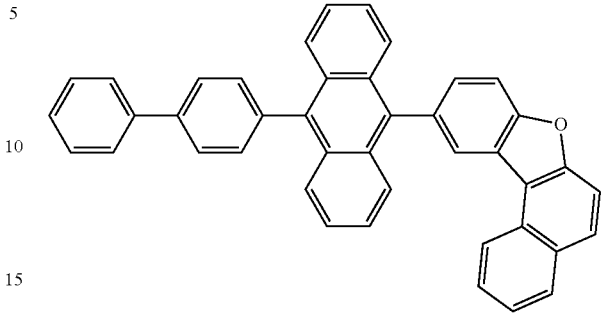
(43)

[Chem. 43]

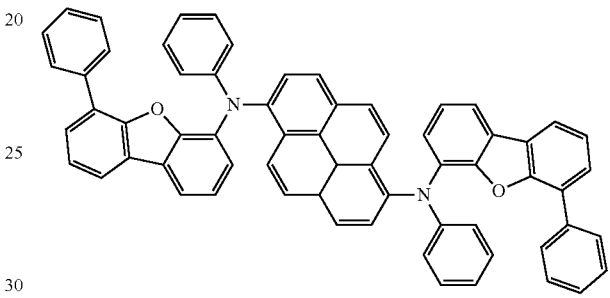
(44)

[Chem. 44]

(45)

Displayed various colors were observed in a region (for the sake of convenience, referred to as "region-A") of the display device where a current of 0.1 milliamperes/cm² was passed between the anode (the first electrode) 51 and the cathode (the second electrode) 52 and a region (for the sake of convenience, referred to as "region-B") of the display device where a current of 50 milliamperes/cm² was passed between the anode 51 and the cathode 52. As a result, in a case where the value of the difference Δu'v' was less than or equal to 0.02, a large difference was not seen between the colors displayed in region-A and region-B.

Alternatively, the absolute value of the ionization potential of the host material contained in a light emitting region near to the cathode 52 (in Example 1, the third light emitting region 83) was larger than the absolute value of the ionization potential of the host material contained in a light emitting region near to the anode 51 (in Example 1, the second light emitting region 82), or the absolute value of the ionization potential of the host material contained in a light emitting region adjacent to the cathode 52 (in Example 1, the third light emitting region 83) was larger than the absolute value of the ionization potential of the host material contained in a light emitting region (in Example 1, the second light emitting region 82) adjacent to the light emitting region (in Example 1, the third light emitting region 83) adjacent to the cathode 52; thereby, a large difference was not seen between the colors displayed in region-A and region-B.

Alternatively, the host material contained in a light emitting region adjacent to the cathode 52 (in Example 1, the third light emitting region 83) suppressed the movement of holes from a light emitting region (in Example 1, the second light emitting region 82) adjacent to the light emitting region (in Example 1, the third light emitting region 83) adjacent to the cathode 52; that is, the function of suppressing the movement of holes from a light emitting region (in Example 1, the second light emitting region 82) adjacent to a light emitting region (in Example 1, the third light emitting region 83) adjacent to the cathode 52 was provided to the light emitting region adjacent to the cathode 52 (in Example 1, the third light emitting region 83); thereby, a large difference was not seen between the colors displayed in region-A and region-B.

Further, the absolute value of the ionization potential of the host material contained in a light emitting region adjacent to the cathode 52 (in Example 1, the third light emitting region 83) is more than or equal to 6.1 eV; when the absolute value of the ionization potential of the host material contained in a light emitting region adjacent to the cathode 52 (in Example 1, the third light emitting region 83) is denoted by $|Ip_1|$ and the absolute value of the ionization potential of the host material contained in a light emitting region (in Example 1, the second light emitting region 82) adjacent to the light emitting region adjacent to the cathode 52 is denoted by $|Ip_2|$, $|Ip_1|-|Ip_2| \geq 0.1$ is satisfied. Furthermore, it is preferable that the value of the band gap of the host material contained in a light emitting region adjacent to the cathode 52 (in Example 1, the third light emitting region 83) be more than or equal to 3.1 eV. Then, also by satisfying these, a large difference was not seen between the colors displayed in region-A and region-B.

As above, the relationship of the value of the ionization potential between light emitting regions is prescribed, further the amount of change $\Delta u'v'$ of the values of the chromaticity coordinates of white light based on the current density is prescribed, and further the characteristics of the host material contained in a light emitting region adjacent to the cathode are prescribed; thereby, even if the amount of current (current density) passed between the anode and the cathode changes, a large variation in the movement of holes from the second light emitting region to the third light emitting region can be suppressed, and a change is less likely to occur in the position of the recombination region in the light emitting region; as a result, a light emitting element of a structure in which a large change is less likely to occur in the values of the chromaticity coordinates of white light emitted by a white light emitting element can be obtained.

As shown in FIG. 1, the display device of Example 1 or the display device of Example 2 described later includes a first substrate 11, a second substrate 12, and a plurality of light emitting elements (display elements) 10 located between the first substrate 11 and the second substrate 12 and arranged in a two-dimensional matrix configuration; light is emitted via the second substrate 12; each light emitting element 10 includes the anode (first electrode) 51, the organic layer 70 including the light emitting layer 80, the cathode (second electrode) 52, and a sealing layer 15 stacked from the first substrate side. Organic EL elements that are light emitting elements are arranged in a two-dimensional matrix configuration in a first direction and a second direction extending in a direction orthogonal to the first direction.

Alternatively, the display device of Example 1 or the display device of Example 2 described later includes, in another expression, the first substrate 11, the second substrate 12, and an image display section 13 sandwiched by the first substrate 11 and the second substrate 12, and a plurality of light emitting elements 10 are arranged in a two-dimensional matrix configuration in the image display section 13.

In the display device of Example 1 or the display device of Example 2 described later, a color filter layer CF is formed between the sealing layer 15 and the second substrate 12, and a light blocking layer (black matrix layer) BM is formed between a color filter layer CF ($CF_R$, $CF_G$, or $CF_B$) and a color filter layer CF. The color filter layer CF and the light blocking layer BM are formed in contact with the second substrate 12.

One pixel includes three sub-pixels (three light emitting elements) of a red color display sub-pixel $SP_R$ (a red light emitting element 10R), a green color display sub-pixel $SP_G$ (a green light emitting element 10G), and a blue color display sub-pixel $SP_B$ (a blue light emitting element 10B). Each color light emitting sub-pixel includes a light emitting element (organic EL element) that emits white light and is provided with the color filter layer $CF_R$, $CF_G$, or $CF_B$. That is, the light emitting layer itself emits white light as a whole. The red light emitting element (red color display element) 10R, the green light emitting element (green color display element) 10G, and the blue light emitting element (blue color display element) 10B have the same configuration and structure except for the color filter layer CF. The number of pixels is, for example, 1920×1080; one light emitting element 10 includes one sub-pixel, and the number of light emitting elements (specifically, organic EL elements) 10 is three times the number of pixels.

In the display device of Example 1 or the display device of Example 2 described later, the first substrate 11 includes a glass substrate, and the anode (first electrode) 51 contains a light reflecting material, specifically an Al—Nd alloy or an Al—Ni alloy. Further, in the display device of Example 1 or the display device of Example 2 described later, the second substrate 12 includes a glass substrate, and the cathode (second electrode) 52 includes a transparent electrically conductive material such as ITO. The anode 51 is formed on the basis of a combination of the vacuum vapor deposition method and the etching method. The cathode 52 is formed as a film by a film formation method in which film-forming particles have small energy, particularly such as the vacuum vapor deposition method, and is not patterned. The organic layer 70 is not patterned, either.

The anode (first electrode) 51 is provided on an interlayer insulating layer 40 containing SiON that is formed on the basis of the CVD method. Then, the interlayer insulating layer 40 covers an organic EL element driving section formed on the first substrate 11. The organic EL element driving section includes a plurality of thin film transistors (TFTs) 20, and the TFTs 20 and the anode 51 are electrically connected together via a contact plug 26 provided in the interlayer insulating layer 40. A portion of the organic layer 70 where light is actually emitted is surrounded by an insulating layer 60 containing $SiO_2$. Note that, in the drawing, one TFT 20 is shown for one organic EL element driving section.

The light emitting element 10 may have a resonator structure in which the organic layer 70 is used as a resonance section. In this case, in order to appropriately adjust the distance from a light emitting surface to a reflecting surface (specifically, for example, from the anode 51 to the cathode 52), the thickness of the organic layer 70 is preferably more than or equal to $8 \times 10^{-8}$ m and less than or equal to $5 \times 10^{-7}$ m, and more preferably more than or equal to $1.5 \times 10^{-7}$ m and less than or equal to $3.5 \times 10^{-7}$ m.

An insulating or electrically conductive protection film 14 (specifically, for example, containing a $SiO_2$-based material or a SiN-based material) is provided above the cathode (second electrode) 52, that is, between the cathode 52 and the sealing layer (sealing resin layer) 15 for the purpose of preventing the arrival of moisture at the organic layer 70. The protection film 14 and the second substrate 12 are joined together via, for example, a sealing layer (sealing resin layer) 15 containing an acrylic-based adhesive or an epoxy-based adhesive.

The TFT 20 includes a gate electrode 21 formed on the first substrate 11, a gate insulating layer 22 formed on the first substrate 11 and the gate electrode 21, source/drain regions 24 formed on the gate insulating layer 22, and a channel formation region 23 formed between the source/drain regions 24 so as to face the gate electrode 21.

Hereinbelow, an outline of a method for manufacturing the display device (organic EL display device) of Example 1 is described.

The second substrate 12 is prepared. Specifically, color filter layers CF and the light blocking layer BM are formed on the second substrate 12 on the basis of a commonly known method.

[Step-100]

On the other hand, light emitting element driving sections are formed on the first substrate 11 on the basis of a known TFT manufacturing process, and then the interlayer insulating layer 40 is formed on the entire surface on the basis of the CVD method. Then, a connection hole is formed in a portion of the interlayer insulating layer 40 located above one source/drain region 24 of the TFT 20 on the basis of photolithography technology and etching technology. After that, a metal layer is formed on the interlayer insulating layer 40 including the connection holes on the basis of, for example, the sputtering method, and next the metal layer is patterned on the basis of photolithography technology and etching technology; thereby, anodes 51 can be formed on the interlayer insulating layer 40. Further, contact plugs 26 can be formed in the interlayer insulating layer 40. The anode 51 is isolated for each light emitting element.

[Step-110]

After that, an insulating layer 60 containing $SiO_2$ is formed on the entire surface on the basis of the CVD method; then, an opening section 61 is formed in a portion of the insulating layer 60 located above the anode 51 on the basis of photolithography technology and etching technology, and the anode 51 is exposed at the bottom of the opening section 61. Examples of the planar shape of the opening section 61 include a square, a square with rounded four corners, a rectangle, a rectangle with rounded four corners, a circle, and an ellipse.

[Step-120]

After that, the organic layer 70 is formed as a film on a portion of the anode 51 exposed at the bottom of the opening section 61 and on the insulating layer 60 by, for example, a PVD method such as the vacuum vapor deposition method or the sputtering method, a coating method such as the spin coating method or the die coating method, etc. Next, the cathode 52 is formed on the entire surface of the organic layer 70 on the basis of, for example, the vacuum vapor deposition method or the like. In this way, the organic layer 70 and the cathode 52 can be continuously formed as a film on the anode 51, for example in a vacuum atmosphere. After that, the protection film 14 is formed on the entire surface by, for example, the CVD method or the PVD method.

[Step-130]

Finally, the protection film 14 and the second substrate 12 are stuck together via the sealing layer (sealing resin layer) 15. Thus, the display device shown in FIG. 1 can be obtained.

Example 2

Figure 2:
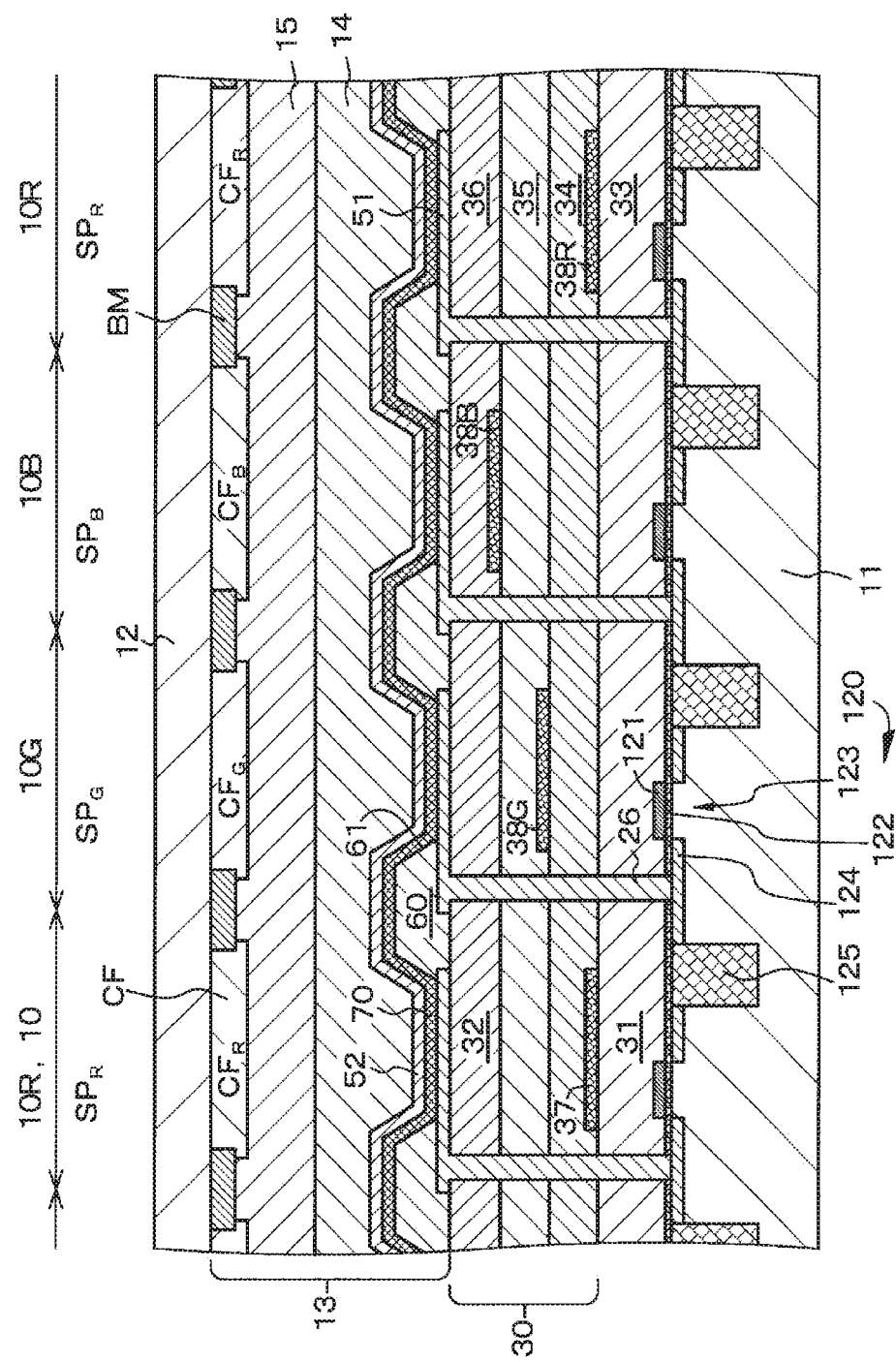
FIG. 2 is a schematic partial cross-sectional view of a display device of Example 2.

Example 2 is a modification of Example 1. In Example 2, a light reflecting layer is formed via an interlayer insulating layer below the anode (first electrode), and a resonator structure is obtained between the light reflecting layer and the cathode (second electrode). A schematic partial cross-sectional view of a display device of Example 2 in which the display device of Example 1 is modified is shown in FIG. 2.

The light emitting element 10 of Example 2 includes a lower layer-interlayer insulating layer 31, a light reflecting layer 37 formed on the lower layer-interlayer insulating layer 31, an upper layer-interlayer insulating layer 32 covering the lower layer-interlayer insulating layer 31 and the light reflecting layer 37, an anode 51 formed on the upper layer-interlayer insulating layer 32, an insulating layer 60 formed on an area of the upper layer-interlayer insulating layer 32 where at least the anode 51 is not formed, an organic layer 70 formed from on the anode 51 to on the insulating layer 60 and including a light emitting layer containing an organic light emitting material, and a cathode 52 formed on the organic layer 70.

Further, the display device of Example 2 is a display device in which a plurality of pixels each including a first light emitting element 10R, a second light emitting element 10G, and a third light emitting element 10B are arranged in a two-dimensional matrix configuration, in which the pixel has a stacked structure in which a lowermost layer-interlayer insulating layer 33, a first interlayer insulating layer 34, a second interlayer insulating layer 35, and an uppermost layer-interlayer insulating layer 36 are sequentially stacked. Then, each of the light emitting elements 10R, 10G, and 10B includes the anode 51 formed on the uppermost layer-interlayer insulating layer 36, the insulating layer 60 formed on an area of the uppermost layer-interlayer insulating layer 36 where at least the anode 51 is not formed, the organic layer 70 formed from on the anode 51 to on the insulating layer 60 and including a light emitting layer containing an organic light emitting material, and the cathode 52 formed on the organic layer 70, the first light emitting element 10R includes a first light reflecting layer 38R formed between the lowermost layer-interlayer insulating layer 33 and the first interlayer insulating layer 34, the second light emitting element 10G includes a second light reflecting layer 38G formed between the first interlayer insulating layer 34 and the second interlayer insulating layer 35, and the third light emitting element 10B includes a third light reflecting layer 38B formed between the second interlayer insulating layer 35 and the uppermost layer-interlayer insulating layer 36.

Note that the first interlayer insulating layer 34, the second interlayer insulating layer 35, and the uppermost layer-interlayer insulating layer 36 are collectively referred to as an interlayer insulating layer-stacked structure body 30.

Further, the display device of Example 2 includes, in another expression, a first substrate 11, a second substrate 12, and an image display section 13 sandwiched by the first substrate 11 and the second substrate 12, and a plurality of light emitting elements 10 (10R, 10G, and 10B) of Example 2 are arranged in a two-dimensional matrix configuration in the image display section 13. Here, the light emitting element is formed on the first substrate side.

The anode 51 contains ITO. The light reflecting layer 37 (the first light reflecting layer 38R, the second light reflecting layer 38G, and the third light reflecting layer 38B) has a stacked structure of titanium (Ti)/aluminum (Al). Furthermore, the first substrate 11 includes a silicon semiconductor substrate, and the second substrate 12 includes a glass substrate. Further, in place of the TFT, a MOSFET is formed on the silicon semiconductor substrate.

The light emitted from the organic layer 70 is white. Specifically, the light emitting layer has three regions of a red light emitting region that emits red light, a green light emitting region that emits green light, and a blue light emitting region that emits blue light. The red light emitting element 10R, the green light emitting element 10G, and the blue light emitting element 10B have the same configuration and structure except for the configuration of the color filter layer and the position of the light reflecting layer.

The lowermost layer-interlayer insulating layer 33, the interlayer insulating layer-stacked structure body 30, the organic layer 70, and the cathode 52 are shared between a plurality of light emitting elements. That is, the lowermost layer-interlayer insulating layer 33, the interlayer insulating layer-stacked structure body 30, the organic layer 70, and the cathode 52 are not patterned but are in a state of what is called a solid film. Thus, instead of forming light emitting layers with different colors separately for light emitting elements (performing patterning formation), a common light emitting layer is formed as a solid film in all the light emitting elements; thereby, adaptation to a display device having a small size and yet a high resolution in which, for example, the angle of view is several inches or less and the pixel pitch is several tens of micrometers or less becomes possible.

The light emitting element 10 has a resonator structure in which the organic layer 70 is used as a resonance section. Note that, in order to appropriately adjust the distance from a light emitting surface to a reflecting surface (specifically, the distances from a light emitting surface to the light reflecting layer 37 and the cathode 52), the thickness of the organic layer 70 is preferably more than or equal to $8 \times 10^{-8}$ m and less than or equal to $5 \times 10^{-7}$ m, and more preferably more than or equal to $1.5 \times 10^{-7}$ m and less than or equal to $3.5 \times 10^{-7}$ m. In an organic EL display device having a resonator structure, actually, the red light emitting element 10R causes red light emitted by the light emitting layer to resonate, and emits reddish light (light having a peak of a light spectrum in the region of red color) from the cathode 52. Further, the green light emitting element 10G causes green light emitted by the light emitting layer to resonate, and emits greenish light (light having a peak of a light spectrum in the region of green color) from the cathode 52. Furthermore, the blue light emitting element 10B causes blue light emitted by the light emitting layer to resonate, and emits bluish light (light having a peak of a light spectrum in the region of blue color) from the cathode 52.

In Example 2, a transistor (specifically, for example, a MOSFET) 120 formed on the silicon semiconductor substrate (the first substrate 11) is provided below the lower layer-interlayer insulating layer 31 (the lowermost layer-interlayer insulating layer 33). Then, the anode 51 and the transistor 120 formed on the silicon semiconductor substrate (the first substrate 11) are connected together via a contact hole (contact plug) 26 formed in the lowermost layer-interlayer insulating layer 33 and the interlayer insulating layer-stacked structure body 30. Here, the transistor 120 including a MOSFET includes a gate electrode 121, a gate insulating layer 122, a channel formation region 123, and source/drain regions 124, and an element isolation region 125 is formed between transistors 120; thereby, transistors 120 are isolated from each other.

Except for the respects described hereinabove, the configuration and structure of the display device of Example 2 may be similar to the configuration and structure of the display device of Example 1, and therefore a detailed description is omitted.

Hereinabove, light emitting elements and display devices of the present disclosure are described on the basis of preferred Examples; however, the light emitting element and the display device of the present disclosure are not limited to these Examples. The configurations and structures of the display devices and the light emitting elements described in Examples, various materials contained in the display devices and the light emitting elements, the methods for manufacturing a display device and a light emitting element, etc. are only examples, and may be altered as appropriate. Although in Examples one pixel includes solely three sub-pixels based on combinations of a white light emitting element and color filter layers, one pixel may include, for example, four sub-pixels further including a light emitting element that emits white color. Although in Examples a description is given on the basis of solely a display device (an upper-surface light emitting display device) of a top emission system (an upper-surface light emitting system) that emits light from the second substrate, also a display device (a lower-surface light emitting display device) of a bottom emission system (a lower-surface light emitting system) that emits light from the first substrate may be produced. Further, although in the above the color filter layer is provided on the second substrate, also a display device of an on-chip color filter (OCCF) structure in which alternatively the color filter layer is provided on the first substrate may be produced.

Additionally, the present technology may also be configured as below.

[A01]<<Light Emitting Element: First Aspect>>

A light emitting element including:

a structure in which an anode, an organic layer containing an organic material and including a light emitting layer, and a cathode are stacked, in which the light emitting layer includes, from a side of the anode to a side of the cathode, two or more light emitting regions configured to emit different colors of light, each light emitting region contains a host material and a dopant material, and an absolute value of an ionization potential of the host material contained in a light emitting region near to the cathode is larger than an absolute value of an ionization potential of the host material contained in a light emitting region near to the anode.

[A02]

The light emitting element according to [A01], in which an absolute value of an ionization potential of the host material contained in a light emitting region adjacent to the cathode is more than or equal to 6.1 eV.

[A03]

The light emitting element according to [A02], in which, when the absolute value of the ionization potential of the host material contained in the light emitting region adjacent to the cathode is denoted by $|Ip_1|$ and an absolute value of an ionization potential of the host material contained in a light emitting region adjacent to the light emitting region adjacent to the cathode is denoted by $|Ip_2|$, $|Ip_1|-|Ip_2|\geq 0.1$ is satisfied.

[A04]

The light emitting element according to [A02] or [A03], in which a value of a band gap of the host material contained in the light emitting region adjacent to the cathode is more than or equal to 3.1 eV.

[A05]<<Light Emitting Element: Second Aspect>>

A light emitting element including:

a structure in which an anode, an organic layer containing an organic material and including a light emitting layer, and a cathode are stacked, in which the light emitting layer includes, from a side of the anode to a side of the cathode, two or more light emitting regions configured to emit different colors of light, each light emitting region contains a host material and a dopant material, and a value of a difference $\Delta u'v'$ between values of chromaticity coordinates $(u'_1, v'_1)$ of white light emitted by the light emitting layer when a current of 0.1 milliamperes/cm$^2$ is passed between the anode and the cathode and values of chromaticity coordinates $(u'_2, v'_2)$ of white light emitted by the light emitting layer when a current of 50 milliamperes/cm$^2$ is passed between the anode and the cathode is less than or equal to 0.02.

[A06]<<Light Emitting Element: Third Aspect>>

A light emitting element including:

a structure in which an anode, an organic layer containing an organic material and including a light emitting layer, and a cathode are stacked, in which the light emitting layer includes, from a side of the anode to a side of the cathode, two or more light emitting regions configured to emit different colors of light, each light emitting region contains a host material and a dopant material, and the host material contained in a light emitting region adjacent to the cathode suppresses movement of holes from a light emitting region adjacent to the light emitting region adjacent to the cathode.

[A07]

The light emitting element according to any one of [A01] to [A06], in which the host material in a light emitting region adjacent to the cathode contains an azine-based compound.

[A08]

The light emitting element according to any one of [A01] to [A07], in which the light emitting layer emits white light.

[A09]

The light emitting element according to any one of [A01] to [A08], in which the light emitting layer includes, from a side of the anode to a side of the cathode, a first light emitting region, an intermediate region, a second light emitting region, and a third light emitting region.

[A10]

The light emitting element according to any one of [A01] to [A09], in which the light emitting element includes an organic electroluminescence element.

[B01]<<Display Device>>

A display device including:

a plurality of light emitting elements arranged in a two-dimensional matrix configuration each of which is the light emitting element according to any one of [A01] to [A10].

REFERENCE SIGNS LIST 10 light emitting element (display element)
10R red light emitting element (first light emitting element)
10G green light emitting element (second light emitting element)
10B blue light emitting element (third light emitting element)
$SP_R$ red color display sub-pixel
$SP_G$ green color display sub-pixel
$SP_B$ blue color display sub-pixel
11 first substrate
12 second substrate
13 image display section
14 protection film
15 sealing layer (sealing resin layer)
20 thin film transistor (TFT)
120 MOSFET
21, 121 gate electrode
22, 122 gate insulating layer
23, 123 channel formation region
24, 124 source/drain region
125 element isolation region
26 contact hole (contact plug)
30 interlayer insulating layer-stacked structure body
31 lower layer-interlayer insulating layer
32 upper layer-interlayer insulating layer
33 lowermost layer-interlayer insulating layer
34 first interlayer insulating layer
35 second interlayer insulating layer
36 uppermost layer-interlayer insulating layer
37 light reflecting layer
38R first light reflecting layer
38G second light reflecting layer
38B third light reflecting layer
40 interlayer insulating layer
51 anode (first electrode)
52 cathode (second electrode)
60 insulating layer
61 opening section
70 organic layer
80 light emitting layer
81 first light emitting region
82 second light emitting region
83 third light emitting region
84 intermediate region (buffer region)
CF, $CF_R$, $CF_G$, $CF_B$ color filter layer
BM light blocking layer (black matrix layer)

The invention claimed is:

1. A light emitting element, comprising:

a structure in which an anode, an organic layer containing an organic material, a cathode, a protection film, and a sealing layer are stacked, wherein the organic layer includes a light emitting layer configured to emit white light, the light emitting layer includes a plurality of light emitting regions and a buffer layer, a first light emitting region of the plurality of light emitting regions is configured to emit a first color of light, a second light emitting region of the plurality of light emitting regions is configured to emit a second color of light, a third light emitting region of the plurality of light emitting regions is configured to emit a third color of light, the buffer layer is between the first light emitting region and the second light emitting region, the second light emitting region is between the buffer layer and the third light emitting region, each of the first light emitting region and the second light emitting region contains a host material and a dopant material, the protection film is between the sealing layer and the cathode, and the protection film is attached to a substrate via the sealing layer.

2. The light emitting element according to claim 1, wherein a difference $\Delta u'v'$ between values of first chromaticity coordinates $(u'_1, v'_1)$ of white light emitted by the light emitting layer based on a first current of 0.1 milliamperes/cm$^2$ and values of second chromaticity coordinates $(u'_2, v'_2)$ of the white light based on a second current of 50 milliamperes/cm$^2$ is less than or equal to 0.02, the difference $\Delta u'v'$ is calculated based on a following formula $$\Delta u'v' = \{(u'_1 - u'_2)^2 + (v'_1 - v'_2)^2\}^{1/2}, \text{ and}$$

the first current and the second current are between the anode and the cathode.

3. The light emitting element according to claim 1, wherein the sealing layer is configured to attach the substrate to the light emitting element via the protection film.

* * * * *